United States Patent

Yamamoto et al.

[11] Patent Number: 5,963,838
[45] Date of Patent: Oct. 5, 1999

[54] METHOD OF MANUFACTURING A SEMICONDUCTOR DEVICE HAVING WIRING LAYERS WITHIN THE SUBSTRATE

[75] Inventors: Tadashi Yamamoto, Kawasaki; Souichi Sugiura, Yamato, both of Japan

[73] Assignee: Kabushiki Kaisha Toshiba, Tokyo, Japan

[21] Appl. No.: 08/521,105

[22] Filed: Aug. 30, 1995

Related U.S. Application Data

[62] Division of application No. 08/262,890, Jun. 21, 1994, abandoned.

[30] Foreign Application Priority Data

Jun. 22, 1993 [JP] Japan ..................................... 5-150437

[51] Int. Cl.⁶ .......................... H01L 21/00; H01L 21/84; H01L 21/31; H01L 21/469; H01L 21/265; H01L 21/44; H01L 21/48; H01L 21/465
[52] U.S. Cl. ......................... 438/766; 438/154; 437/26; 437/24; 437/203; 437/228
[58] Field of Search .................. 437/24, 62, 74, 437/78, 203, 228 H, 228 SE, 86, 228 TR, 927, 985, 65, 67, 79, 29, 21, 974, 26; 257/506; 148/DIG. 50, DIG. 164, DIG. 12, DIG. 135

[56] References Cited

U.S. PATENT DOCUMENTS

| | | | |
|---|---|---|---|
| 3,381,182 | 4/1968 | Thornton | 257/508 |
| 4,478,655 | 10/1984 | Nagakubo et al. | 29/576 W |
| 4,532,700 | 8/1985 | Kinney et al. | 29/576 W |
| 4,800,170 | 1/1989 | Jain et al. | 437/24 |
| 4,816,421 | 3/1989 | Dynes et al. | 437/26 |
| 4,888,300 | 12/1989 | Burton | 437/61 |
| 4,925,805 | 5/1990 | Van Ommen et al. | 437/21 |
| 4,977,439 | 12/1990 | Esquivel et al. | 257/621 |
| 5,236,872 | 8/1993 | Van Ommen et al. | 437/24 |
| 5,278,102 | 1/1994 | Horie | 437/67 |
| 5,306,942 | 4/1994 | Fujii | 257/508 |
| 5,449,630 | 9/1995 | Lur et al. | 437/24 |
| 5,510,272 | 4/1996 | Morikawa et al. | 437/24 |

*Primary Examiner*—Brian Dutton
*Attorney, Agent, or Firm*—Banner & Witcoff, Ltd.

[57] ABSTRACT

A transistor element is formed on the surface of a silicon substrate. A tunnel is formed in the silicon substrate at a position right under the transistor element. A contact hole is formed to extend from the surface of the silicon substrate to the contact hole. Silicon oxide films are respectively formed on the inner surfaces of the tunnel and the contact hole. A wiring layer is buried in the tunnel and the contact hole. The wiring layer is connected to a diffusion layer of the transistor element.

6 Claims, 78 Drawing Sheets

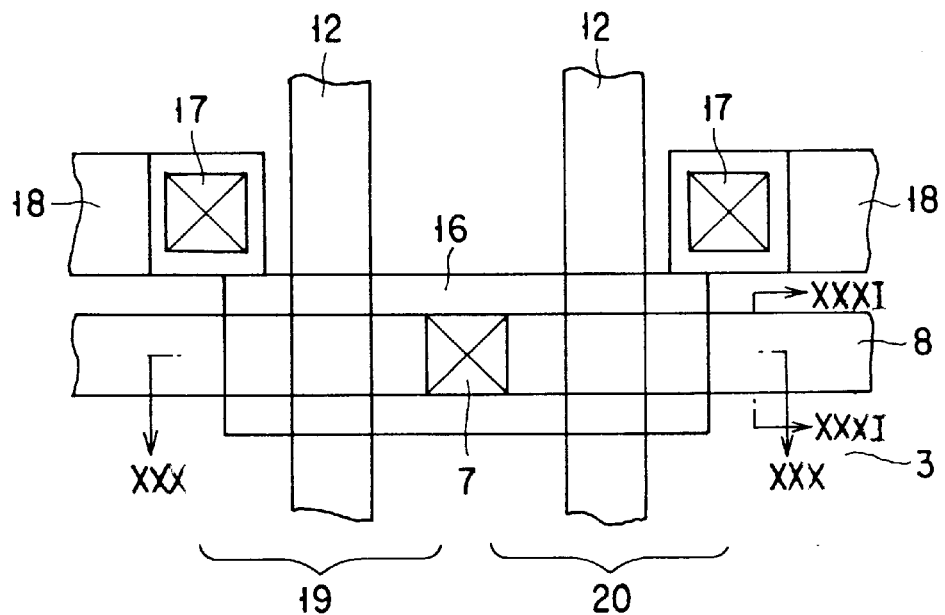
F I G. 29
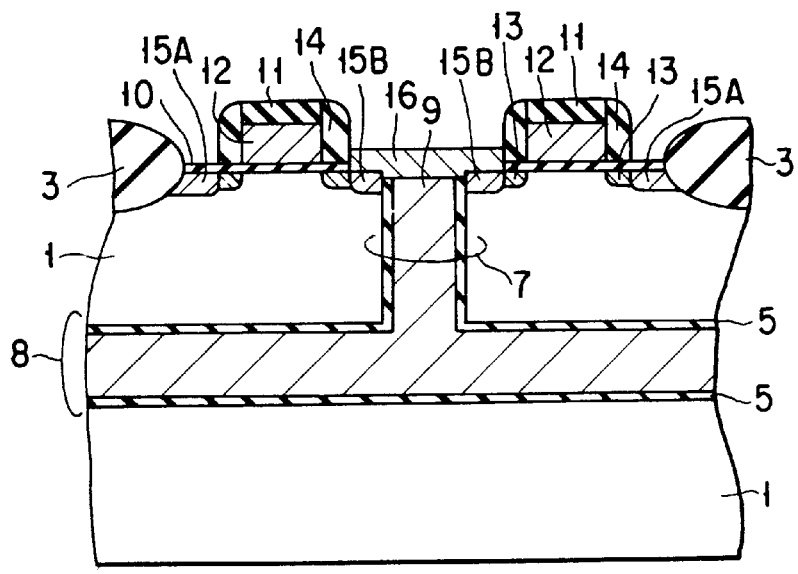
F I G. 30

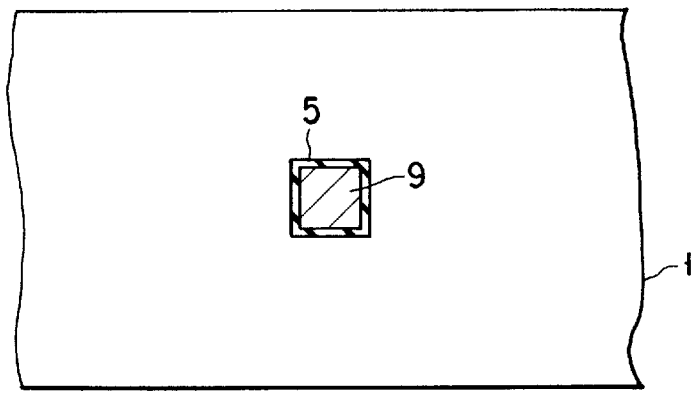
F I G. 31
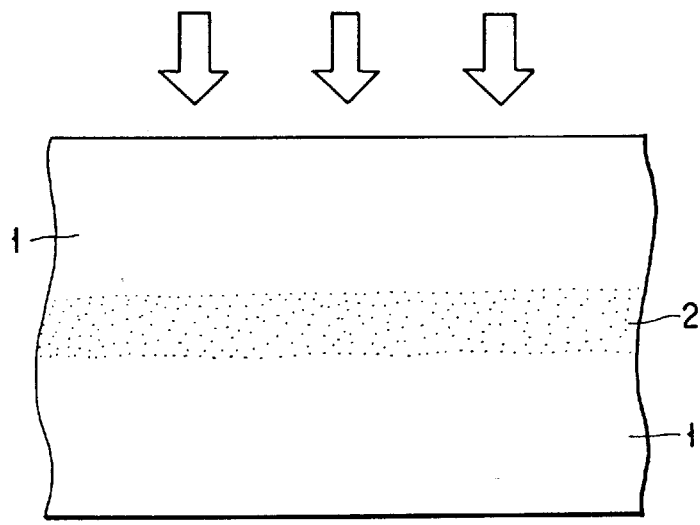
F I G. 32
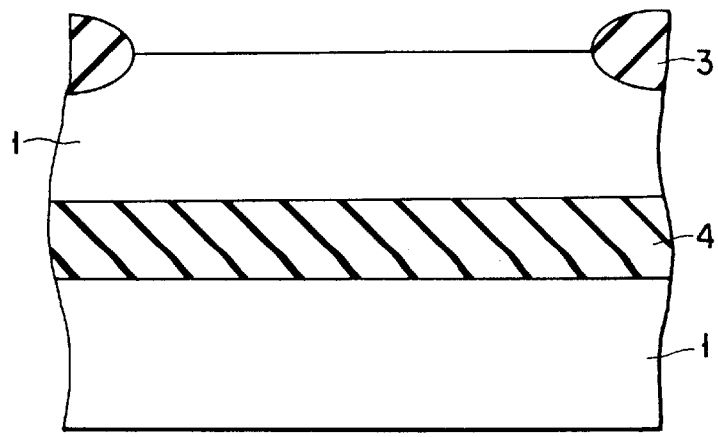
F I G. 33

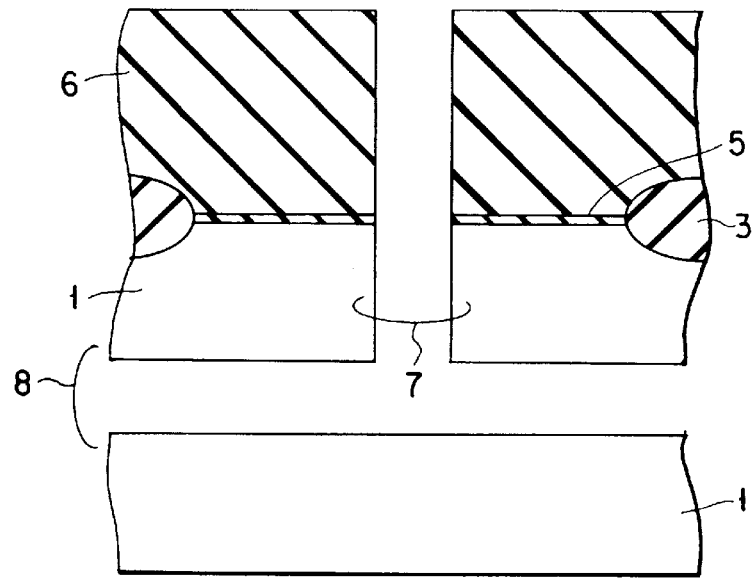
F I G. 34
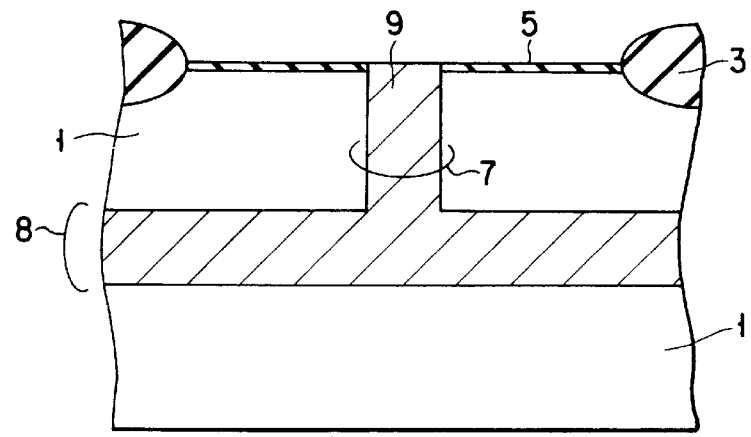
F I G. 35
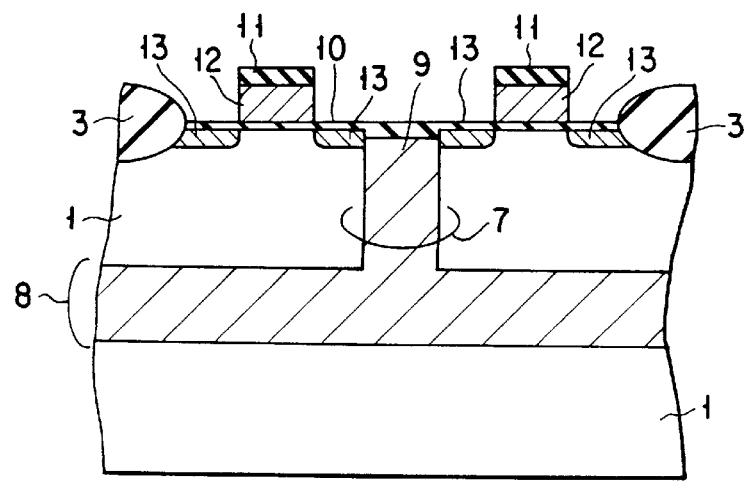
F I G. 36

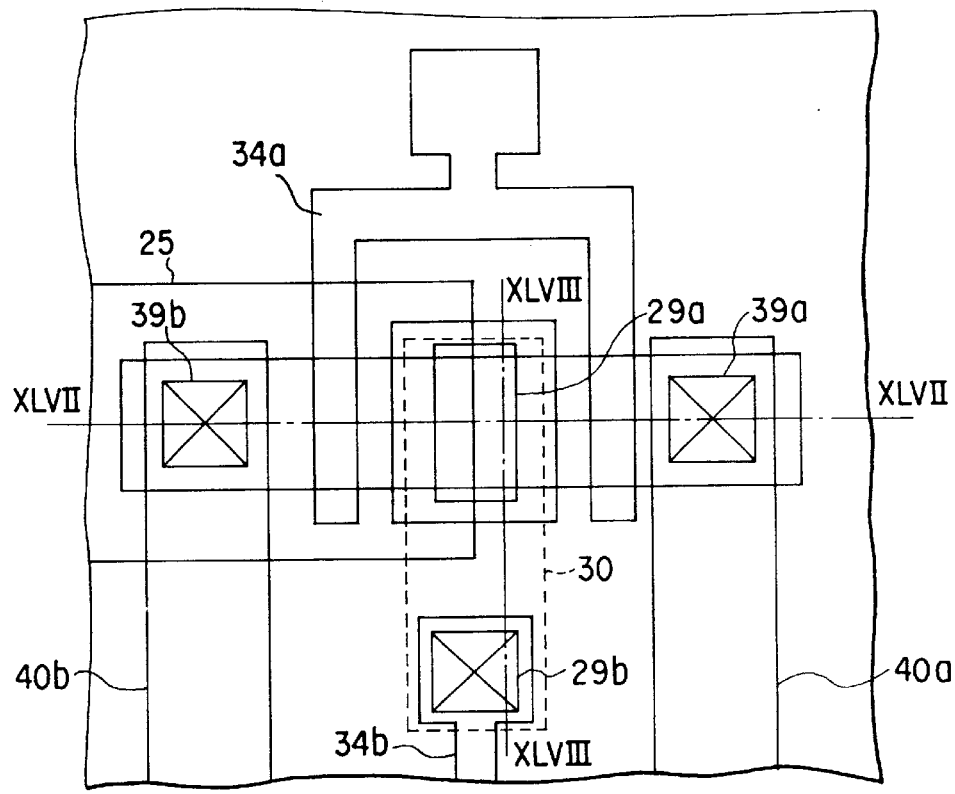
F I G. 46
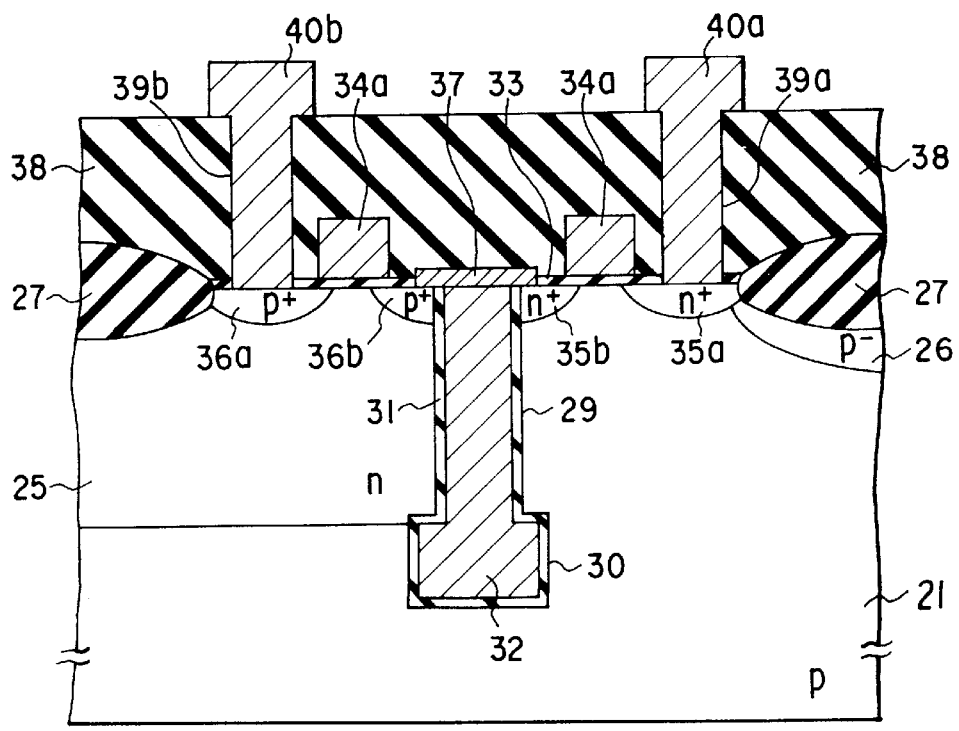
F I G. 47

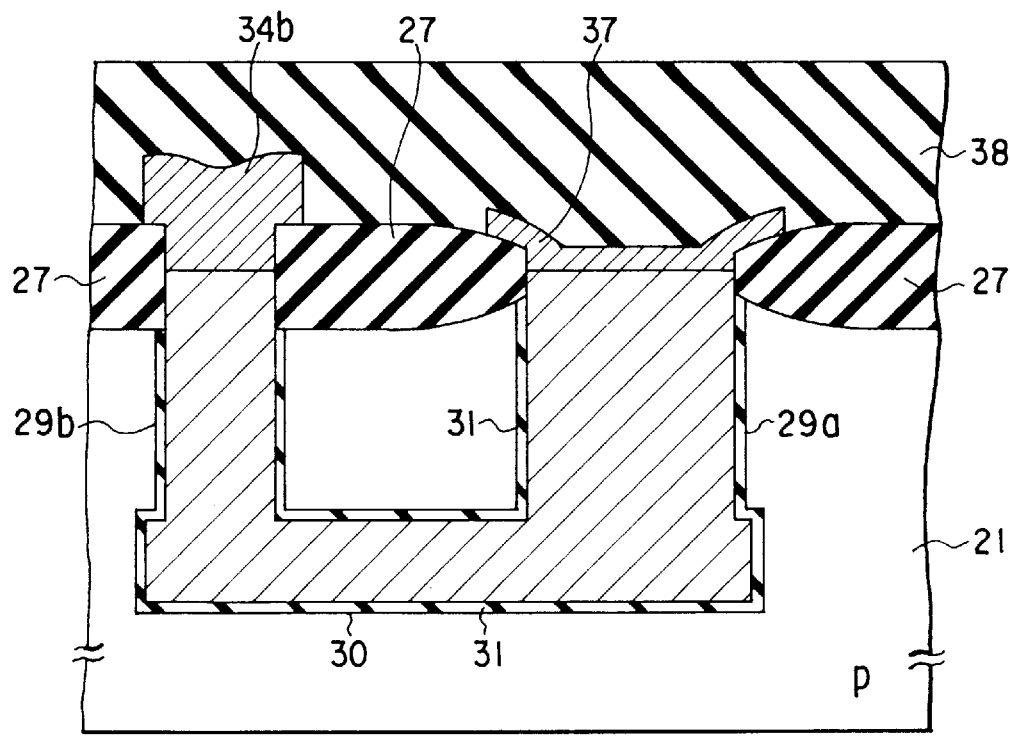
F I G. 48
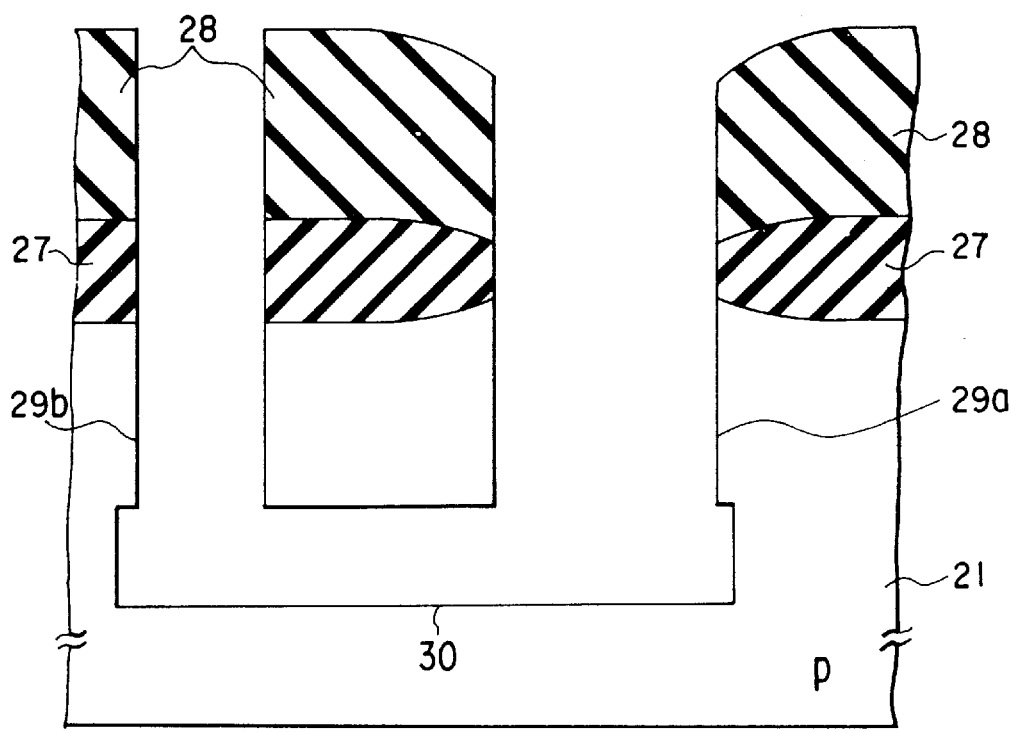
F I G. 55

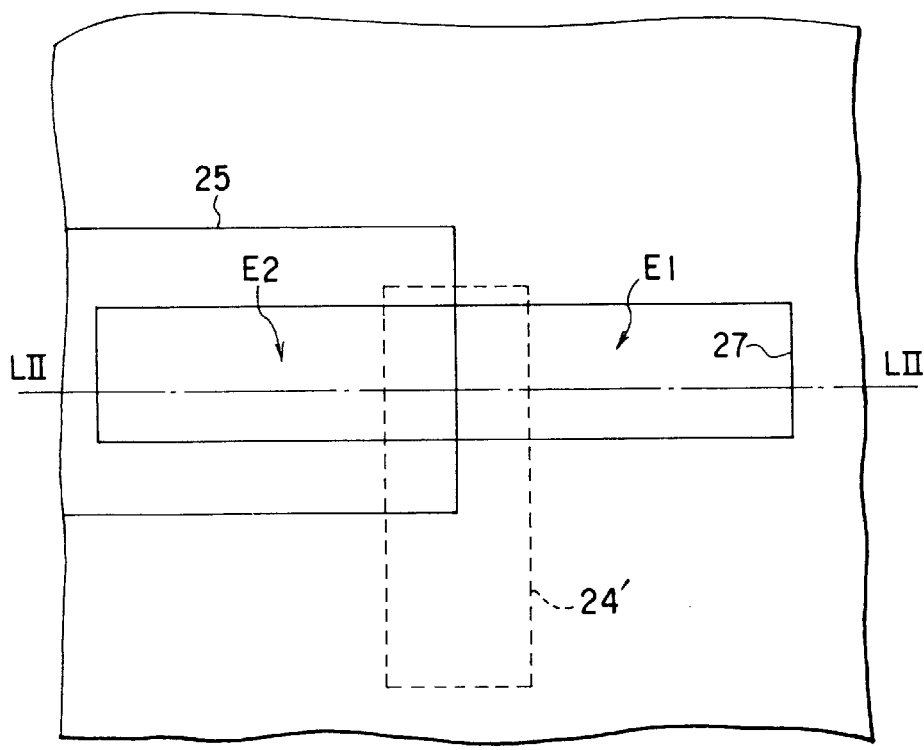
F I G. 51
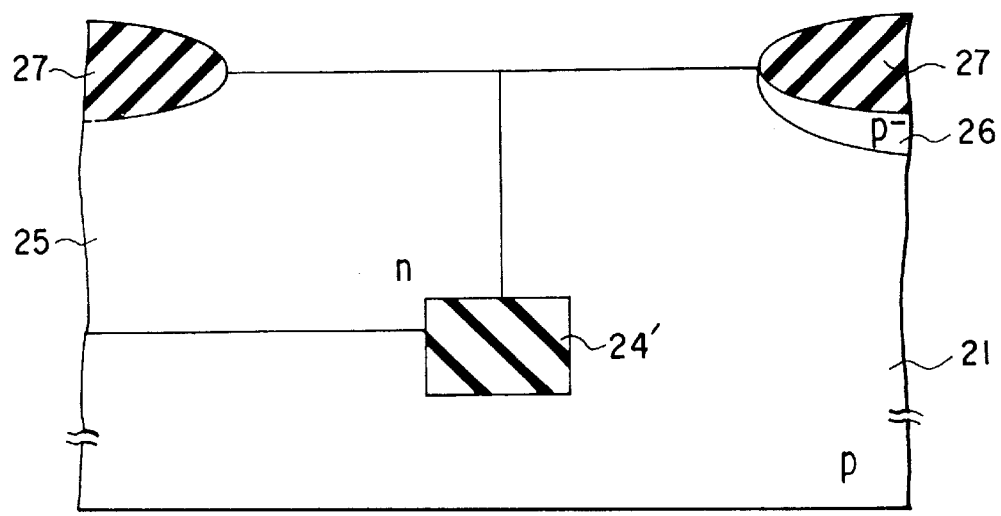
F I G. 52

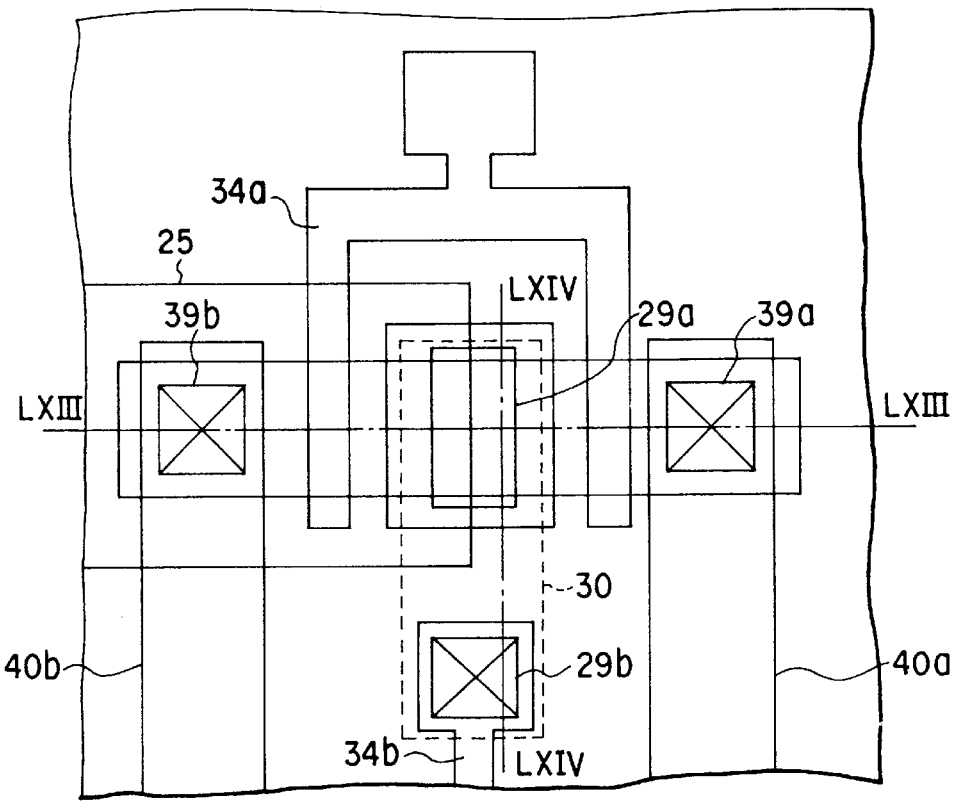
F I G. 62
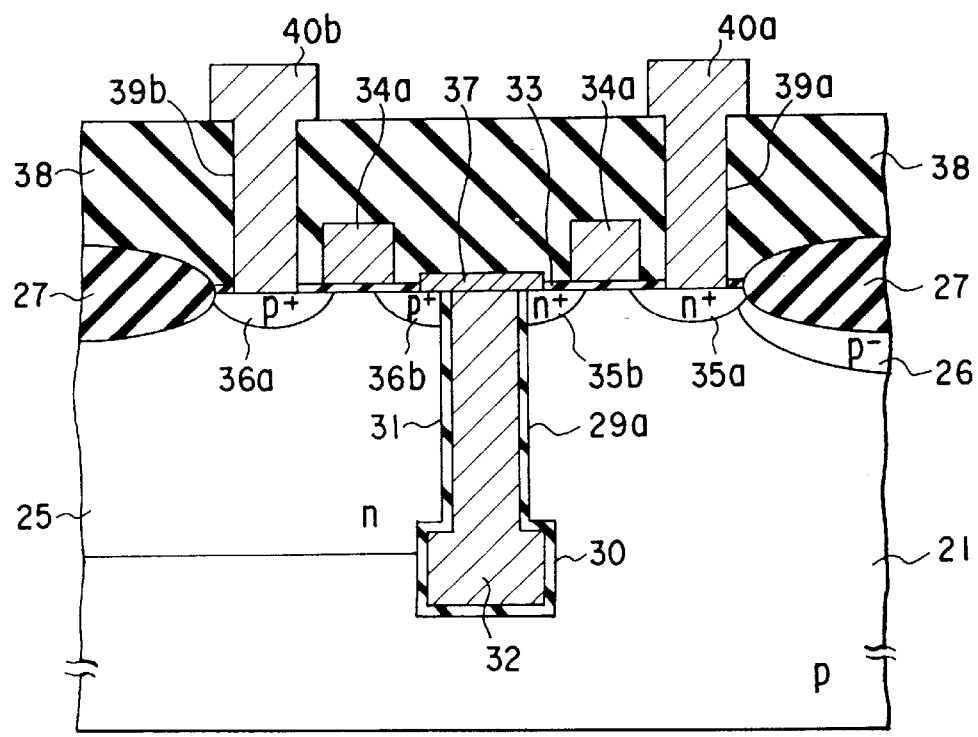
F I G. 63

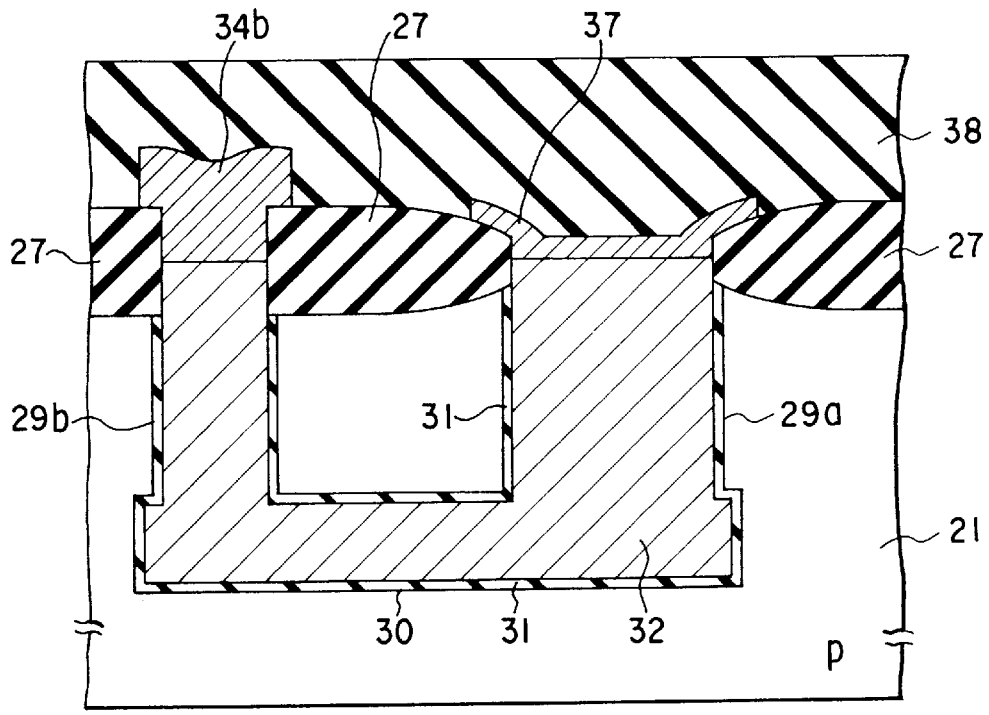
F I G. 64
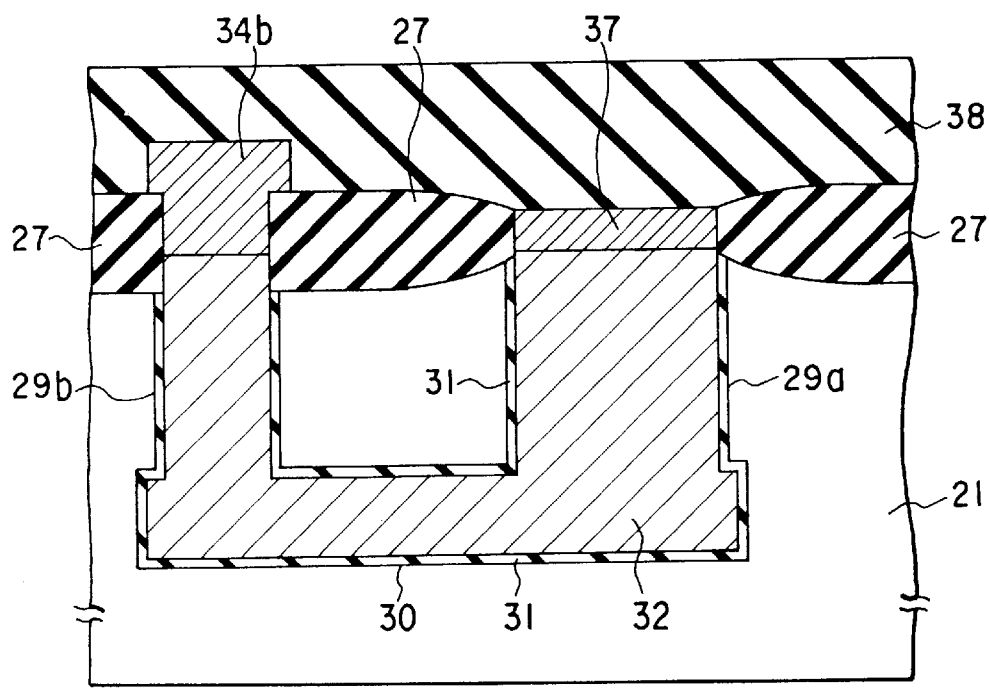
F I G. 69

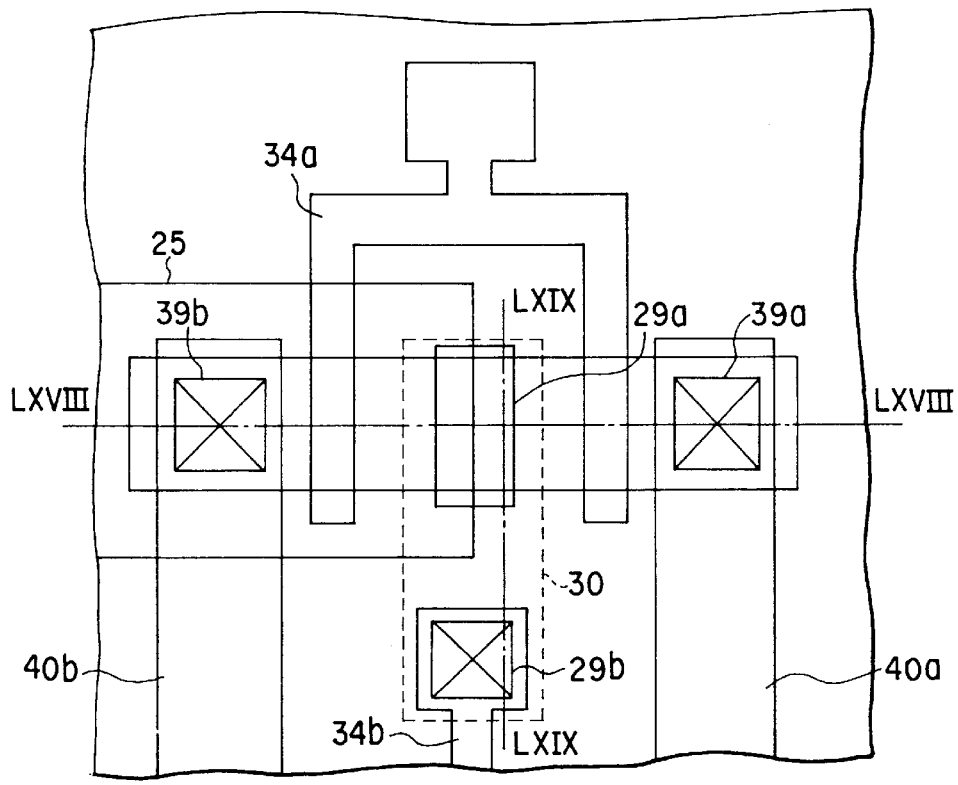
F I G. 67
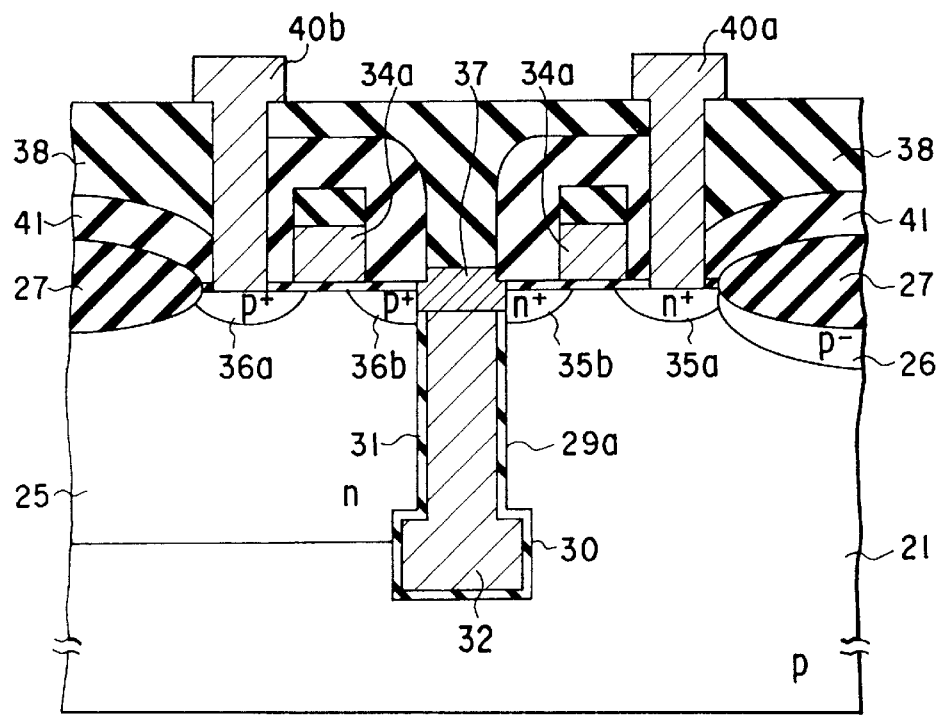
F I G. 68

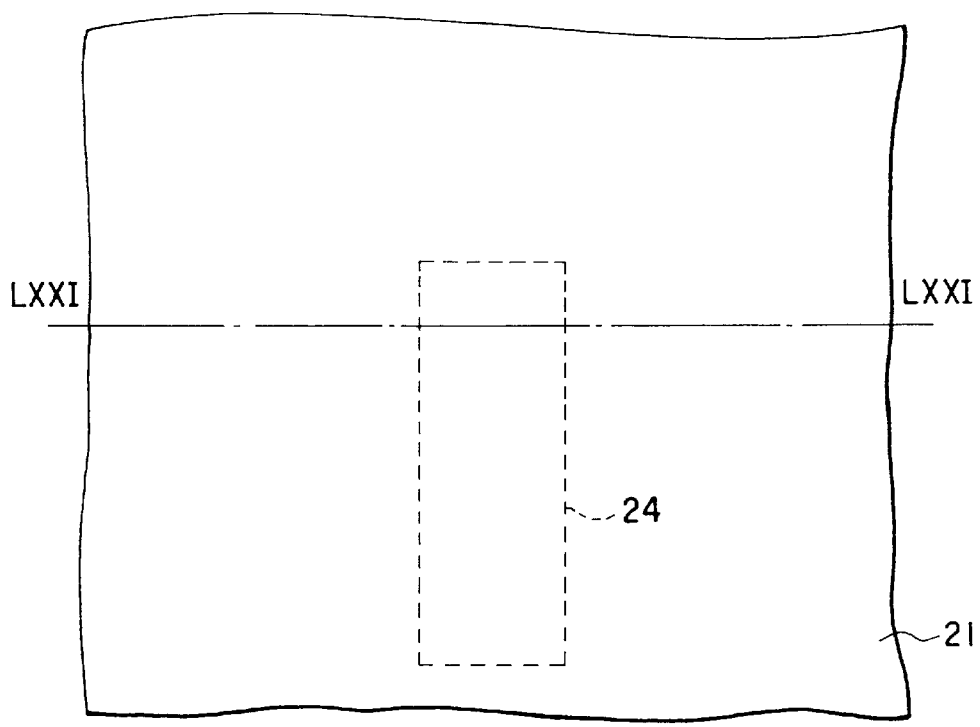
F I G. 70
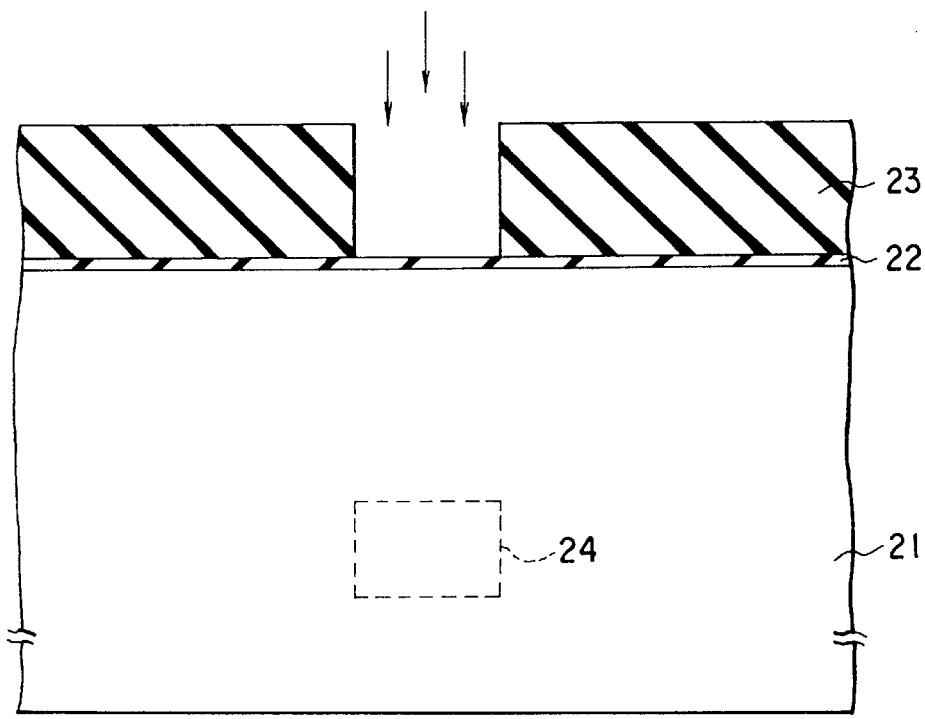
F I G. 71

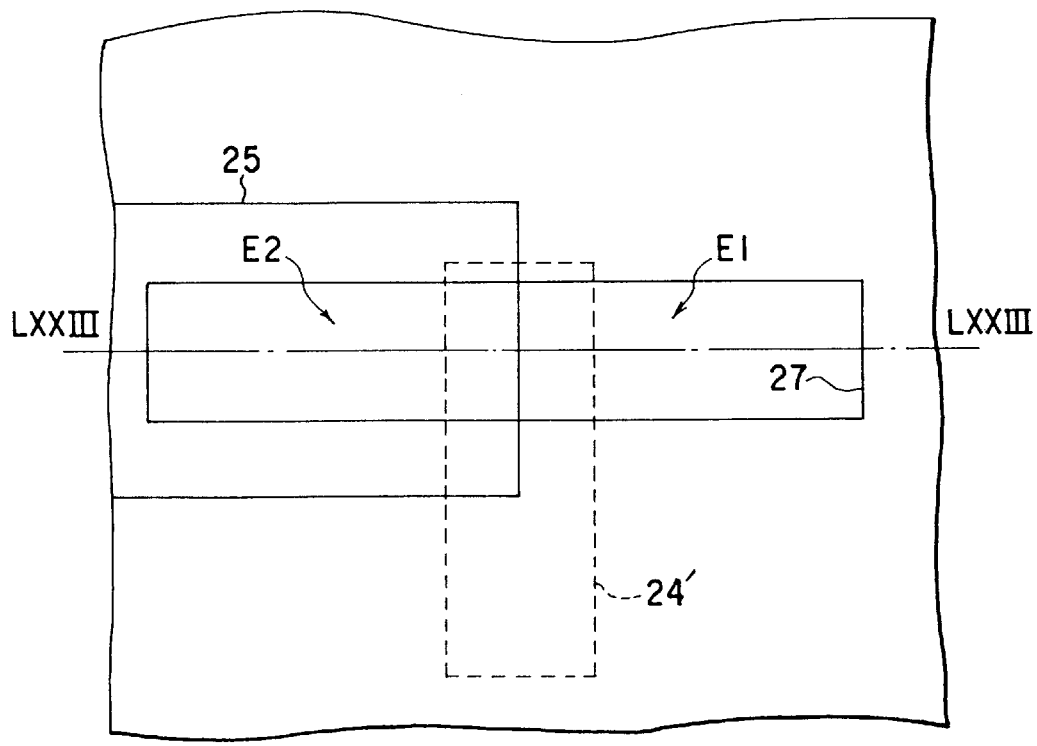
F I G. 72
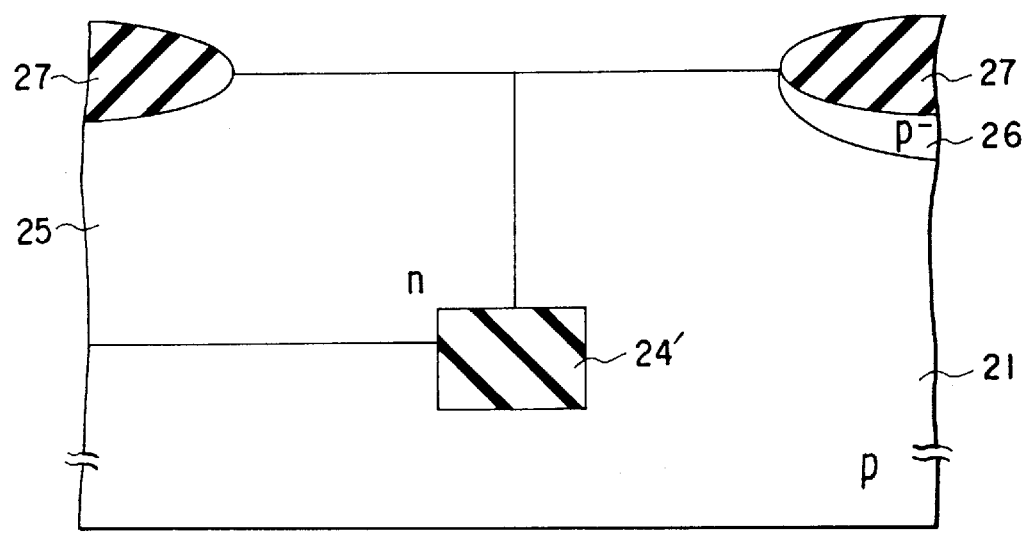
F I G. 73

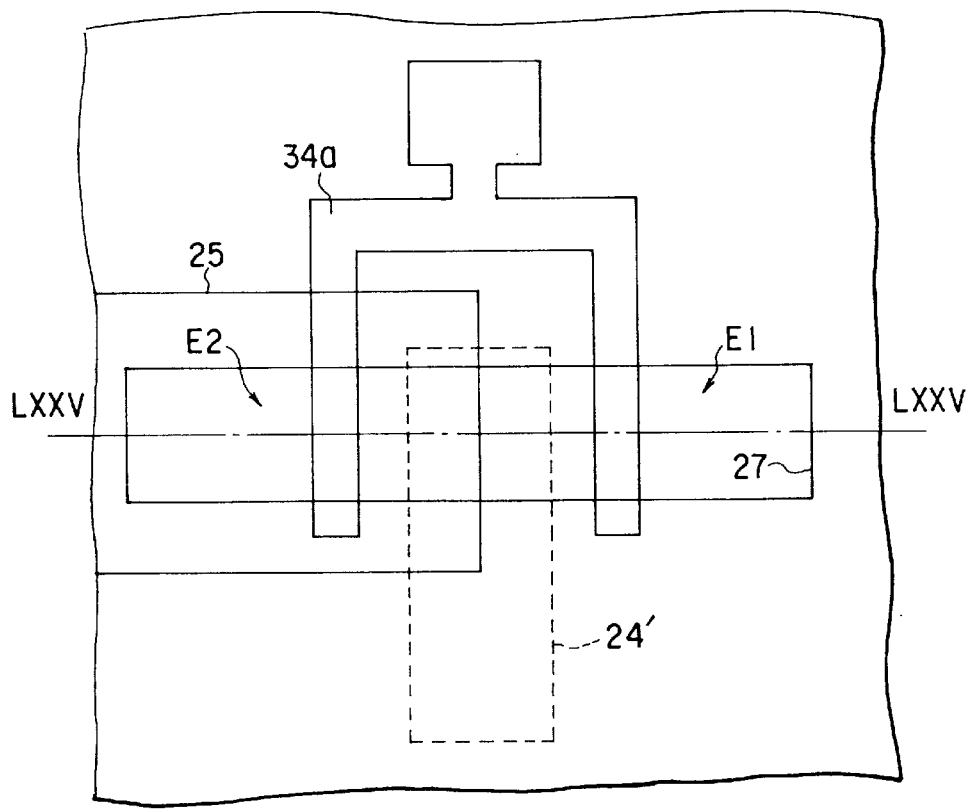
F I G. 74
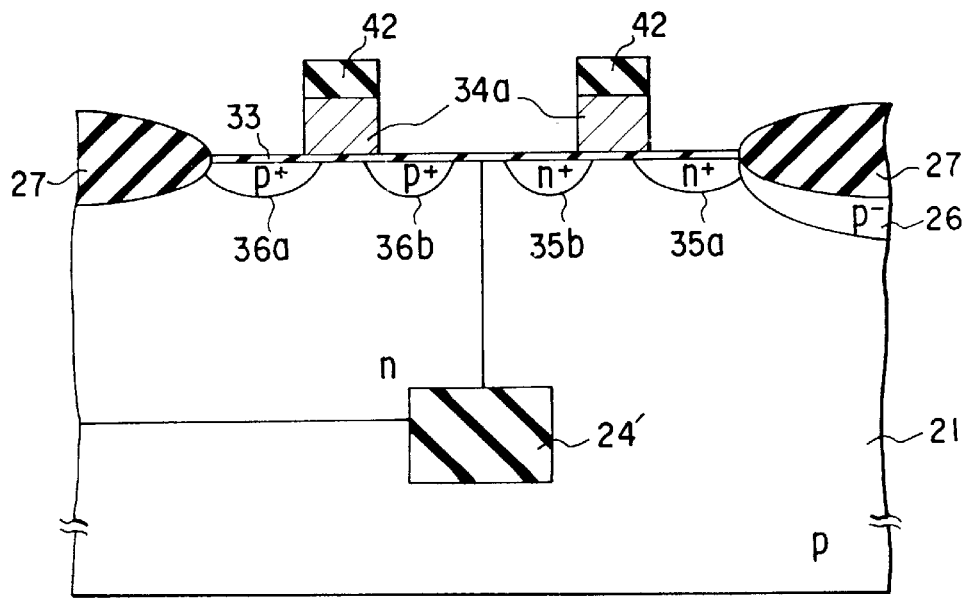
F I G. 75

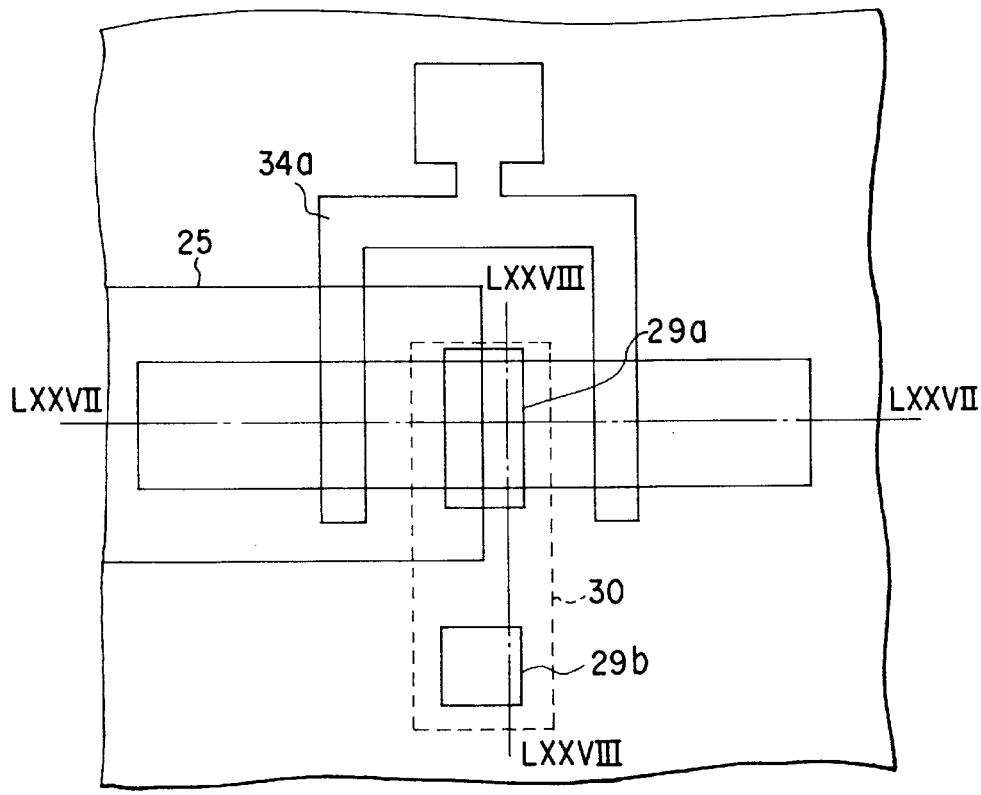
F I G. 76
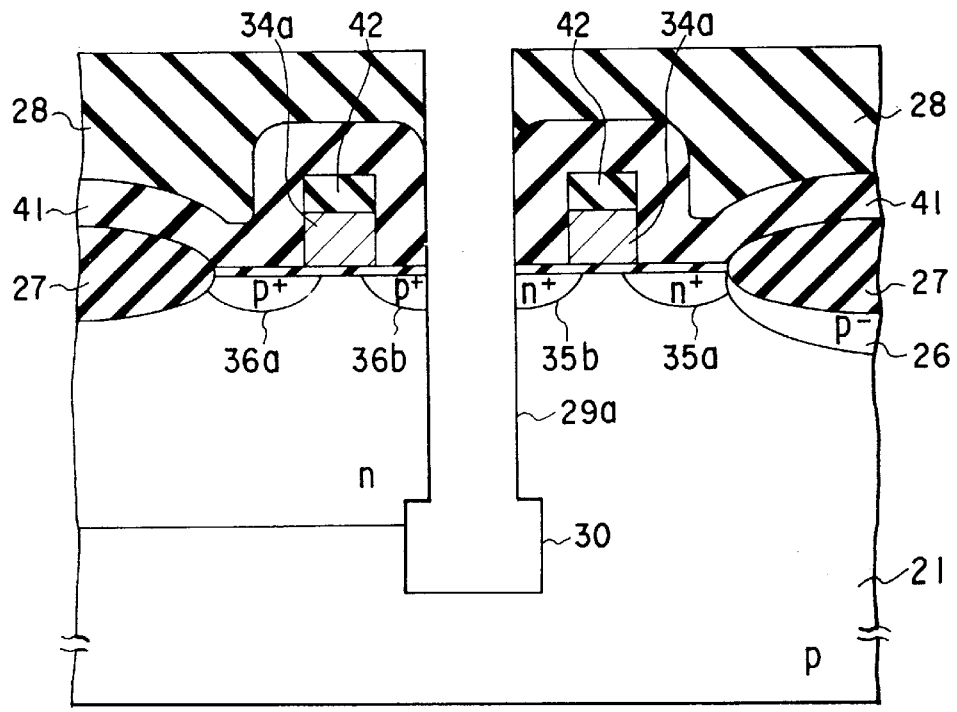
F I G. 77

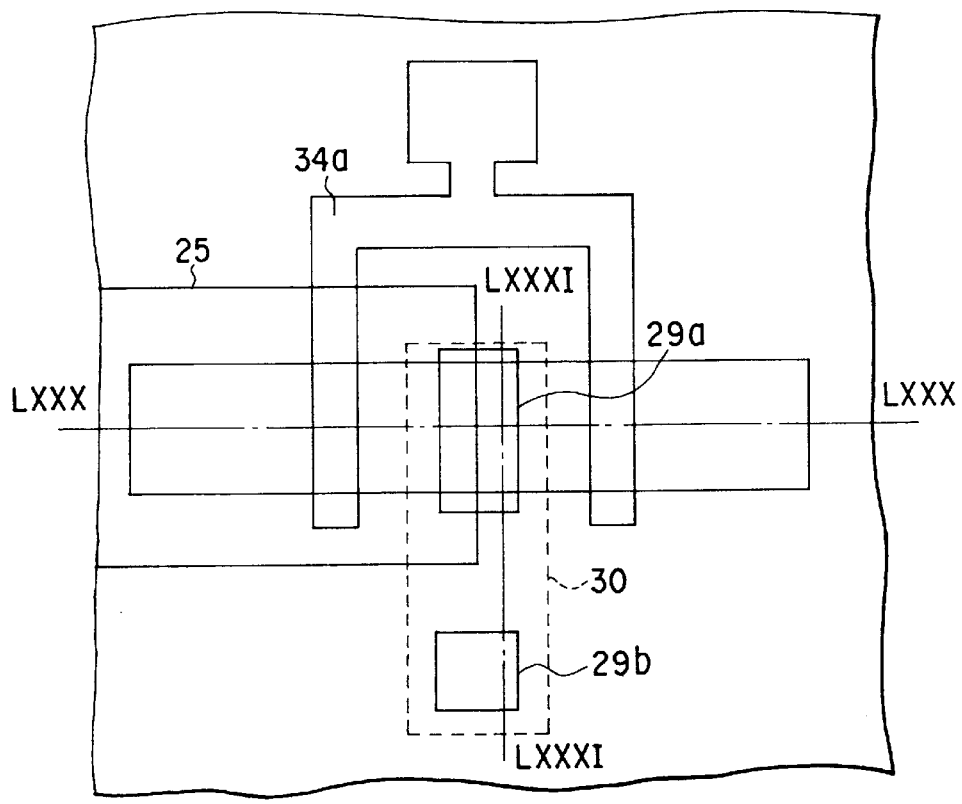
F I G. 79
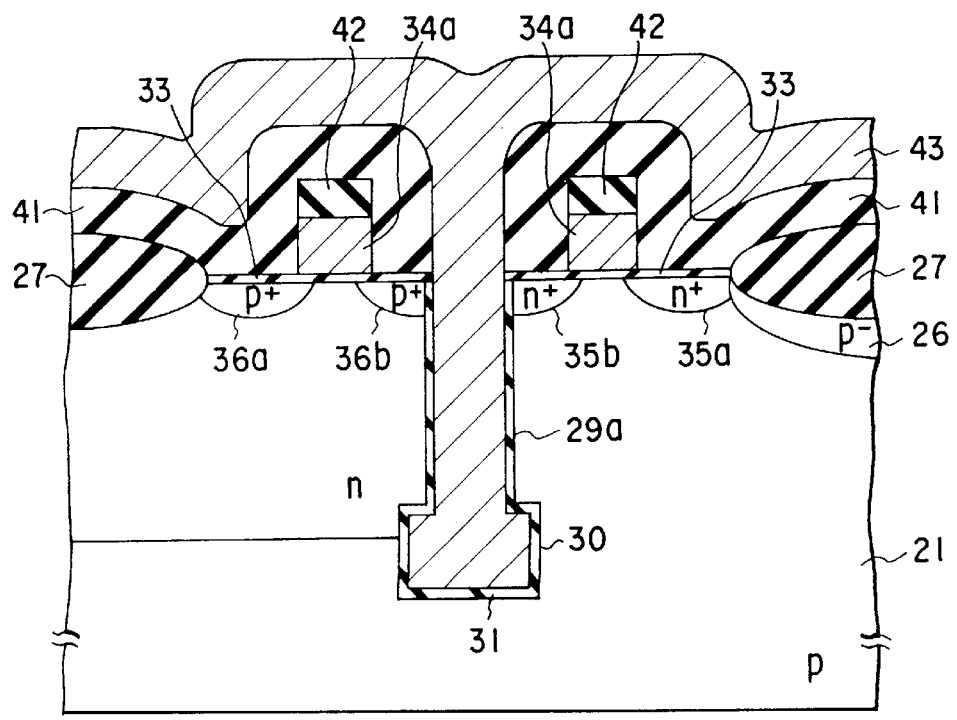
F I G. 80

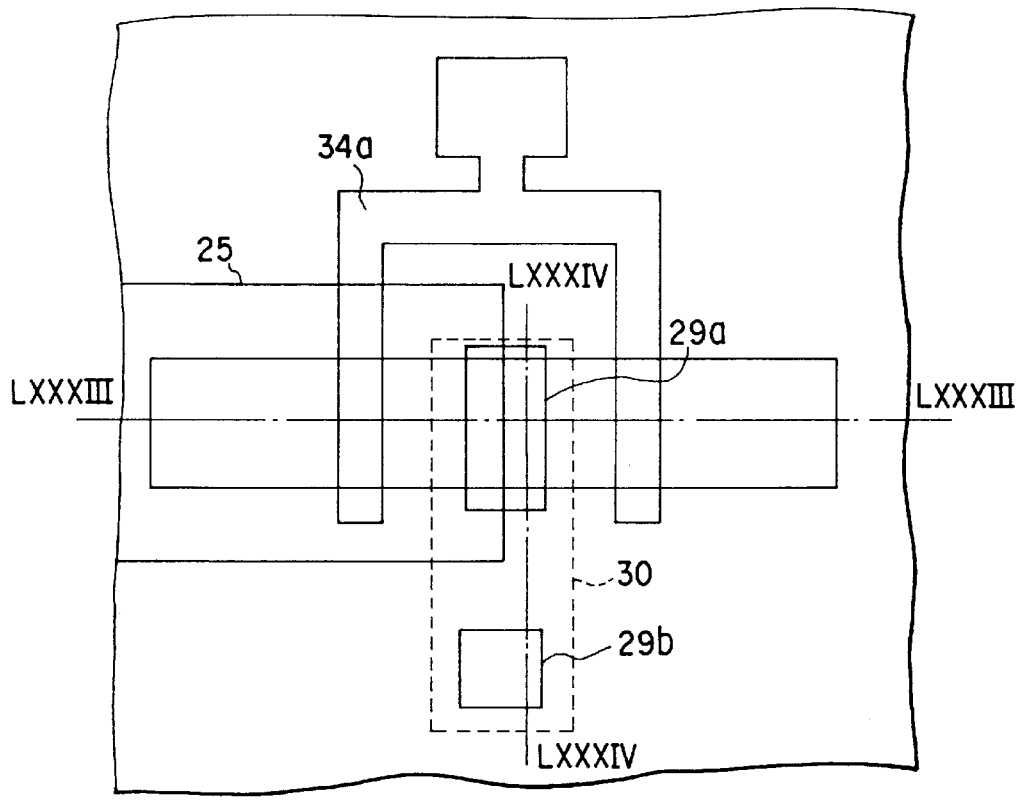
F I G. 82
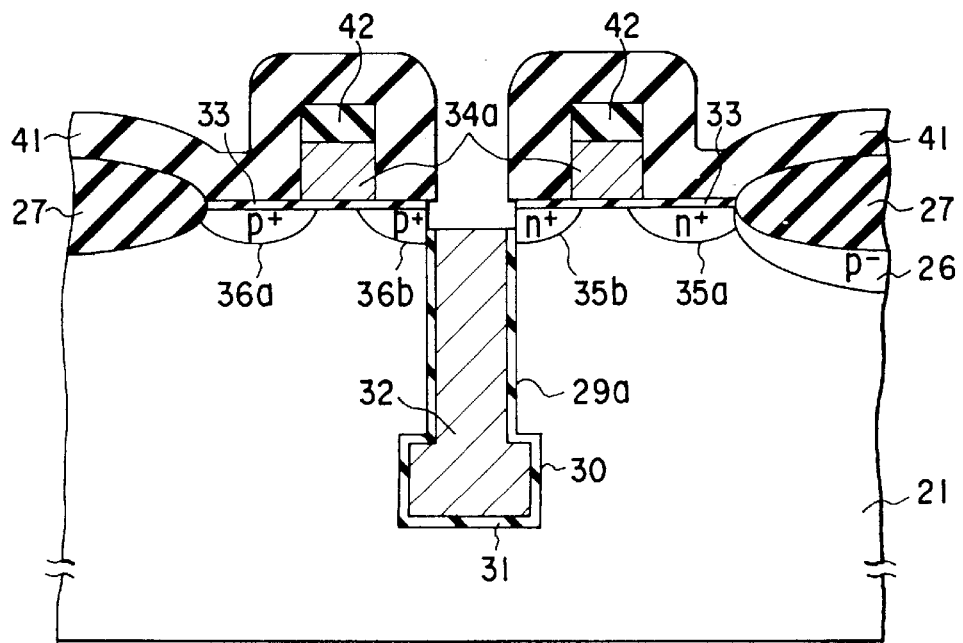
F I G. 83

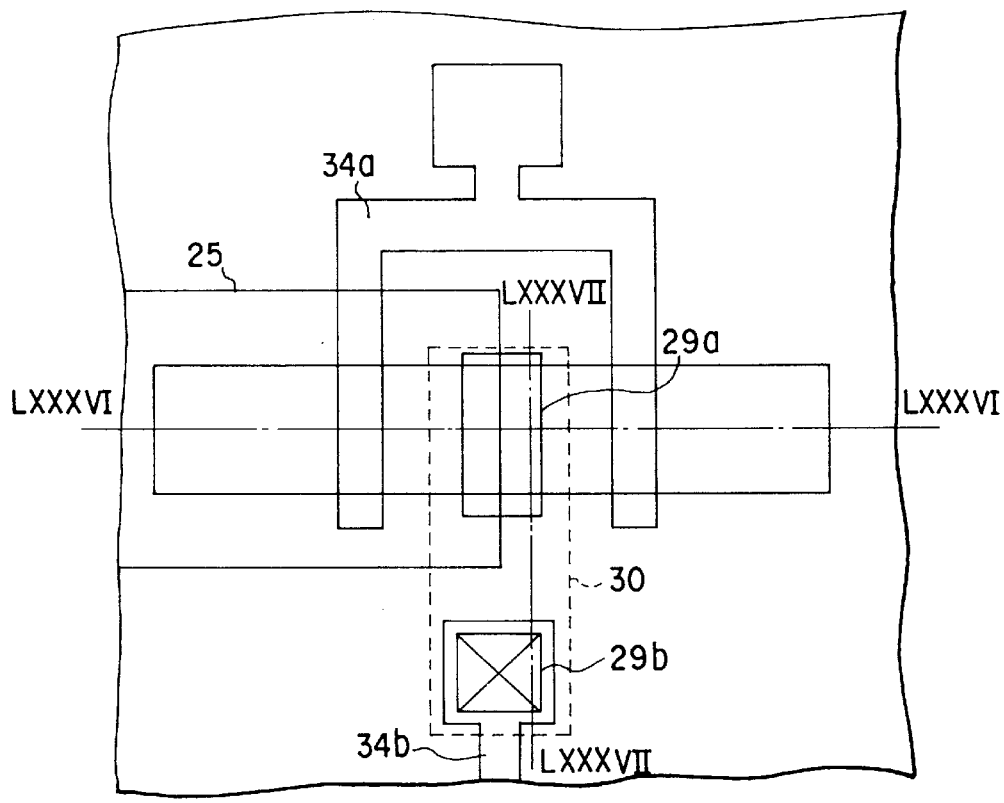
F I G. 85
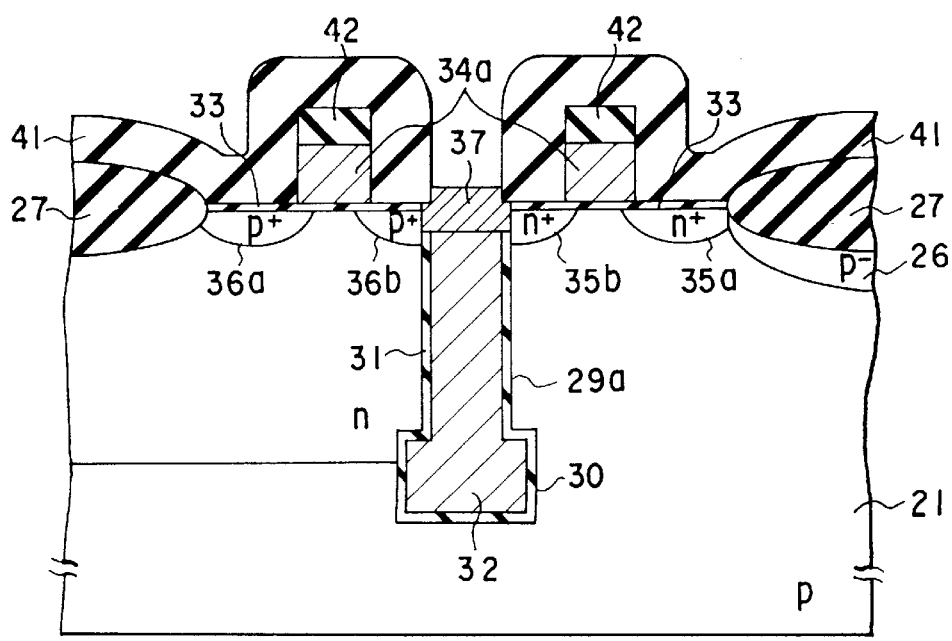
F I G. 86

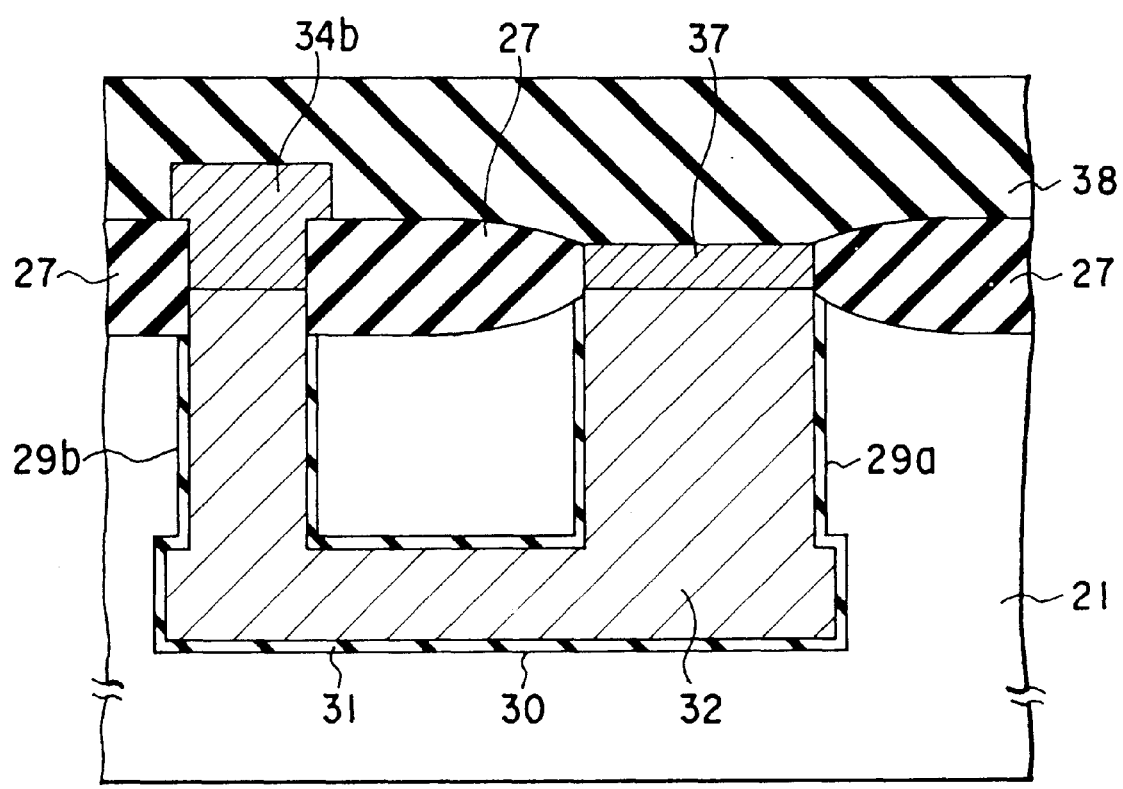
F I G. 90

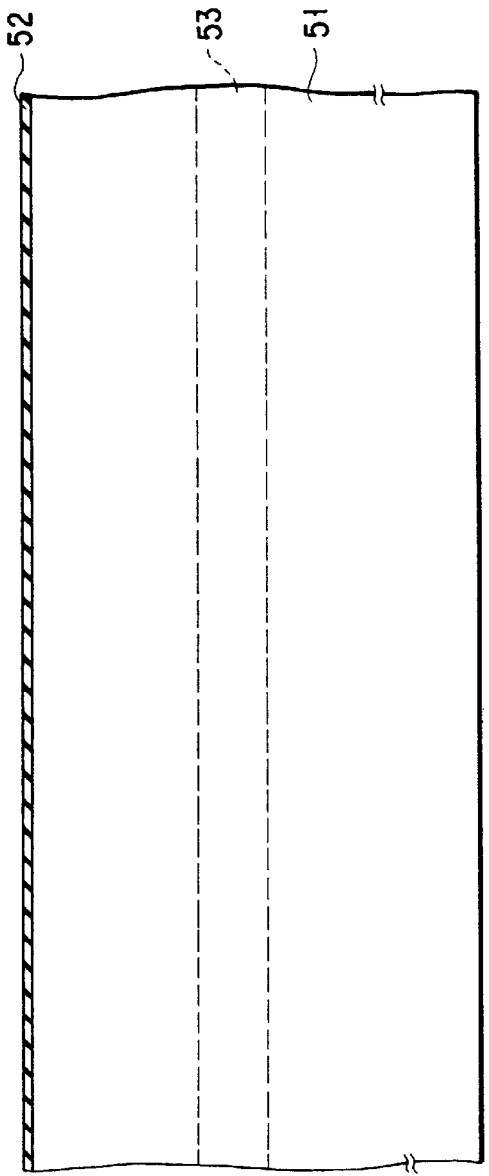
F I G. 94
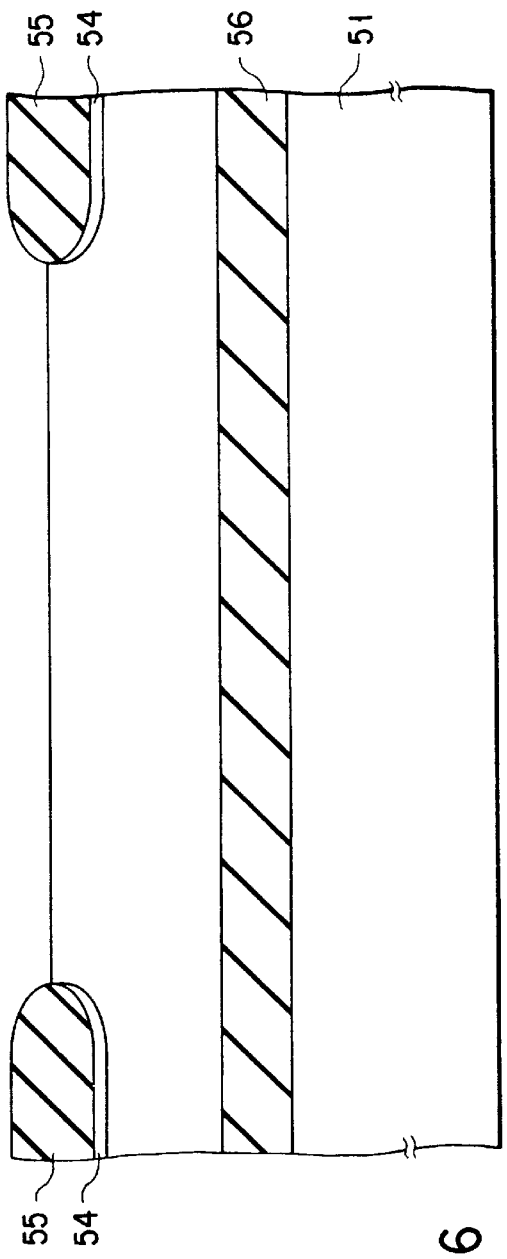
F I G. 96

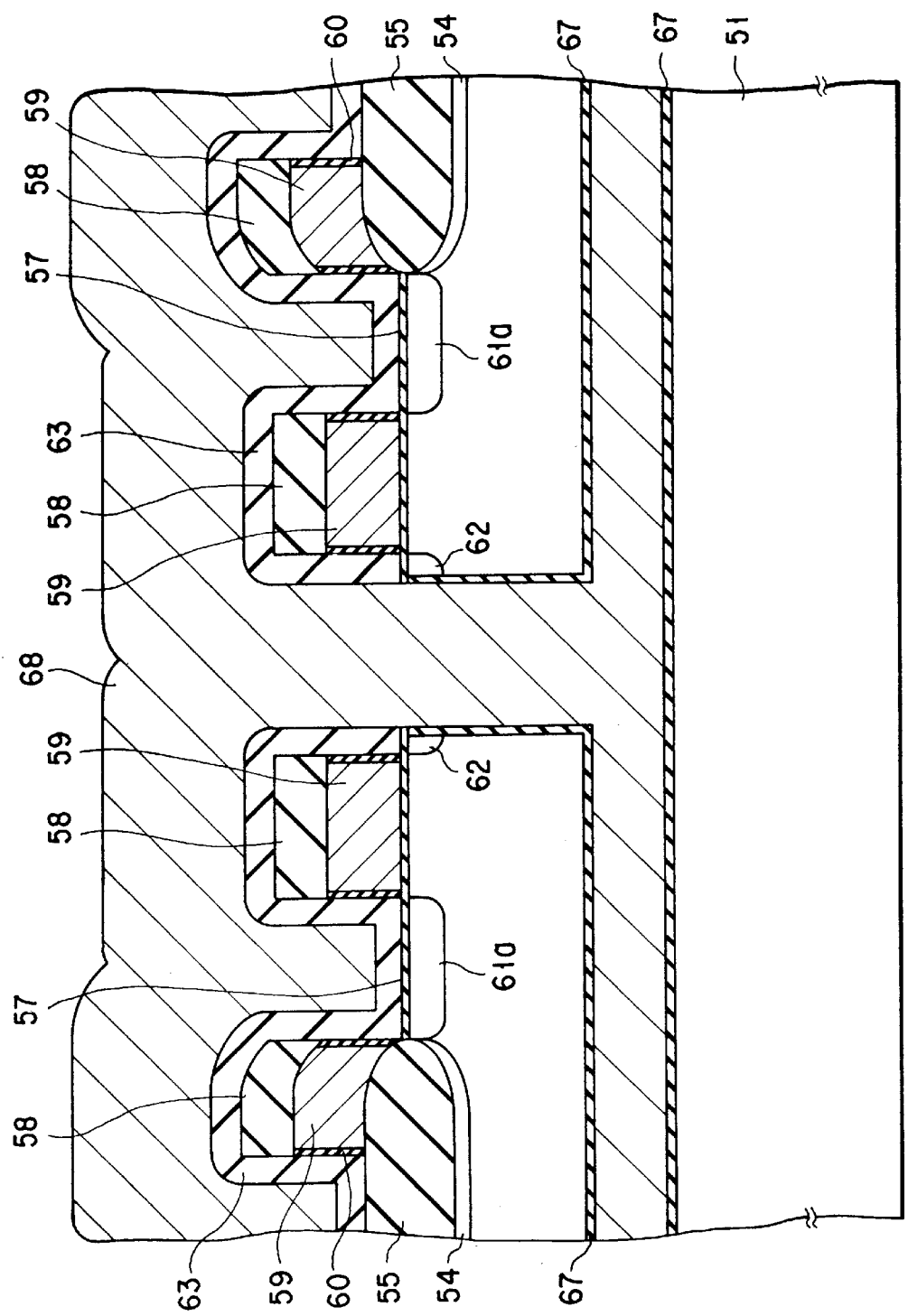
F I G. 102

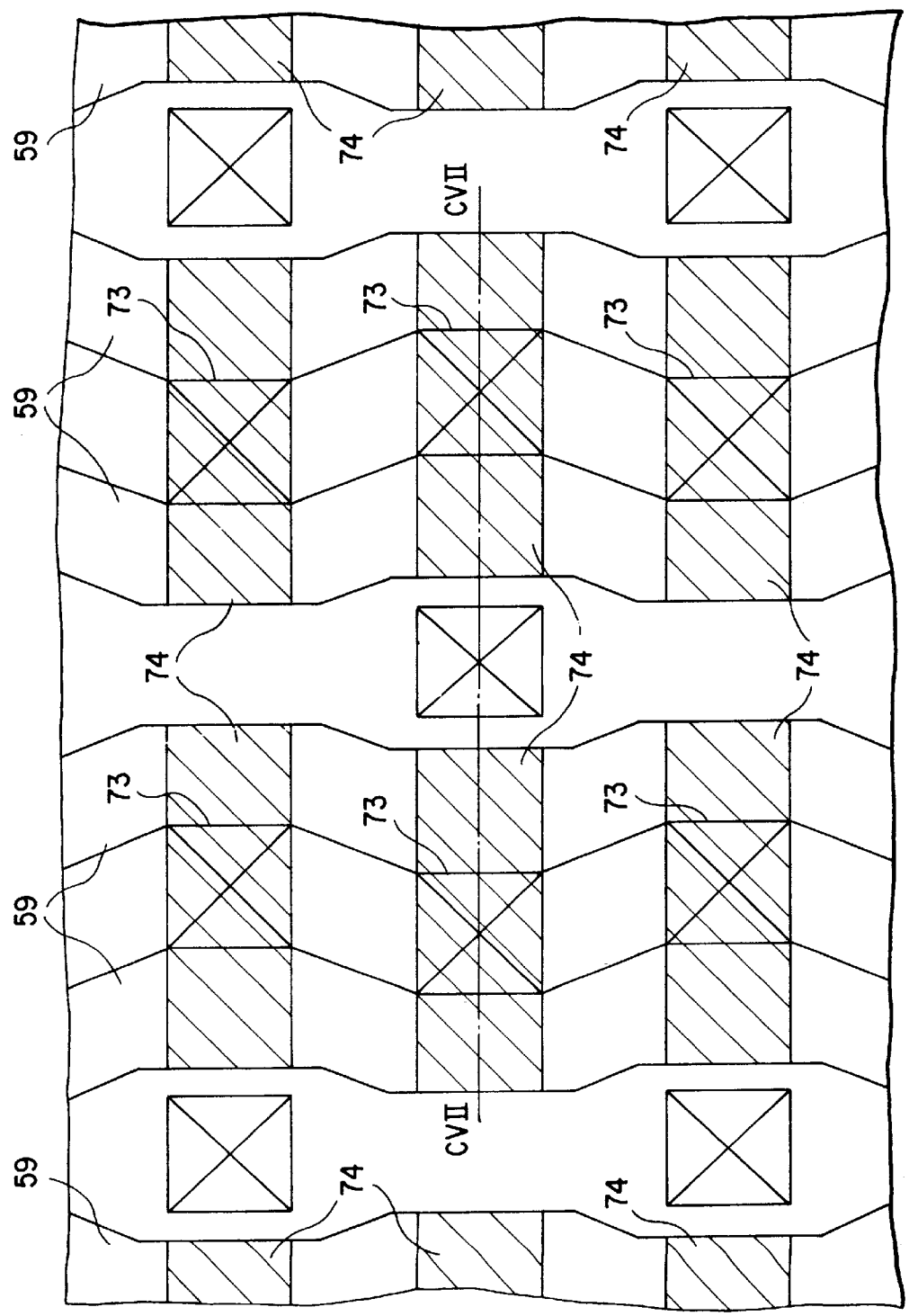
F I G. 106

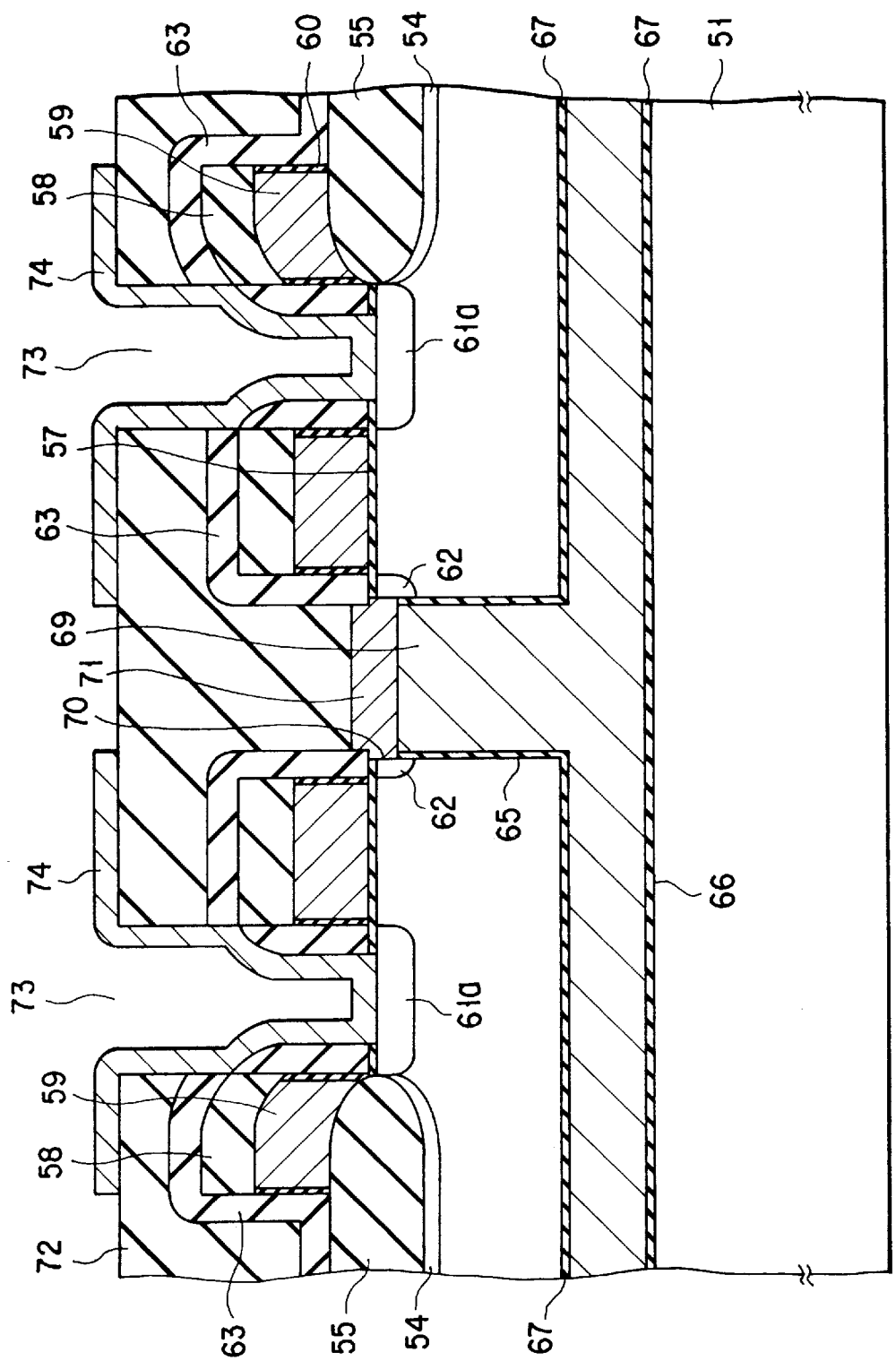
F I G. 107

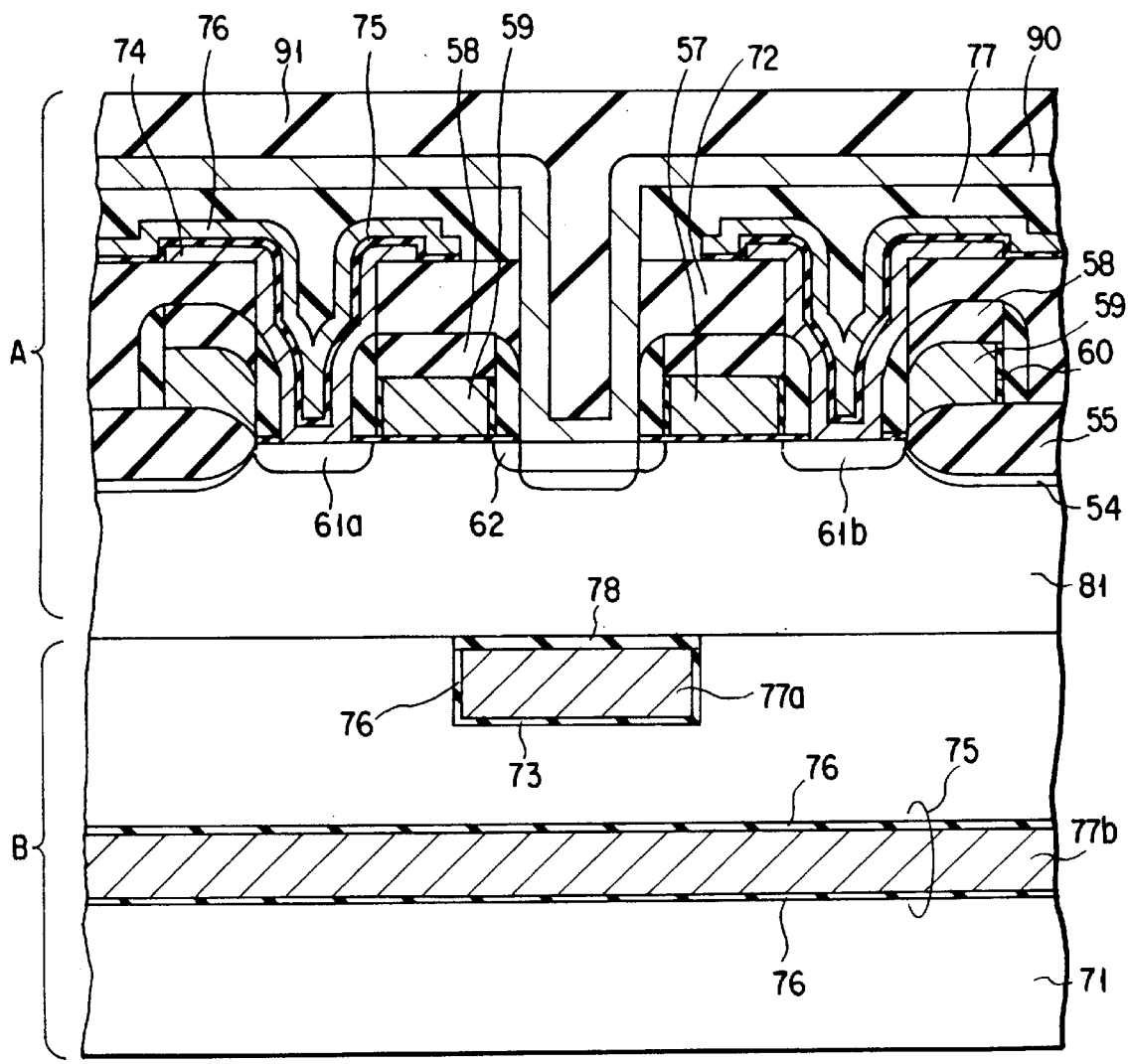
F I G. 123

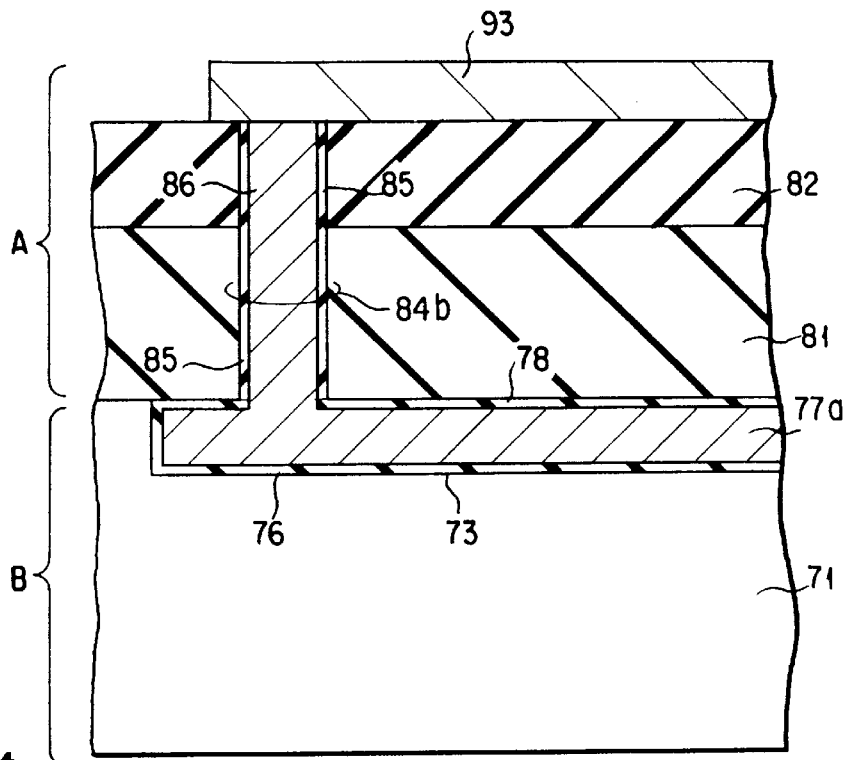
F I G. 124
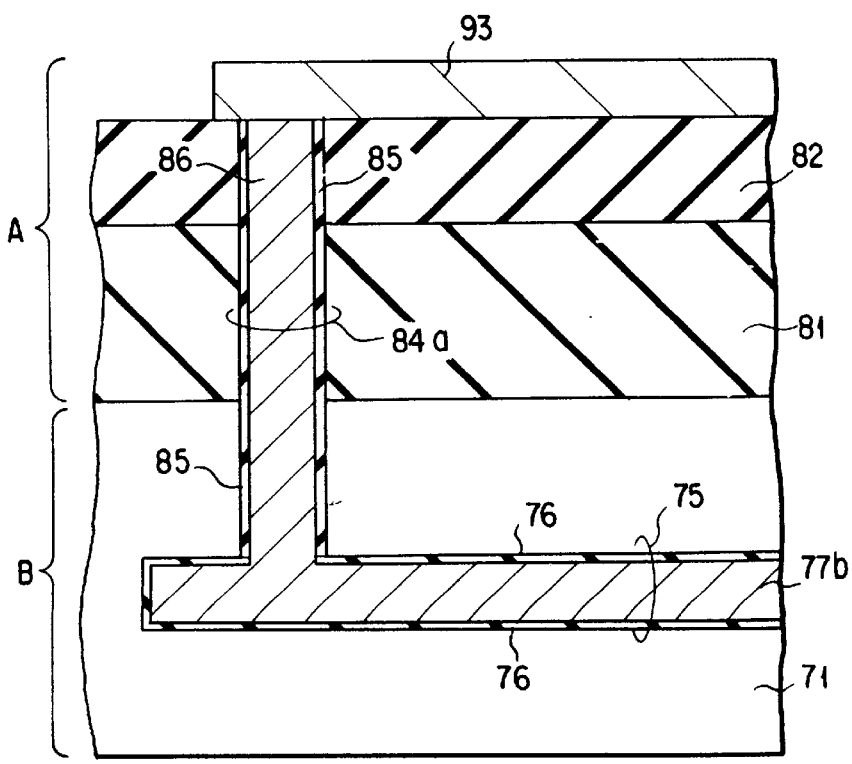
F I G. 125

METHOD OF MANUFACTURING A SEMICONDUCTOR DEVICE HAVING WIRING LAYERS WITHIN THE SUBSTRATE

This application is a division of application Ser. No. 08/262,890, filed Jun. 21, 1994 now abandoned.

BACKGROUND OF THE INVENTION

1. Field of the Invention

The present invention relates to an improvement in a semiconductor device and a method of manufacturing the same.

2. Description of the Related Art

[A] In recent years, with an increase in the integration density of semiconductor devices, the number of wiring layers formed on a substrate has increased to five to six. In order to prevent an increase in the number of wiring layers formed on a substrate, methods of burying wiring layers in the substrate are proposed. As a method of burying wiring layers in a substrate, part of the invention disclosed in Jpn. Pat. Appln. KOKAI Publication No. 63-263758 will be described below.

FIGS. 1 to 9A are perspective views showing the method disclosed in Jpn. Pat. Appln. KOKAI Publication No. 63-263758. In this method, first of all, as shown in FIG. 1, a silicon oxide film ($SiO_2$) 202, a silicon nitride film ($Si_3N_4$) 203, and a silicon oxide film ($CVD-SiO_2$) 204 are sequentially formed on a p-type silicon substrate 201. These films are patterned, and a deep trench 225 is formed in the substrate 201 by a dry etching method.

As shown in FIG. 2, a silicon oxide film 205 is formed on the side and bottom surfaces of the deep trench 225 by thermal oxidation. A polysilicon film 206 doped with arsenic (As) is formed on the entire surface of the resultant structure. The polysilicon film 206 is etched back to a predetermined position by the dry etching method to form a first wiring layer 206'.

Subsequently, as shown in FIG. 3, the silicon oxide film 205 is etched by a wet etching method using the first wiring layer 206' as a mask. At this time, the silicon oxide film 204 on the substrate 201 is completely removed. A polysilicon film 207 is formed on the entire surface of the resultant structure.

As shown in FIG. 4, the polysilicon film 207 is selectively etched to a predetermined position to form a connecting layer 207' between the first wiring layer 206' and a drain diffusion layer (formed in the subsequent step) of a transistor. Thereafter, the silicon nitride film 203 is removed by etching. A silicon oxide film 208 is formed on the resultant structure by thermal oxidation. At the same time, since arsenic is diffused from the first wiring layer 206' to the substrate 201 via the connecting layer 207', an $n^+$-type drain diffusion layer 210 is formed on the surface of the substrate 201 which is a side wall of the deep trench 225. An undoped polysilicon film 209 is formed on the entire surface of the resultant structure. In addition, the polysilicon film 209 is left on the upper portion of the deep trench 225 by an entire surface etching method.

As shown in FIG. 5, a silicon oxide film 211 is formed on the entire surface of the resultant structure. The silicon oxide film 211 is then patterned. A shallow trench 212 shallower than the deep trench 225 is formed to be perpendicular to the deep trench 225 by the dry etching method using the silicon oxide film 211 as a mask. Note that the depth of the shallow trench 212 is set such that the drain diffusion layer 210 on each side wall of the deep trench 225 is exposed.

As shown in FIG. 6, a silicon nitride film ($Si_3N_4$) 213 is formed on the entire surface of the resultant structure. The silicon nitride film 213 is then patterned. The silicon nitride film 213 is left to cover the channel portion of a transistor.

As shown in FIG. 7, a silicon oxide film 214 is formed by thermal oxidation. When the silicon nitride film 213 is removed, a field oxide film (silicon oxide film 214) is formed on the portion which is not covered with the silicon nitride film 213. In addition, a gate insulating film 215 is formed on the portion which is covered with the silicon nitride film 213.

As shown in FIG. 8, a tungsten silicide film is formed on the entire surface of the resultant structure. In addition, anisotropic dry etching is performed to leave the tungsten silicide film on only a side wall of the shallow trench 212, thus forming a gate electrode 217 of the transistor. Thereafter, a silicon oxide film ($CVD-SiO_2$) 218 is buried in the shallow trench 212.

As shown in FIG. 9, arsenic ions are implanted in the resultant structure at, for example, an acceleration voltage of about 100 kev and a dose of about $1 \times 10^{16}$ $cm^{-2}$. Thereafter, the resultant structure is annealed to form an $n^+$-type source diffusion layer 216 in the surface portion of the substrate 201 which is covered with the silicon nitride film 213. A contact hole 223 is formed in the silicon oxide film 214 to reach the source diffusion layer 216. After a metal wiring pattern 220 is formed, a silicon oxide film 221 and a silicon nitride film 222 are formed on the resultant structure by a plasma CVD method.

In the above-described manufacturing method as shown in FIG. 9A, the element (transistor) connected to the first wiring layer 206 cannot be structurally formed right above the first wiring layer 206. For this reason, the element is formed on a side of the first wiring layer 206.

In this method, for example, a wiring layer cannot be formed right under the gate electrode of a transistor, or a wiring layer crossing the channel portion of the transistor cannot be formed. Therefore, the degree of freedom is low in terms of patterns. In addition, since two trenches must be formed, the manufacturing process is complicated, resulting in an increase in cost.

[B] There is a growing trend toward larger capacities in dynamic RAMs (to be referred to as DRAMs hereinafter). Therefore, various proposals have been made to maximize the capacitor area of a memory cell in a limited region on a semiconductor substrate. As one of such proposals, a stacked capacitor is known.

A method of manufacturing a conventional DRAM having a stacked capacitor will be described below.

FIGS. 10 to 21 show the method of manufacturing the conventional DRAM having the stacked capacitor.

First of all, as shown in FIG. 10, a silicon oxide film and a silicon nitride film are formed on a p-type silicon substrate 301. A photoresist is formed on the silicon nitride film. The photoresist is then patterned.

The silicon nitride film is etched by the dry etching method using the photoresist as a mask. Thereafter, a p-type impurity (e.g., boron) is implanted in the substrate 301 by using the silicon nitride film as a mask.

When thermal oxidation is performed after the photoresist is removed, a p-type inversion preventing diffusion layer 302 is formed in the substrate 301, and a field oxide film 302 is formed on the inversion preventing diffusion layer 302. The silicon oxide film and the silicon nitride film are then completely removed.

As shown in FIGS. 11 and 12, a gate oxide film 304 of a transistor is formed in an element region by thermal oxidation. A polysilicon film doped with, e.g., phosphorous is formed on the resultant structure by an LPCVD method, and a silicon nitride film ($Si_3N_4$) 305 is formed on the polysilicon film.

A photoresist is newly formed on the silicon nitride film 305. The photoresist is then patterned. The silicon nitride film 305 and the polysilicon film are etched by the dry etching method using the photoresist as a mask. As a result, a gate electrode 306 of the transistor is formed.

After the photoresist is removed, an n-type impurity (e.g., arsenic) is implanted in the substrate 301 by using the silicon nitride film 305 and the gate electrode 306 as masks. Thereafter, thermal oxidation is performed to form a silicon oxide film 307 on each side surface of the gate electrode 306 and also form an n-type source region 308a and an n-type drain region 308b of the transistor in the substrate 301.

As shown in FIG. 13, a silicon nitride film ($Si_3N_4$) 309 is formed by the LPCVD method. The silicon nitride film 309 is etched by the dry etching method to be left on only each side wall surface of the gate electrode 306.

A silicon oxide film 310 is formed on the resultant structure by the LPCVD method. A photoresist is newly formed on the silicon oxide film 310. The photoresist is then patterned. The silicon oxide film 310 is etched by the dry etching method to form a contact hole 311 reaching the source region 308a. Thereafter, the photoresist is removed.

As shown in FIGS. 14 and 15, a polysilicon film doped with, e.g., phosphorous is formed by the LPCVD method.

A photoresist is newly formed on the polysilicon film. This photoresist is then patterned. The polysilicon film is etched by the dry etching method using the photoresist as a mask to form a storage electrode (storage node) 312 of the capacitor of a memory cell.

Note that this storage electrode 312 is not formed on the drain region 308b of the transistor of the memory cell.

FIGS. 16 and 17, after the photoresist is removed, a capacitor insulating film 313, e.g., a multilayered film (NO film) composed of silicon nitride and silicon oxide layers, is formed on the resultant structure. Furthermore, a polysilicon film doped with, e.g., phosphorous is formed by the LPCVD method.

A photoresist is newly formed on the polysilicon film. The photoresist is then patterned. The polysilicon film and the capacitor insulating film 313 are etched by the dry etching method using the photoresist as a mask to form a plate electrode 314 of the capacitor of the memory cell.

Note that this plate electrode 314 is not formed on the drain region 308b of the transistor of the memory cell.

After this process, the photoresist is removed.

As shown in FIG. 18, a silicon oxide film 315 is formed by the LPCVD method. A photoresist is newly formed on the silicon oxide film 315. The photoresist is then patterned. The silicon oxide film 315 is etched by the dry etching method using the photoresist as a mask to form a contact hole 316. Thereafter, the photoresist is removed.

An n-type impurity, e.g., arsenic, is implanted in the substrate 301 at the bottom portion of the contact hole 316 by an ion implantation method, and the resultant structure is annealed in a nitrogen atmosphere. As a result, an $n^+$-type diffusion layer 317 is formed.

As shown in FIGS. 19 and 20, a tungsten (W) film is formed by, e.g., a CVD method. A photoresist is newly formed on the tungsten film. The photoresist is then patterned. The tungsten film is etched by the dry etching method using the photoresist as a mask to form a bit line 318 which linearly extends. Thereafter, the photoresist is removed.

As shown in FIG. 21, a silicon oxide film 319 is formed by the LPCVD method. A contact hole is formed in a predetermined portion of the silicon oxide film 319. A barrier metal (e.g., a multilayered film composed of titanium and titanium nitride layers) 320 and an aluminum.silicon (Al.Si) film 321 are formed on the silicon oxide film 319 by a sputtering method.

A photoresist is newly formed on the aluminum.silicon film 321. The photoresist is then patterned. The aluminum-.silicon film 321 and the barrier metal 320 are etched by the dry etching method using the photoresist as a mask to form a wiring layer. Thereafter, the photoresist is removed.

In the above-described manufacturing method, the storage electrode 312 of the capacitor of the memory cell cannot be located on the drain region 308b of the memory cell transistor. This is because the contact hole 316 is formed in this region to bring the bit line 318 into contact with the drain region 308b.

That is, in the DRAM formed by this manufacturing method, since a certain alignment margin is required between a capacitor electrode and a bit line contact region, the capacitor area cannot be sufficiently increased.

FIGS. 22 to 25 show a method of manufacturing a conventional DRAM having a stacked capacitor, which method is designed to increase the capacitor area.

First of all, as shown in FIG. 22, a p-type inversion preventing diffusion layer 302 and a field oxide film 303 are formed in a p-type substrate 301. A gate oxide film 304 of a memory cell transistor is formed in an element region. A gate electrode 306 is formed on the gate oxide film 304.

After an n-type source region 308a and an n-type drain region 308b of the transistor are formed in the substrate 301, a silicon oxide film 310 is formed on the entire surface of the substrate 301 by the LPCVD method. In addition, the silicon oxide film 310 is etched to form a contact hole 311 reaching the source region 308a.

As shown in FIGS. 23 and 24, a polysilicon film doped with, e.g., phosphorous is formed by the LPCVD method. Subsequently, a silicon oxide film 322 is formed on the polysilicon film by the LPCVD method.

A photoresist is formed on the silicon oxide film 322. The photoresist is then patterned. The silicon oxide film 322 and the polysilicon film are etched by the dry etching method using the photoresist as a mask to form a storage electrode (storage node) 312a of the memory cell.

Note that the storage electrode 312a is not formed on the drain region 308b of the transistor of the memory cell.

After the photoresist is removed, a polysilicon film doped with, e.g., phosphorous is formed on the resultant structure. This polysilicon film is etched by the dry etching method to form a storage electrode (storage node) 312b on side surfaces of the storage electrode 312a and the silicon oxide film 322.

Subsequently, as shown in FIG. 25, after the silicon oxide film 322 is removed, a capacitor insulating film 313, e.g., a multilayered film (NO film) composed of silicon nitride and silicon oxide layers, is formed on the resultant structure. Furthermore, a polysilicon film doped with, e.g., phosphorous is formed by the LPCVD method.

A photoresist is newly formed on this polysilicon film. The photoresist is then patterned. The polysilicon film and the wafer capacitor insulating film 313 are etched by the dry etching method to form a plate electrode 314 of the capacitor of the memory cell.

Note that this plate electrode 314 is not formed on the drain region 308b of the transistor of the memory cell.

After the photoresist is removed, a silicon oxide film 315 is formed on the resultant structure by the LPCVD method. A contact hole 316 is formed in the silicon oxide film 315, and an $n^+$-type diffusion layer 317 is formed in the substrate 301 at the bottom portion of the contact hole 316. A tungsten (W) film is formed on the resultant structure by the CVD method. This tungsten film is patterned to form a bit line 318.

A silicon oxide film 319 is formed by the LPCVD method, and a contact hole is formed in a predetermined portion of the silicon oxide film 319. A barrier metal (e.g., a multilayered film composed of titanium and titanium nitride layers) 320 and an aluminum.silicon (Al.Si) film 321 are formed on the silicon oxide film 319 by the sputtering method. The aluminum.silicon film 321 and the barrier metal 320 are patterned to form a wiring layer.

In the above-described manufacturing method, since the storage electrode 312 of the capacitor of the memory cell is formed in the form of a crown, the capacitor area can be increased.

In this method, however, the process of manufacturing the capacitor of a memory cell is complicated. In addition, the aspect ratio of the contact hole 316 needs to be large to bring the drain region 308b and the bit line 318 of the memory cell transistor into contact with each other.

As described above, in order to prevent an increase in the number of wiring layers to be formed on a substrate, methods of burying wiring layers in the substrate have been proposed. However, these methods are not satisfactory because the degree of freedom is low in terms of patterns, and the manufacturing process is complicated.

Furthermore, in the DRAM having the stacked capacitor, in order to ensure reliability, it is required that a reduction in capacitor area be prevented regardless of the growing trend toward larger capacities. This requirement must be satisfied.

SUMMARY OF THE INVENTION

The present invention has been made to eliminate the above drawbacks, and has as its object to provide a semiconductor device which allows an easy manufacturing process and can realize a high integration density, and a method of manufacturing the same.

In order to achieve the above object, according to the present invention, there is provided a semiconductor device comprising a semiconductor substrate, a semiconductor element formed on a surface of the semiconductor substrate, a tunnel formed in the semiconductor substrate at a position right under the semiconductor element, a contact hole extending from the surface of the semiconductor substrate and reaching the tunnel, and a wiring layer buried in the tunnel and the contact hole.

According to the present invention, there is provided a semiconductor device comprising a semiconductor substrate, a semiconductor element formed on a surface of the semiconductor substrate, a tunnel formed in the semiconductor substrate at a position right under the semiconductor element, a contact hole extending from the surface of the semiconductor substrate and reaching the tunnel, an insulating layer formed on inner surfaces of the tunnel and the contact hole, and a wiring layer buried in the tunnel and the contact hole.

According to the present invention, there is provided a semiconductor device comprising a semiconductor substrate, a field insulating film surrounding first and second element regions of the semiconductor substrate, a tunnel formed in the semiconductor substrate, a contact hole formed between the first and second element regions such that a bottom portion of the contact hole reaches the tunnel, an insulating layer formed on inner surfaces of the tunnel and the contact hole, a wiring layer buried in the tunnel and the contact hole, and semiconductor elements respectively formed in the first and second element regions.

Two opposing sides of the contact hole overlap the field insulating film when viewed from above the semiconductor substrate. A well is formed in the first element region, and a bottom surface of the well is located above a bottom surface of the tunnel.

A first MOS transistor having a first conductivity type is formed in the first element region, and a second MOS transistor having a second conductivity type is formed in the second element region, the first and second MOS transistors having drains adjacent to the contact hole and electrically connected to the wiring layer via a conductive film formed on the semiconductor substrate.

A first MOS transistor having a first conductivity type is formed in the first element region, and a second MOS transistor having a second conductivity type is formed in the second element region, the first and second MOS transistors having drains adjacent to the contact hole and electrically connected to the wiring layer at a side wall of the contact hole via a conductive film formed on the wiring layer.

According to the present invention, there is provided a semiconductor device comprising a semiconductor substrate, a field insulating film surrounding an element region of the semiconductor substrate, a tunnel formed in the semiconductor substrate, a contact hole formed in the element region such that a bottom portion of the contact hole reaches the tunnel, an insulating layer formed on inner surfaces of the tunnel and the contact hole, a wiring layer buried in the tunnel and the contact hole, and a memory cell formed in the element region and connected to the wiring layer.

The tunnel linearly extends, and the wiring layer constitutes a bit line of the memory cell. The memory cell includes a stacked capacitor, and a plate electrode of the stacked capacitor is formed on a substantially entire surface of the semiconductor substrate including a connecting portion between the memory cell and the wiring layer.

A drain of the memory cell is adjacent to the contact hole and electrically connected to the wiring layer at a side wall of the contact hole via a conductive film formed on the wiring layer.

According to the present invention, there is provided a method of manufacturing a semiconductor device, comprising the steps of implanting an impurity in a semiconductor substrate to a predetermined depth to form an impurity-implanted layer in the semiconductor substrate, forming a contact hole extending from a surface of the semiconductor substrate and reaching the impurity-implanted layer, selectively etching the impurity-implanted layer to form a tunnel in the semiconductor substrate, and burying a conductive film in the tunnel and the contact hole.

According to the present invention, there is provided a method of manufacturing a semiconductor device, comprising the steps of implanting an impurity in a semiconductor substrate to a predetermined depth to form an impurity-implanted layer in the semiconductor substrate, forming a contact hole extending from a surface of the semiconductor substrate and reaching the impurity-implanted layer, selectively etching the impurity-implanted layer to form a tunnel in the semiconductor substrate, forming an insulating layer on inner surfaces of the tunnel and the contact hole, and burying a conductive film in the tunnel and the contact hole.

According to the present invention, there is provided a method of manufacturing a semiconductor device, comprising the steps of implanting an oxygen ion in a semiconductor substrate to a predetermined depth to form an oxygen-implanted layer in the semiconductor substrate, converting the oxygen-implanted layer into an oxide layer by annealing, forming a contact hole extending from a surface of the semiconductor substrate and reaching the oxygen-implanted layer, selectively etching the oxide layer to form a tunnel in the semiconductor substrate, forming an insulating layer on inner surfaces of the tunnel and the contact hole, and burying a conductive film in the tunnel and the contact hole.

According to the present invention, there is provided a method of manufacturing a semiconductor device, comprising the steps of implanting an impurity in a semiconductor substrate to a predetermined depth to form an impurity-implanted layer in the semiconductor substrate, forming a field insulating film on the semiconductor substrate to surround first and second element regions and converting the impurity-implanted layer into a first insulating layer, forming a first contact hole between the first and second element regions, the first contact hole extending from a surface of the semiconductor substrate and reaching the first insulating layer, selectively etching the first insulating layer to form a tunnel in the semiconductor substrate, forming a second insulating layer on inner surfaces of the tunnel and the first contact hole, and burying a first conductive film in the tunnel and first contact hole.

The method further comprises the step of forming semiconductor elements in the first and second element regions, respectively. Two opposing sides of the first contact hole overlap the field insulating film when viewed from above the semiconductor substrate.

The method further comprises the step of forming a well in the first element region at a position above a bottom surface of the tunnel.

The method further comprises the step of forming a first MOS transistor in the first element region, forming a second MOS transistor in the second element region, selectively forming a second conductive film on drains of the first and second MOS transistors and the first conductive film, and electrically connecting the drains of the first and second MOS transistors to the first conductive film.

The method further comprises the step of forming a first MOS transistor in the first element region, forming a second MOS transistor in the second element region, forming a second hole in the second insulating layer on a side wall of the first contact hole, the second hole reaching the first and second MOS transistors, selectively forming a second conductive film on the first conductive film, and electrically connecting the drains of the first and second MOS transistors to the first conductive film.

According to the present invention, there is provided a method of manufacturing a semiconductor device, comprising the steps of implanting an impurity in a semiconductor substrate to a predetermined depth to form an impurity-implanted layer in the semiconductor substrate, forming a field insulating film on the semiconductor substrate to surround an element region and converting the impurity-implanted layer into a first insulating layer, forming a first contact hole in the element region, the first contact hole extending from a surface of the semiconductor substrate and reaching the first insulating layer, selectively etching the first insulating layer to form a tunnel in the semiconductor substrate, forming a second insulating layer on inner surfaces of the tunnel and the first contact hole, burying a first conductive film in the tunnel and first contact hole, and forming a memory cell in the element region, the memory cell being connected to the first conductive film.

The impurity-implanted layer linearly extends, and the first conductive film becomes a bit line of the memory cell. The memory cell includes a stacked capacitor, and a plate electrode of the stacked capacitor is formed on a substantially entire surface of the semiconductor substrate including a connecting portion between the memory cell and the wiring layer.

The method further comprises the step of forming a second contact hole in the second insulating layer on a side wall of the first contact hole, the second contact hole reaching a drain of the memory cell, selectively forming a second conductive film on the first conductive film, and electrically connecting the drain of the memory cell to the first conductive film.

According to the present invention, there is provided a method of manufacturing a semiconductor device, comprising the steps of implanting an impurity in a first semiconductor substrate to a predetermined depth to form an impurity-implanted layer in the first semiconductor substrate, forming a contact hole extending from a surface of the first semiconductor substrate and reaching the impurity-implanted layer, selectively etching the impurity-implanted layer to form a tunnel in the first semiconductor substrate, burying a conductive film in the tunnel and the contact hole, and bonding a second semiconductor substrate to the first semiconductor substrate.

According to the present invention, there is provided a method of manufacturing a semiconductor device, comprising the steps of implanting an impurity in a first semiconductor substrate to a predetermined depth to form an impurity-implanted layer in the first semiconductor substrate, forming a contact hole extending from a surface of the first semiconductor substrate and reaching the impurity-implanted layer, selectively etching the impurity-implanted layer to form a tunnel in the first semiconductor substrate, forming an insulating layer on inner surfaces of the tunnel and the contact hole, burying a conductive film in the tunnel and the contact hole, and bonding a second semiconductor substrate to the first semiconductor substrate.

The method further comprises the step of forming a trench in the first semiconductor substrate, burying a conductive film in the tunnel and the first contact hole and simultaneously burying the conductive film in the trench, and forming an insulating layer on the conductive film in the trench.

Only a wiring layer is formed on the first semiconductor substrate, and a semiconductor element is formed on the second semiconductor substrate.

The method further comprises the step of forming a second contact hole in the second semiconductor substrate, the second contact hole serving to connect the semiconductor element to the conductive film in the tunnel or the trench in the first semiconductor substrate, and burying a conductive film in the second contact hole.

According to the above arrangements, wiring layers are formed in a semiconductor substrate at positions right under semiconductor elements. For this reason, the degree of freedom increases in terms of patterns, contributing to an increase in the integration density of semiconductor elements.

If the two opposing sides of the contact hole overlap the field insulating film when viewed from above the semiconductor substrate, two semiconductor elements are isolated from each other by this contact hole.

If a well formed in an element region is located above the bottom surface of a tunnel, a contact hole itself can serve as an element isolation means.

If the bit line of a DRAM is buried in a semiconductor substrate, an increase in the electrode area of a capacitor can be achieved, resulting in an increase in the integration density (miniaturization) of memory cells.

According to the above methods, an impurity-implanted layer in a semiconductor substrate is etched to form a tunnel in the semiconductor substrate. A conductive film is then buried in this tunnel. With this simple method, a wiring layer is formed in the semiconductor substrate. That is, a wiring layer can be formed in a semiconductor substrate by a simple manufacturing process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 29 is a plan view showing a semiconductor device according to the second embodiment of the present invention;

FIG. 30 is a sectional view taken along a line XXX—XXX in FIG. 29;

FIG. 31 is a sectional view taken along a line XXXI—XXXI in FIG. 29;

FIG. 32 is a sectional view showing a step of a method of manufacturing a semiconductor device according to the third embodiment of the present invention;

FIG. 33 is a sectional view showing another step of the method of manufacturing the semiconductor device according to the third embodiment of the present invention;

FIG. 34 is a sectional view showing still another step of the method of manufacturing the semiconductor device according to the third embodiment of the present invention;

FIG. 35 is a sectional view showing still another step of the method of manufacturing the semiconductor device according to the third embodiment of the present invention;

FIG. 36 is a sectional view showing still another step of the method of manufacturing the semiconductor device according to the third embodiment of the present invention;

FIG. 46 is a plan view showing a semiconductor device according to the fifth embodiment of the present invention;

FIG. 47 is a sectional view taken along a line XLVII—XLVII in FIG. 46;

FIG. 48 is a sectional view taken along a line XLVIII—XLVIII in FIG. 46;

FIG. 51 is a plan view showing another step of the method of manufacturing the semiconductor device according to the sixth embodiment of the present invention;

FIG. 52 is a sectional view taken along a line LII—LII in FIG. 51;

FIG. 55 is a sectional view taken along a line LV—LV in FIG. 53;

FIG. 62 is a plan view showing still another step of the method of manufacturing a semiconductor device according to the sixth embodiment of the present invention;

FIG. 63 is a sectional view taken along a line LXIII—LXIII in FIG. 62;

FIG. 64 is a sectional view taken along a line LXIV—LXIV in FIG. 62;

FIG. 67 is a plan view showing a semiconductor device according to the seventh embodiment of the present invention;

FIG. 68 is a sectional view taken along a line LXVIII—LXVIII in FIG. 67;

FIG. 69 is a sectional view taken along a line LXIX—LXIX in FIG. 67;

FIG. 70 is a plan view showing a step of a method of manufacturing a semiconductor device according to the eighth embodiment of the present invention;

FIG. 71 is a sectional view taken along a line LXXI—LXXI in FIG. 70;

FIG. 72 is a plan view showing another step of the method of manufacturing the semiconductor device according to the eighth embodiment of the present invention;

FIG. 73 is a sectional view taken along a line LXXIII—LXXIII in FIG. 72;

FIG. 74 is a plan view showing still another step of the method of manufacturing the semiconductor device according to the eighth embodiment of the present invention;

FIG. 75 is a sectional view taken along a line LXXV—LXXV in FIG. 74;

FIG. 76 is a plan view showing still another step of the method of manufacturing the semiconductor device according to the eighth embodiment of the present invention;

FIG. 77 is a sectional view taken along a line LXXVII—LXXVII in FIG. 76;

FIG. 79 is a plan view showing still another step of the method of manufacturing the semiconductor device according to the eighth embodiment of the present invention;

FIG. 80 is a sectional view taken along a line LXXX—LXXX in FIG. 79;

FIG. 82 is a plan view showing still another step of the method of manufacturing the semiconductor device according to the eighth embodiment of the present invention;

FIG. 83 is a sectional view taken along a line LXXXIII—LXXXIII in FIG. 82;

FIG. 85 is a plan view showing still another step of the method of manufacturing the semiconductor device according to the eighth embodiment of the present invention;

FIG. 86 is a sectional view taken along a line LXXXVI—LXXXVI in FIG. 85;

FIG. 90 is a sectional view taken along a line XC—XC in FIG. 88;

FIG. 94 is a sectional view taken along a line XCIV—XCIV in FIG. 93;

FIG. 96 is a sectional view taken along a line XCVI—XCVI in FIG. 95;

FIG. 102 is a sectional view showing still another step of the method of manufacturing the semiconductor device according to the tenth embodiment of the present invention;

FIG. 106 is a plan view showing still another step of the method of manufacturing the semiconductor device according to the tenth embodiment of the present invention;

FIG. 107 is a sectional view taken along a line CVII—CVII in FIG. 106;

FIG. 118 is a sectional view taken along a line CXVIII—CXVIII in FIG. 117;

FIG. 119 is a sectional view taken along a line CXIX—CXIX in FIG. 117;

FIG. 120 is a sectional view showing still another step of the method of manufacturing the semiconductor device according to the eleventh embodiment of the present invention;

FIG. 121 is a sectional view showing still another step of the method of manufacturing the semiconductor device according to the eleventh embodiment of the present invention;

FIG. 122 is a sectional view showing still another step of the method of manufacturing the semiconductor device according to the eleventh embodiment of the present invention;

FIG. 123 is a sectional view showing a semiconductor device according to the twelfth embodiment of the present invention;

FIG. 124 is a sectional view showing a semiconductor device according to the twelfth embodiment of the present invention;

FIG. 125 is a sectional view showing a semiconductor device according to the twelfth embodiment of the present invention;

FIG. 126 is a plan view showing a step of a method of manufacturing a semiconductor device according to the thirteenth embodiment of the present invention;

FIG. 127 is a sectional view taken along a line CXXVII—CXXVII in FIG. 126;

FIG. 128 is a plan view showing another step of the method of manufacturing the semiconductor device according to the thirteenth embodiment of the present invention;

FIG. 129 is a sectional view taken along a line CXXIX—CXXIX in FIG. 128;

Figure 130:
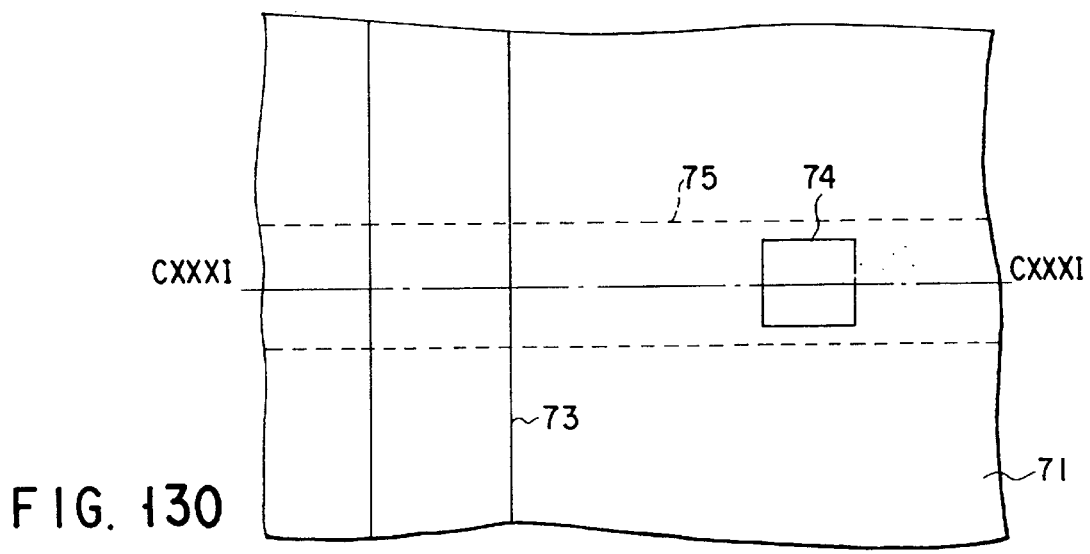
Figure 131:
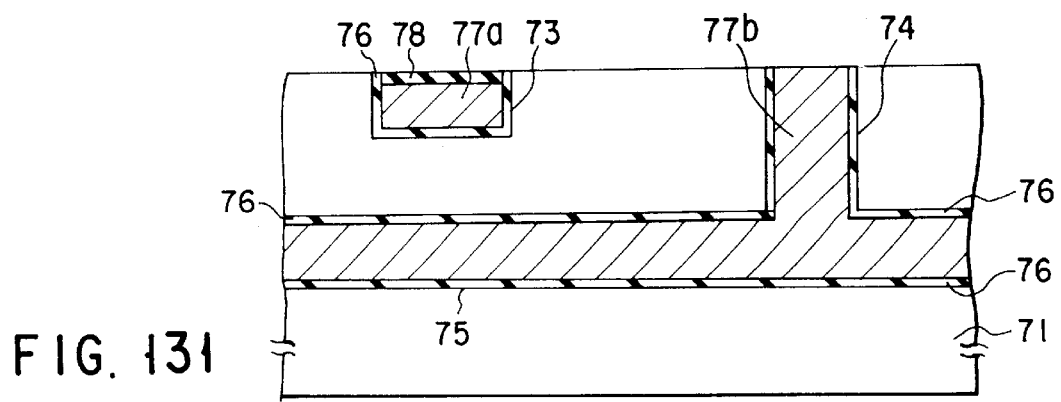
Figure 132:
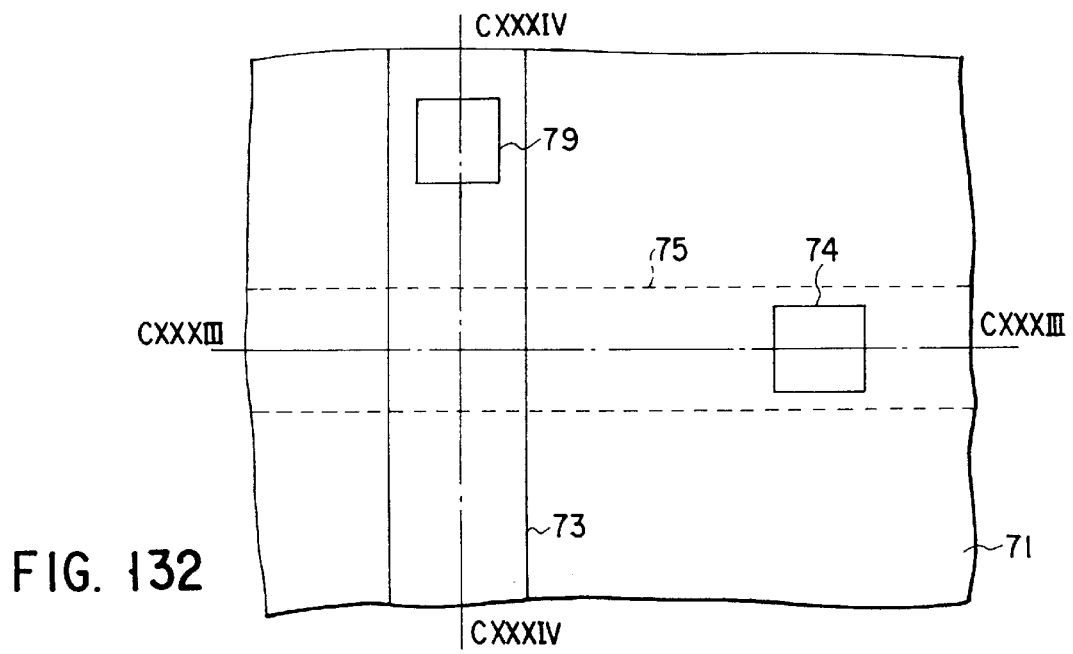
Figure 133:
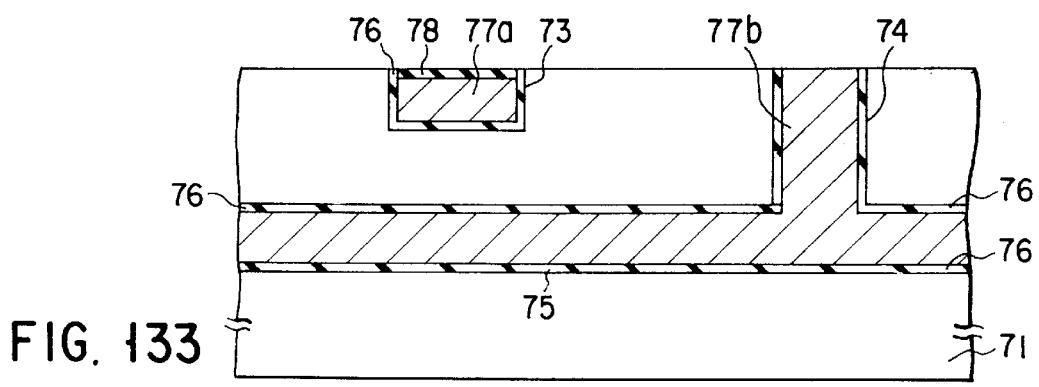
Figure 134:
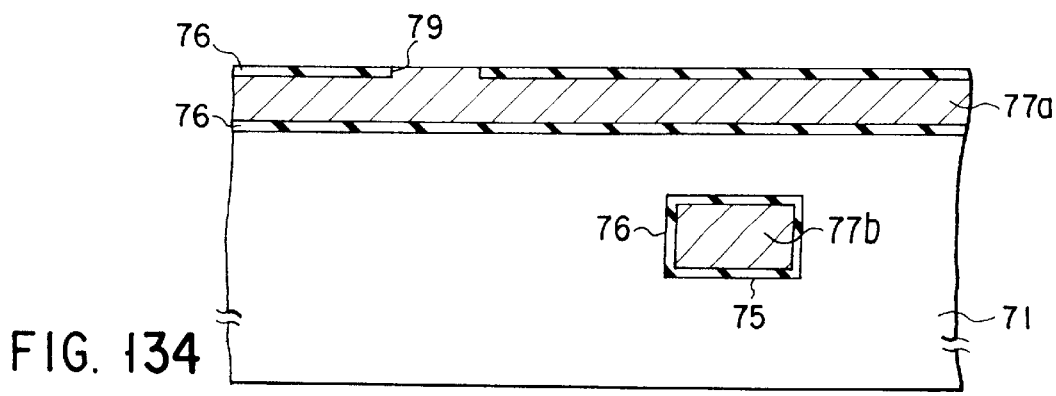
Figure 135:
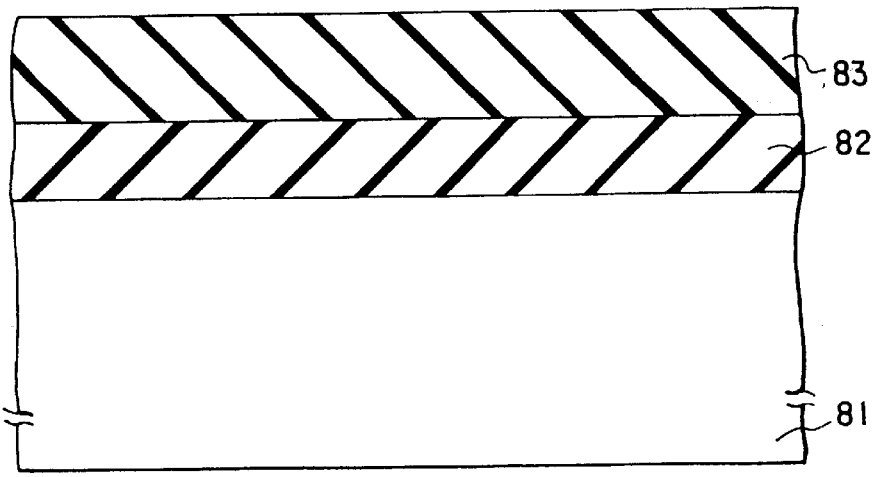
Figure 136:
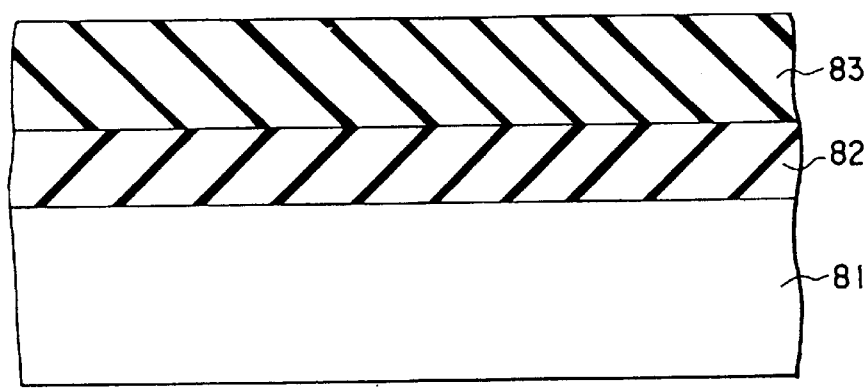
Figure 137:
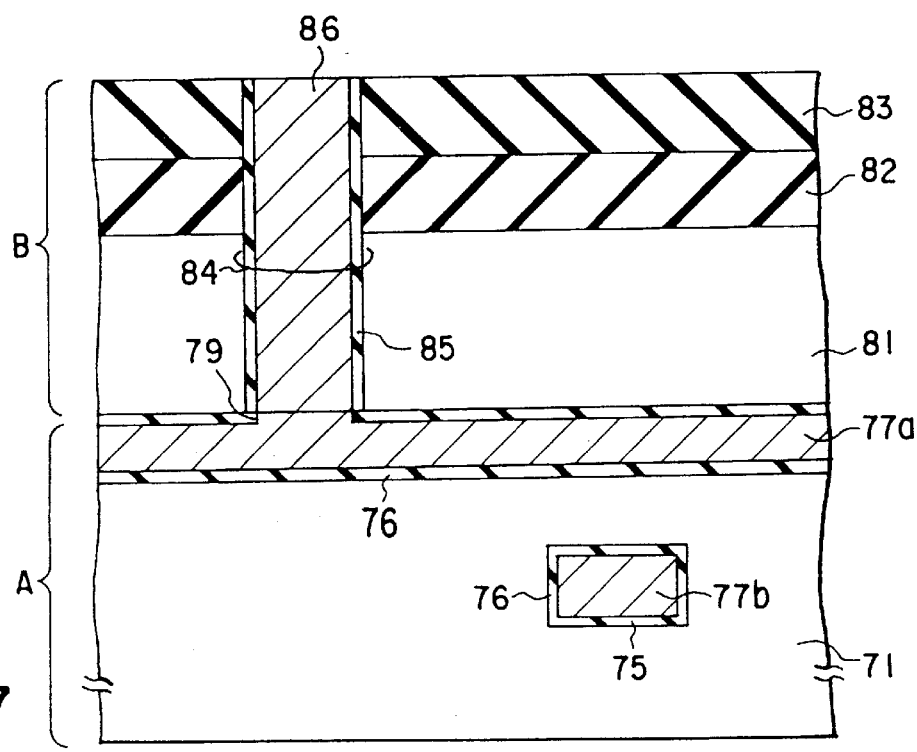

FIG. 130 is a plan view showing still another step of the method of manufacturing the semiconductor device according to the thirteenth embodiment of the present invention;

FIG. 131 is a sectional view taken along a line CXXXI—CXXXI in FIG. 130;

FIG. 132 is a plan view showing still another step of the method of manufacturing the semiconductor device according to the thirteenth embodiment of the present invention;

FIG. 133 is a sectional view taken along a line CXXXIII—CXXXIII in FIG. 132;

FIG. 134 is a sectional view taken along a line CXXXIV—CXXXIV in FIG. 132;

FIG. 135 is a sectional view showing still another step of the method of manufacturing the semiconductor device according to the thirteenth embodiment of the present invention;

FIG. 136 is a sectional view showing still another step of the method of manufacturing the semiconductor device according to the thirteenth embodiment of the present invention; and FIG. 137 is a sectional view showing still another step of the method of manufacturing the semiconductor device according to the thirteenth embodiment of the present invention.

DETAILED DESCRIPTION OF THE PREFERRED EMBODIMENTS

Semiconductor devices of the present invention and methods of manufacturing the same will be described in detail below with reference to the accompanying drawings.

[A] A semiconductor device according to the first embodiment of the present invention will be described in detail first.

Figure 26:
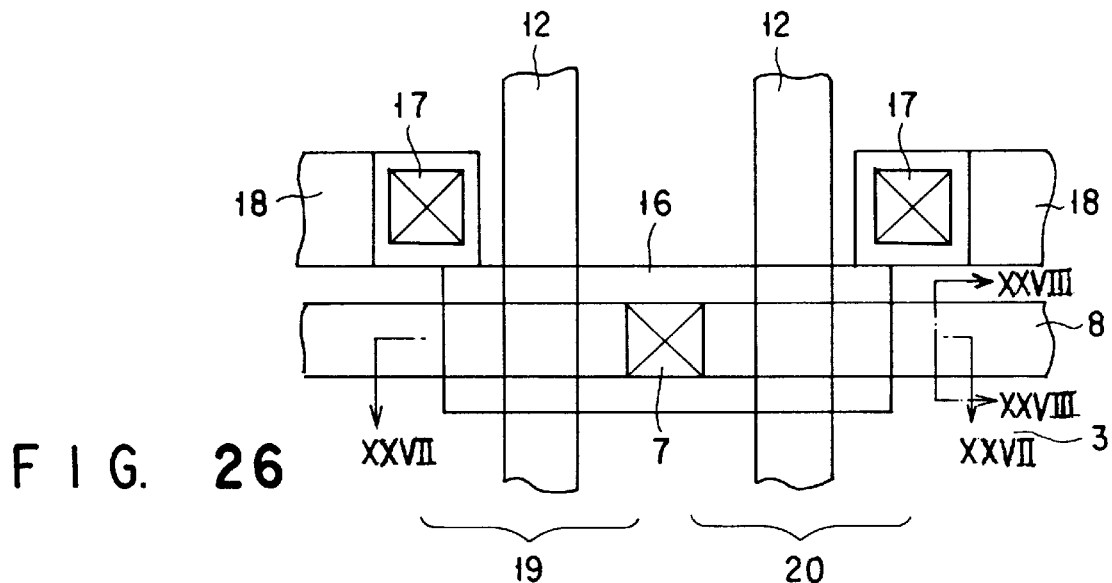
FIG. 26 is a sectional view showing a plan view showing a semiconductor device according to the first embodiment of the present invention.
Figure 27:
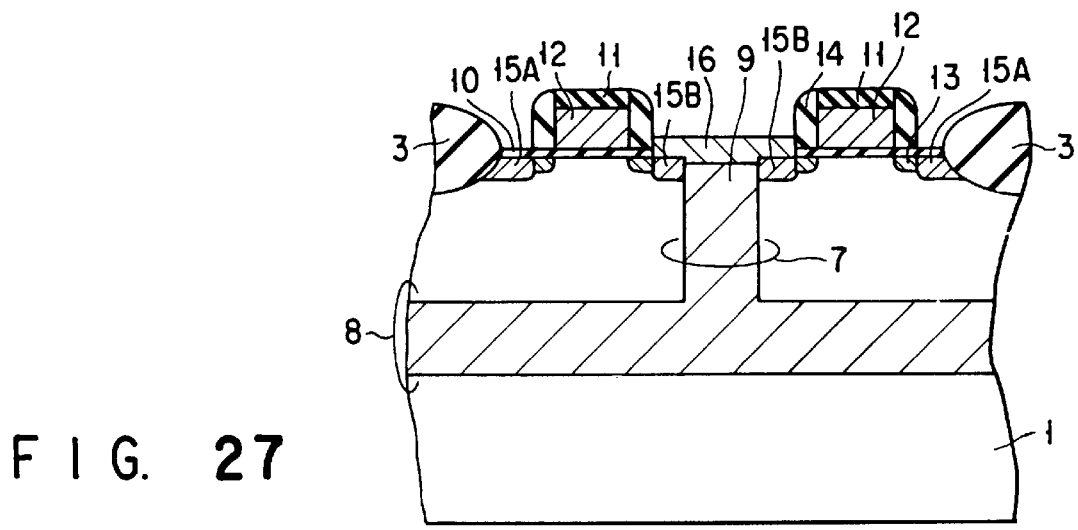
FIG. 27 is a sectional view taken along a line XXVII—XXVII in FIG. 26.
Figure 28:
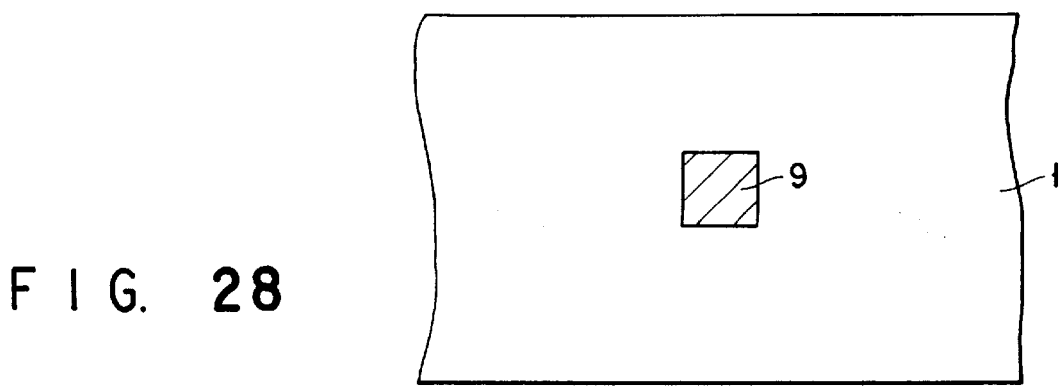
FIG. 28 is a sectional view taken along a line XXVII-I—XXVII in FIG. 26.

FIG. 26 shows the semiconductor device of the first embodiment. FIG. 27 is a sectional view taken along a line XXVII—XXVII in FIG. 26. FIG. 28 is a sectional view taken along a line XXVIII—XXVIII in FIG. 26.

Referring to FIGS. 26 to 28, reference numeral 1 denotes a silicon substrate; 3, a field oxide film; 7, a contact hole; 8, a tunnel; 9, a wiring layer buried in the contact hole 7 and the tunnel 8; 10, a gate oxide film; 11, a silicon nitride film; 12, a gate electrode; 13, an $n^-$-type diffusion layer; 14, a spacer; 15, an $n^+$-type diffusion layer; 16, a conductive layer; 17, a contact hole; 18, a metal wiring pattern; and 19 and 20, transistors.

The transistors (MOSFETs) 19 and 20 are formed on the silicon substrate 1. One $n^+$-type diffusion layer 15 of each of the transistors 19 and 20 is connected to the metal wiring pattern 18 via the contact hole 17.

The tunnel 8 extending in direction parallel to the substrate surface is formed in the silicon substrate 1. The contact hole 7 is formed to extend from a portion adjacent to the other $n^+$-type diffusion layer 15 of each of the transistors 19 and 20 so as to reach the tunnel 8. A conductive material is buried in the contact hole 7 and the tunnel 8. The wiring layer 9 is made of this conductive material.

The wiring layer 9 is electrically connected to the other $n^+$-type diffusion layer 15 via the conductive layer 16.

The tunnel 8 generally has a rectangular cross-section. However, the shape of the cross-section is not limited to this. The contact hole 7 may be rectangular, circular, or the like in cross-section.

According to this arrangement, since wiring patterns can be buried in the silicon substrate 1, the number of wiring patterns to be formed on the silicon substrate 1 can be reduced. In addition, a device of a high integration density can be realized by simple manufacturing steps, as will be described in the following embodiments. Furthermore, since wiring layers can be formed right under transistors, the integration density of a device can be satisfactorily increased.

Note that if the tunnel 8 is formed to be perpendicular to the direction of thickness of the silicon substrate 1, a more effective structure can be obtained.

[B] FIG. 29 shows a semiconductor device according to the second embodiment of the present invention. FIG. 30 is a sectional view taken along a line XXX—XXX in FIG. 29. FIG. 31 is a sectional view taken along a line XXXI—XXXI in FIG. 29.

The second embodiment is different from the first embodiment in that silicon oxide films 5 are formed on the inner surfaces of a contact hole 7 and a tunnel 8. The arrangement of the second embodiment is the same as that of the first embodiment in other points.

Transistors (MOSFETs) 19 and 20 are formed on a silicon substrate 1. One $n^+$-type diffusion layer 15 of each of the transistors 19 and 20 is connected to a metal wiring pattern 18 via a contact hole 17.

The tunnel 8 extending in direction parallel to the substrate surface is formed in the silicon substrate 1. The contact hole 7 is formed to extend from a portion adjacent to the other $n^+$-type diffusion layer 15 of each of the transistors 19 and 20 so as to reach the tunnel 8. The silicon oxide films 5 are formed on the inner surfaces of the contact hole 7 and the tunnel 8. A conductive material is buried in the contact hole 7 and the tunnel 8. A wiring layer 9 is made of this conductive material.

The wiring layer 9 is electrically connected to the other $n^+$-type diffusion layer 15 via the conductive layer 16.

The tunnel 8 generally has a rectangular cross-section. However, the shape of the cross-section is not limited to this. The contact hole 7 may be rectangular, circular, or the like in cross-section.

According to this arrangement, since wiring patterns can be buried in the silicon substrate 1, the number of wiring patterns to be formed on the silicon substrate 1 can be reduced. In addition, a device of a high integration density can be realized by simple manufacturing steps, as will be described in the following embodiments. Furthermore, since wiring layers can be formed right under transistors, the integration density of a device can be satisfactorily increased.

In addition, since the silicon oxide film 5 is formed between the silicon substrate 1 and the wiring layer 9, sufficient insulation can be ensured between the silicon substrate 1 and the wiring layer 9. Furthermore, the number of types of conductive materials which can be used for the wiring layer 9 increases.

Note that if the tunnel 8 is formed to be perpendicular to the direction of thickness of the silicon substrate 1, a more effective structure can be obtained.

[C] A method of manufacturing a semiconductor device according to the third embodiment of the present invention will be described in detail next. This embodiment exemplifies the method of manufacturing the semiconductor device according to the first embodiment.

FIGS. 32 to 38 show the method of manufacturing the semiconductor device according to the third embodiment of the present invention.

First of all, as shown in FIG. 32, a photoresist is coated on a p-type silicon substrate 1. The photoresist is then patterned. For example, oxygen is implanted in the silicon substrate 1 by using the photoresist as a mask. As a result, an oxygen-implanted layer 2 is formed in the silicon substrate 1 at a predetermined depth.

As shown in FIG. 33, a field oxide film 3 is formed on the silicon substrate 1 by a known method. At this time, in the oxygen-implanted layer 2 in the silicon substrate 1, oxygen (O) is combined with silicon (Si) to form an $SiO_2$ layer 4.

As shown in FIG. 34, a silicon oxide film 5 is formed on a surface (element region) of the silicon substrate 1 by thermal oxidation. Subsequently, a photoresist 6 is coated on the entire surface of the resultant structure. The photoresist 6 is then patterned. A contact hole 7 is formed at a predetermined position by a dry etching method using the photoresist 6 as a mask so as to extend from the surface of the silicon substrate 1 to the $SiO_2$ layer 4. Furthermore, the $SiO_2$ layer 4 is selectively removed by wet etching to form a tunnel 8.

As shown in FIG. 35, the photoresist 6 is removed. Thereafter, a conductive film, e.g., an arsenic-doped polysilicon film, is formed to completely fill the contact hole 7 and the tunnel 8. The polysilicon film is etched back by dry etching to be left in only the contact hole 7 and the tunnel 8, thus forming a wiring layer 9.

As shown in FIG. 36, the silicon oxide film 5 is removed by, e.g., wet etching. A gate oxide film 10 is formed on the exposed portions of the silicon substrate 1 and the wiring layer 9 by thermal oxidation. Thereafter, for example, a phosphorous-doped polysilicon film and a silicon nitride film 11 are formed. In addition, the silicon nitride film 11 and the polysilicon film are etched by using a photoresist (not shown) as a mask to form a gate electrode 12.

An n-type impurity, e.g., arsenic, is ion-implanted in the silicon substrate 1 by using the field oxide film 3, the photoresist, the silicon nitride film 11, and the gate electrode 12 as masks. After this process, the photoresist is removed, and the resultant structure is annealed in a nitrogen atmosphere, thus forming an $n^-$-type diffusion layer 13.

Figure 37:
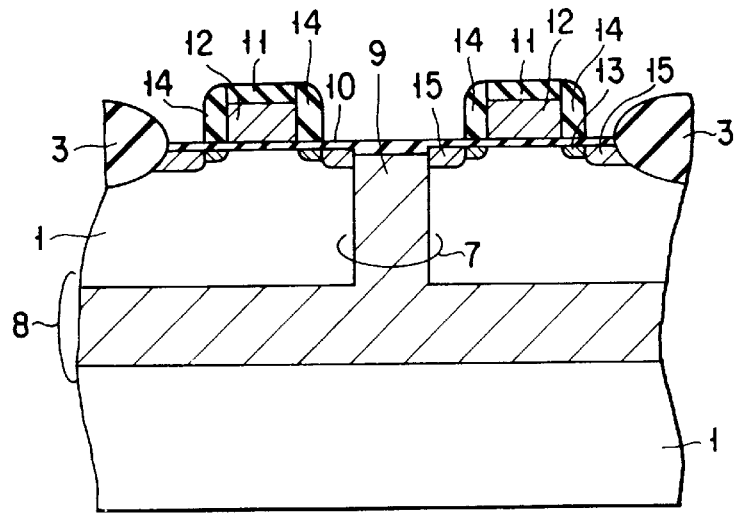
FIG. 37 is a sectional view showing still another step of the method of manufacturing the semiconductor device according to the third embodiment of the present invention.

As shown in FIG. 37, a silicon nitride film is formed on the entire surface of the resultant structure. The silicon nitride film is then etched by dry etching. As a result, the silicon nitride film is left on only the side walls of the silicon nitride film 11 and the gate electrode 12, thus forming spacers 14 for LDD transistors. Subsequently, an n-type impurity, e.g., arsenic, is ion-implanted in the resultant structure by using the field oxide film 3, the spacers 14, and the silicon nitride film 11 as masks. The resultant structure is annealed in a nitrogen atmosphere. As a result, an $n^+$-type diffusion layer 15 serving as the source or drain of a transistor is formed.

Figure 38:
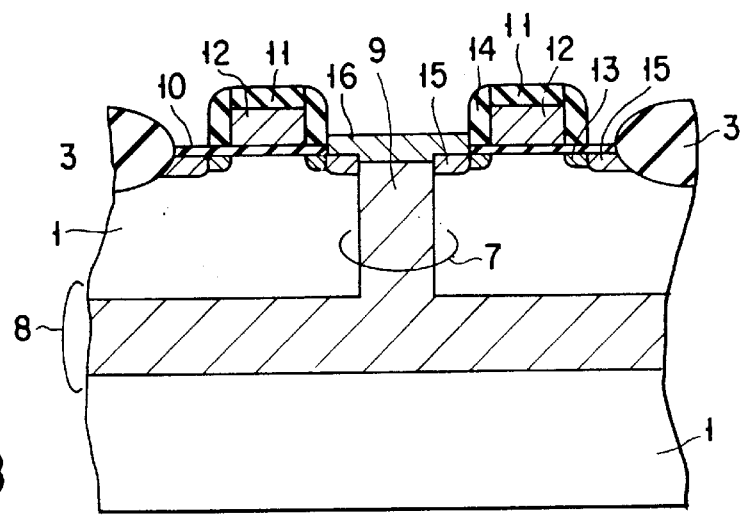
FIG. 38 is a sectional view showing still another step of the method of manufacturing the semiconductor device according to the third embodiment of the present invention.

As shown in FIG. 38, the gate oxide film 10 on the contact hole 7 is selectively removed by using a photoresist (not shown) as a mask. After the photoresist is removed, a conductive film, e.g., an arsenic-doped polysilicon film, is formed on the entire surface of the resultant structure. The polysilicon film is selectively etched by using a photoresist (not shown) as a mask to form a conductive layer 16 which electrically connects the $n^+$-type diffusion layer 15 of the transistor to the wiring layer 9. Thereafter, the photoresist is removed.

Figure 1:
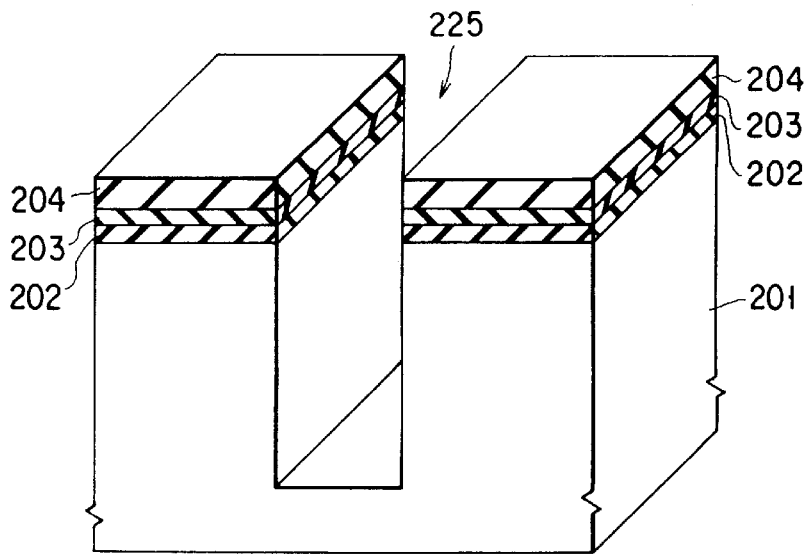
FIG. 1 is a perspective view showing a step of a method of manufacturing a conventional semiconductor device.
Figure 2:
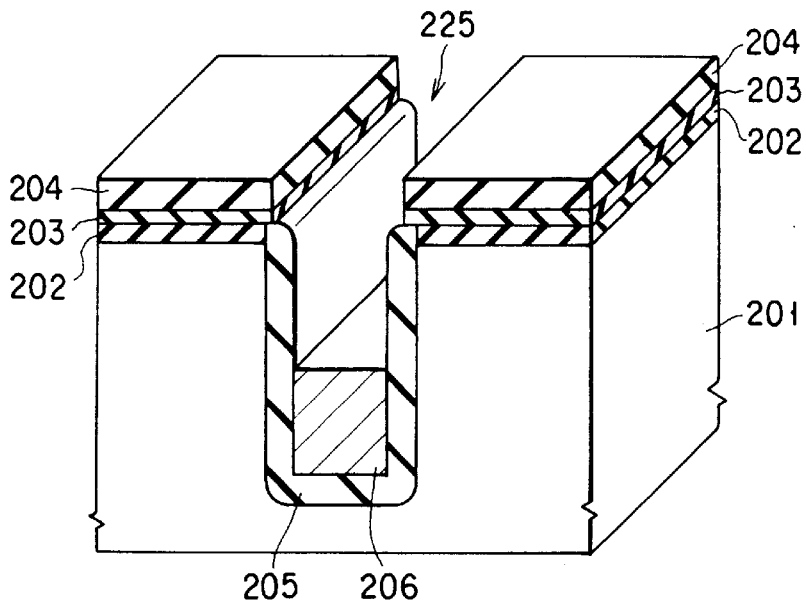
FIG. 2 is a perspective view showing another step of the method of manufacturing the conventional semiconductor device.
Figure 3:
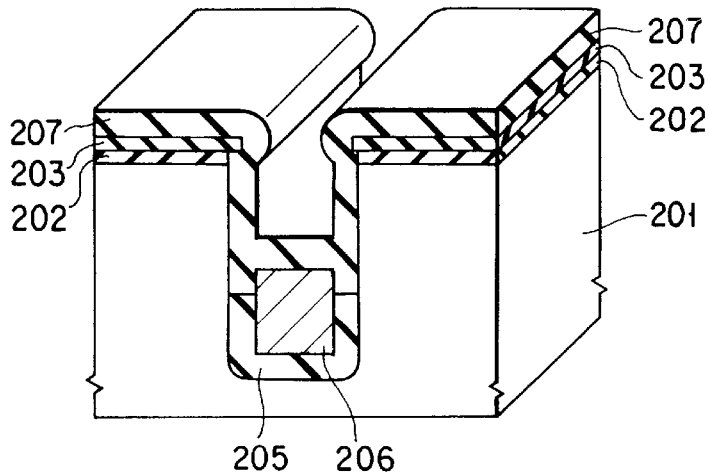
FIG. 3 is a perspective view showing still another step of the method of manufacturing the conventional semiconductor device.

Finally, although not shown, an insulating interlayer is formed by a known method; a contact hole is formed at a predetermined position, and a metal wiring pattern is formed. With this process, the semiconductor device shown in FIGS. 1 to 3 is completed.

According to the above manufacturing method, a wiring pattern can be buried in the silicon substrate 1 at a position right under a transistor by simple manufacturing steps. Therefore, the number of wiring patterns to be formed on the silicon substrate 1 can be reduced, and a device of a high integration density can be realized.

[D] A method of manufacturing a semiconductor device according to the fourth embodiment of the present invention will be described in detail below. This embodiment exemplifies the method of manufacturing the semiconductor device according to the second embodiment.

FIGS. 39 to 45 show the method of manufacturing the semiconductor device according to the fourth embodiment of the present invention.

Figure 39:
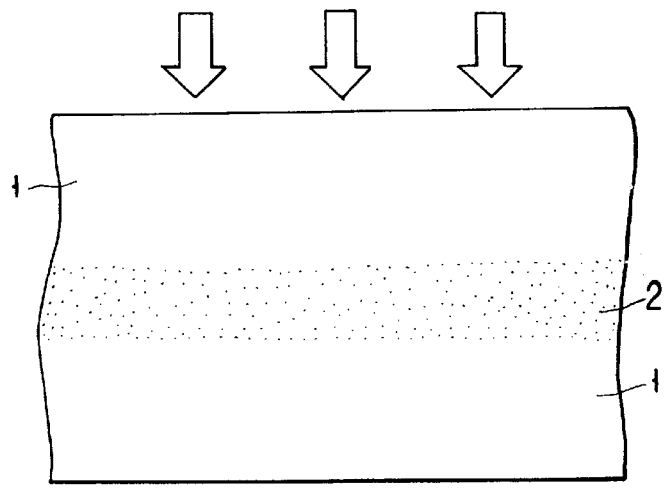
FIG. 39 is a sectional view showing a step of a method of manufacturing a semiconductor device according to the fourth embodiment of the present invention.

First, as shown in FIG. 39, a photoresist is coated on a p-type silicon substrate 1. The photoresist is then patterned. For example, oxygen is implanted in the silicon substrate 1 by using the photoresist as a mask. As a result, an oxygen-implanted layer 2 is formed in the silicon substrate 1 at a predetermined depth.

Figure 40:
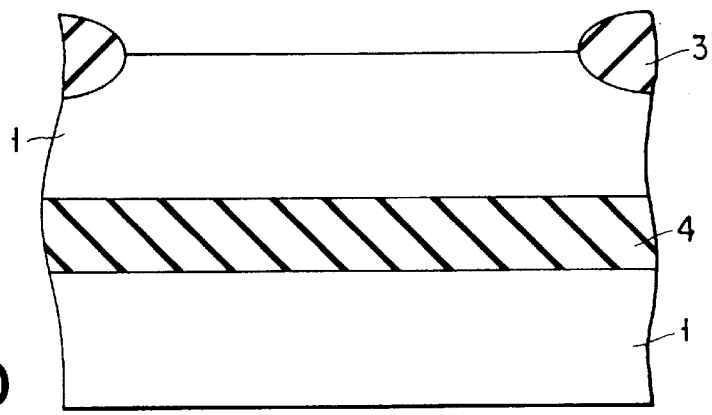
FIG. 40 is a sectional view showing another step of the method of manufacturing the semiconductor device according to the fourth embodiment of the present invention.

As shown in FIG. 40, a field oxide film 3 is formed on the silicon substrate 1 by a known method. At this time, in the oxygen-implanted layer 2 in the silicon substrate 1, oxygen (O) and silicon (Si) are combined with each other to form an $SiO_2$ layer 4.

Figure 41:
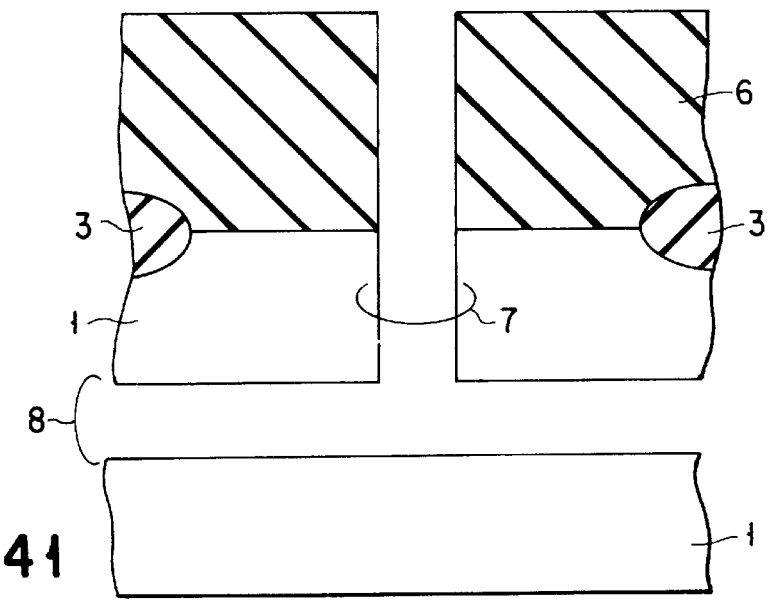
FIG. 41 is a sectional view showing still another step of the method of manufacturing the semiconductor device according to the fourth embodiment of the present invention.

As shown in FIG. 41, a photoresist 6 is coated on the entire surface of the resultant structure. The photoresist 6 is patterned. In addition, a contact hole 7 is formed at a predetermined position by the dry etching method using the photoresist 6 as a mask to extend from the surface of the silicon substrate 1 to the $SiO_2$ layer 4. The $SiO_2$ layer 4 is selectively removed by wet etching to form a tunnel 8.

Figure 42:
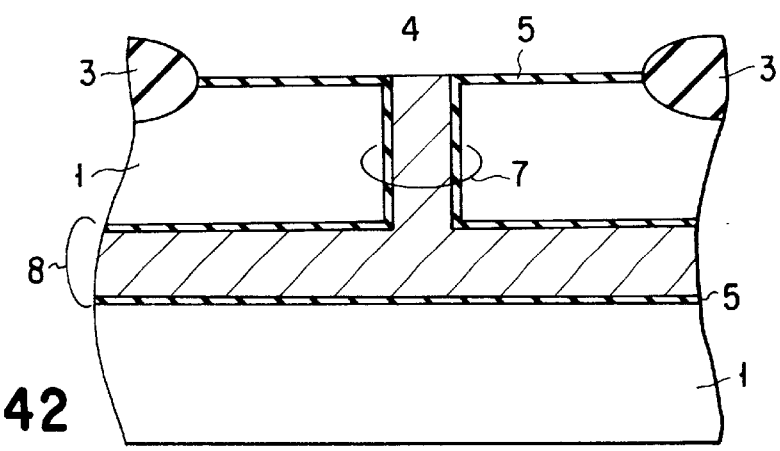
FIG. 42 is a sectional view showing still another step of the method of manufacturing the semiconductor device according to the fourth embodiment of the present invention.

As shown in FIG. 42, after the photoresist 6 is removed, silicon oxide films 5 are formed on the surface of the silicon substrate 1 and the inner surfaces of the contact hole 7 and the tunnel 8 by thermal oxidation. Subsequently, a conductive film, e.g., arsenic-doped polysilicon film, is formed to completely fill the contact hole 7 and the tunnel 8. The polysilicon film is etched back by dry etching to be left in only the contact hole 7 and the tunnel 8, thus forming a wiring layer 9.

Figure 43:
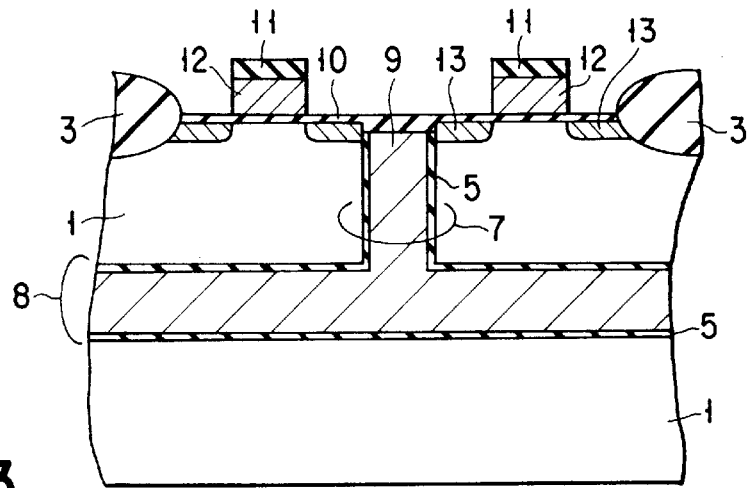
FIG. 43 is a sectional view showing still another step of the method of manufacturing the semiconductor device according to the fourth embodiment of the present invention.

As shown in FIG. 43, the silicon oxide film 5 is removed by, e.g., wet etching. A gate oxide film 10 is formed on the exposed portions of the silicon substrate 1 and the wiring layer 9 by thermal oxidation. Subsequently, a phosphorous-doped polysilicon film and a silicon nitride film 11 are formed. In addition, the silicon nitride film 11 and the polysilicon film are etched by using a photoresist (not shown) as a mask to form a gate electrode 12.

An n-type impurity, e.g., arsenic, is ion-implanted in the silicon substrate 1 by using the field oxide film 3, the photoresist, the silicon nitride film 11, and the gate electrode 12 as masks. After this process, the photoresist is removed, and the resultant structure is annealed in a nitrogen atmosphere, thus forming an $n^-$-type diffusion layer 13.

Figure 44:
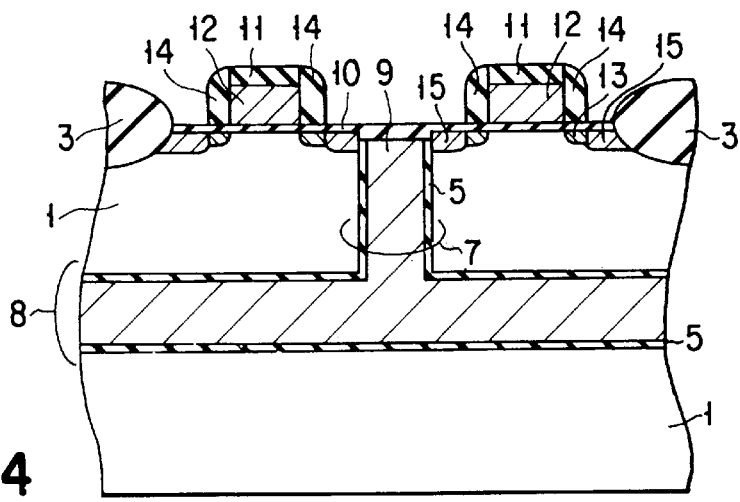
FIG. 44 is a sectional view showing still another step of the method of manufacturing the semiconductor device according to the fourth embodiment of the present invention.

As shown in FIG. 44, a silicon nitride film is formed on the entire surface of the resultant structure. The silicon nitride film is then etched by dry etching. As a result, the silicon nitride film is left on only the side walls of the silicon nitride film 11 and the gate electrode 12, thus forming spacers 14 for LDD transistors. Subsequently, an n-type impurity, e.g., arsenic, is ion-implanted in the resultant structure by using the field oxide film 3, the spacers 14, and the silicon nitride film 11 as masks. The resultant structure is annealed in a nitrogen atmosphere. As a result, an $n^+$-type diffusion layer 15 serving as the source or drain of a transistor is formed.

Figure 45:
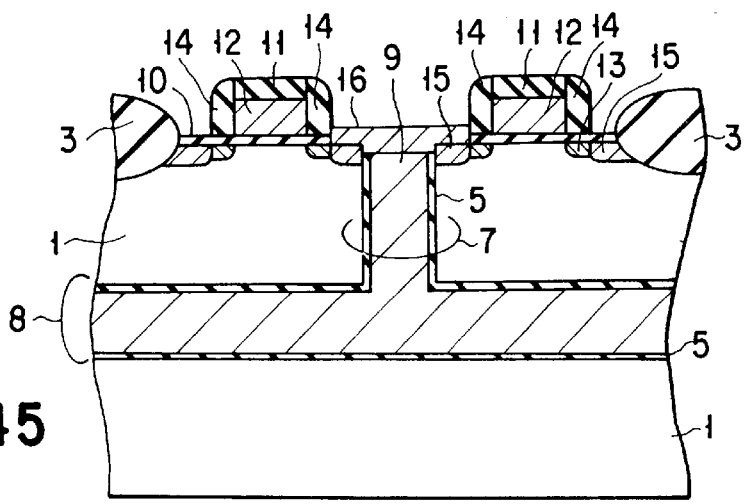
FIG. 45 is a sectional view showing still another step of the method of manufacturing the semiconductor device according to the fourth embodiment of the present invention.

As shown in FIG. 45, the gate oxide film 10 on the contact hole 7 is selectively removed by using a photoresist (not shown) as a mask. After the photoresist is removed, a conductive film, e.g., an arsenic-doped polysilicon film, is formed on the entire surface of the resultant structure. The polysilicon film is selectively etched by using a photoresist (not shown) as a mask to form a conductive layer 16 which electrically connects the $n^+$-type diffusion layer 15 of the transistor to the wiring layer 9. Thereafter, the photoresist is removed.

Figure 4:
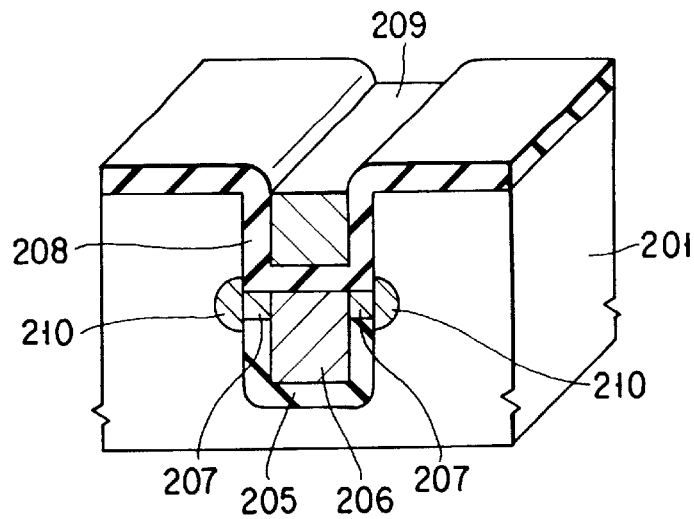
FIG. 4 is a perspective view showing still another step of the method of manufacturing the conventional semiconductor device.
Figure 5:
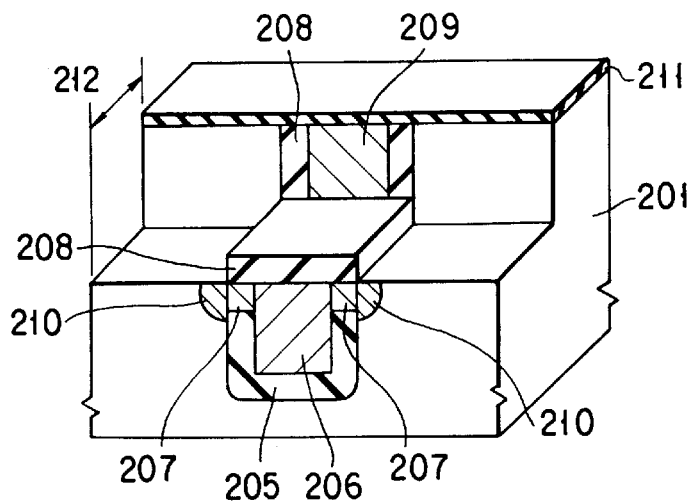
FIG. 5 is a perspective view showing still another step of the method of manufacturing the conventional semiconductor device.
Figure 6:
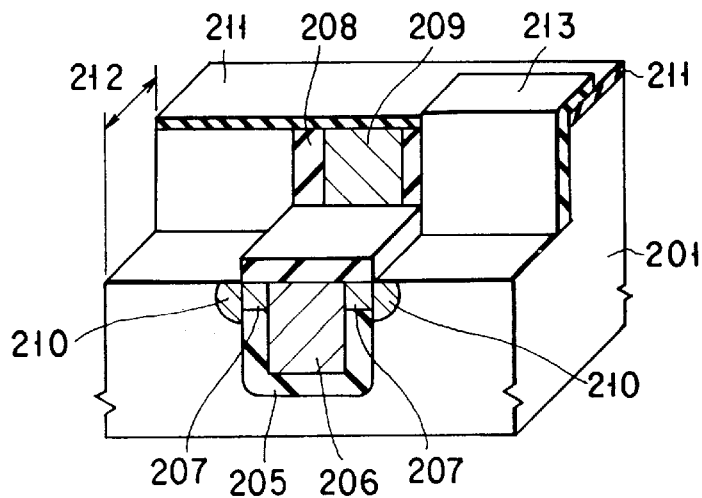
FIG. 6 is a perspective view showing still another step of the method of manufacturing the conventional semiconductor device.
Figure 7:
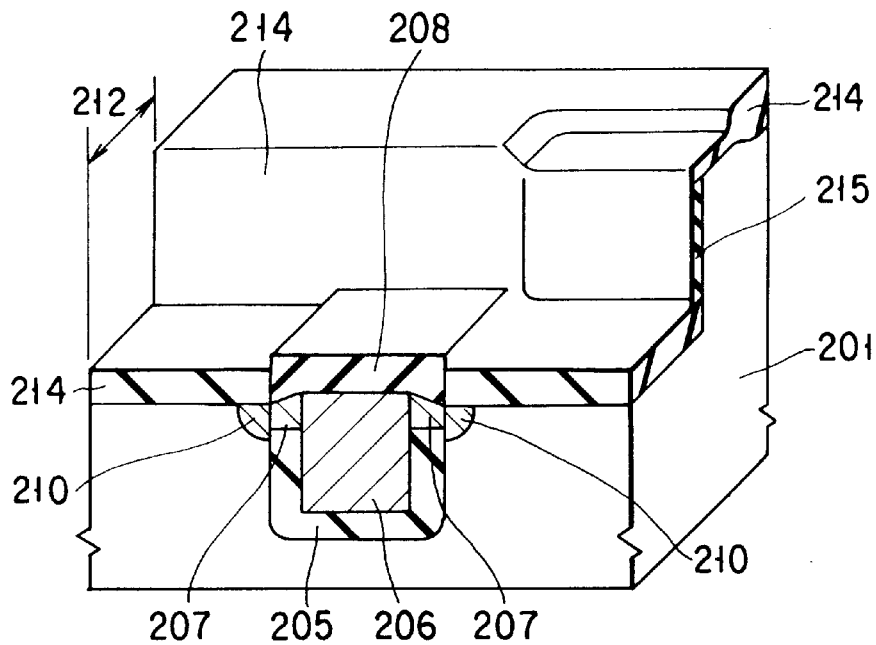
FIG. 7 is a perspective view showing still another step of the method of manufacturing the conventional semiconductor device.
Figure 8:
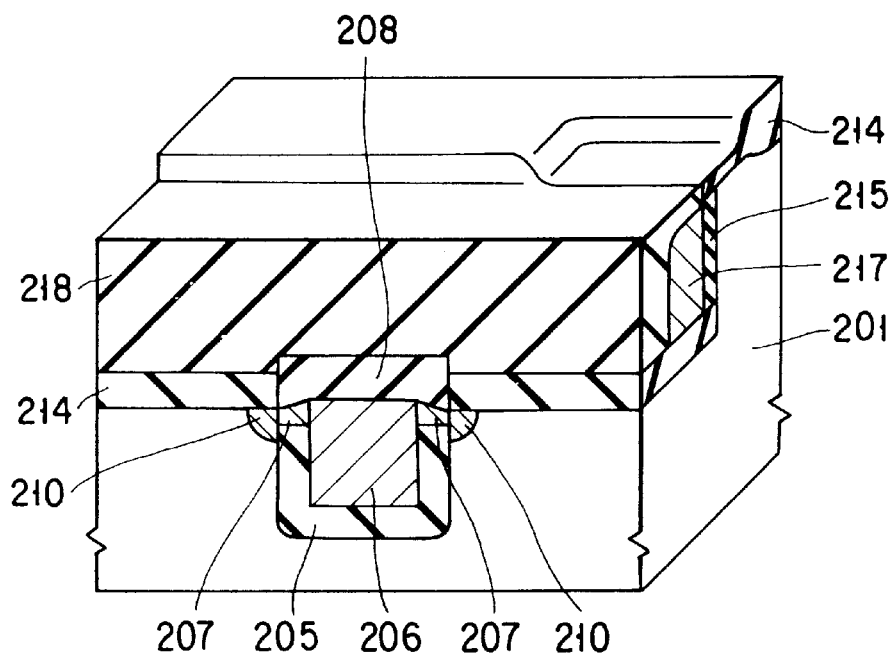
FIG. 8 is a perspective view showing still another step of the method of manufacturing the conventional semiconductor device.
Figure 9:
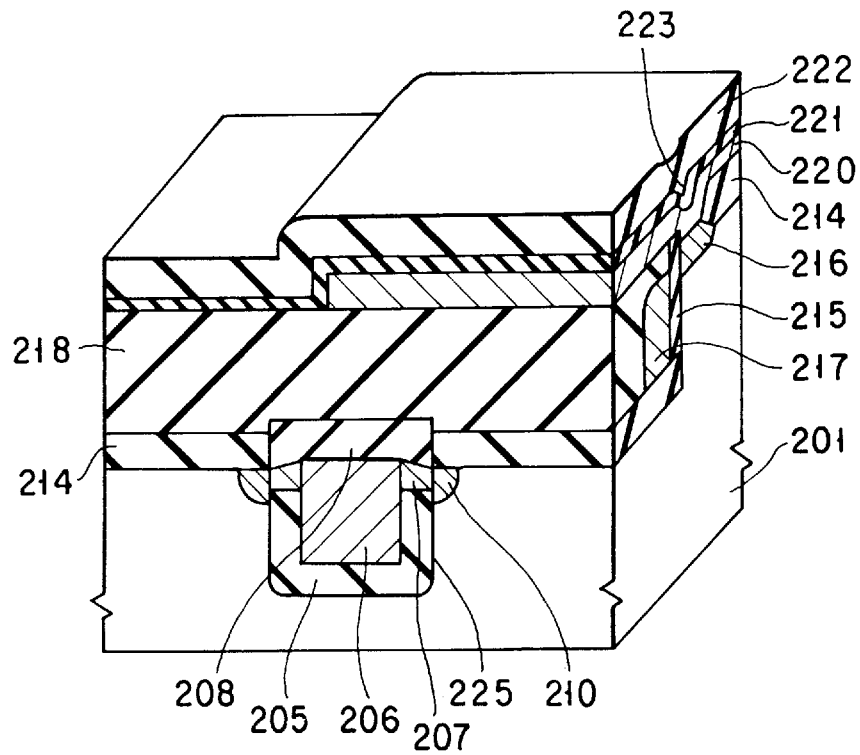
FIG. 9 is a perspective view showing still another step of the method of manufacturing the conventional semiconductor device.
Figure 9A:
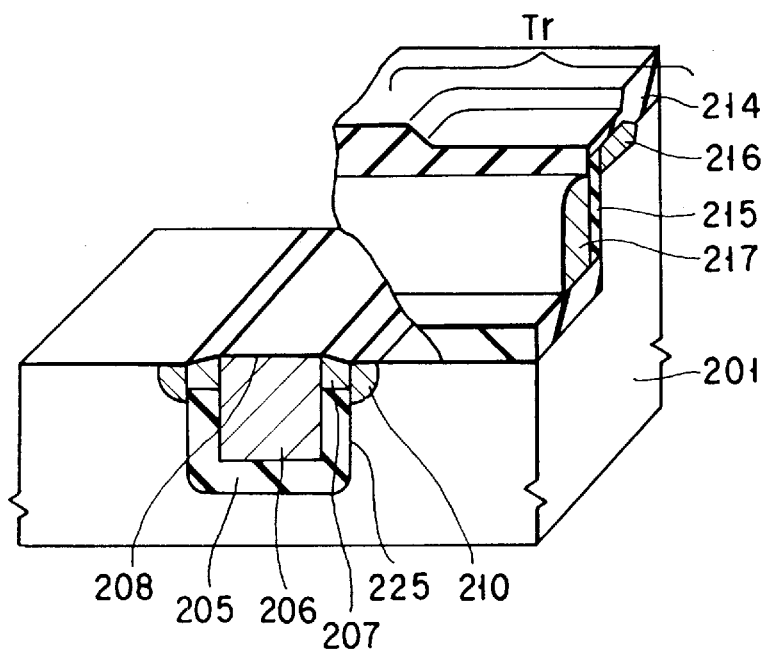
FIG. 9A is a perspective view showing the conventional semiconductor device.
Figure 10:
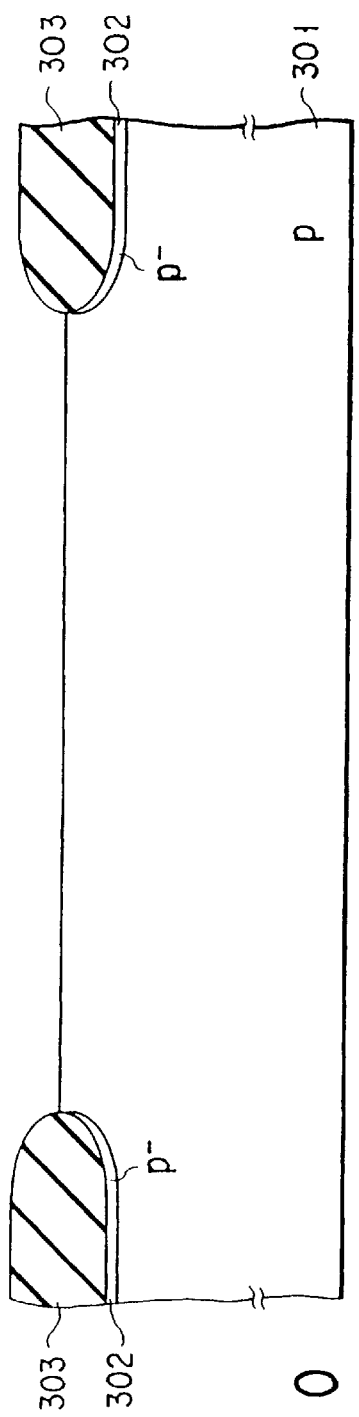
FIG. 10 is a sectional view showing a step of a method of manufacturing a conventional DRAM.
Figure 12:
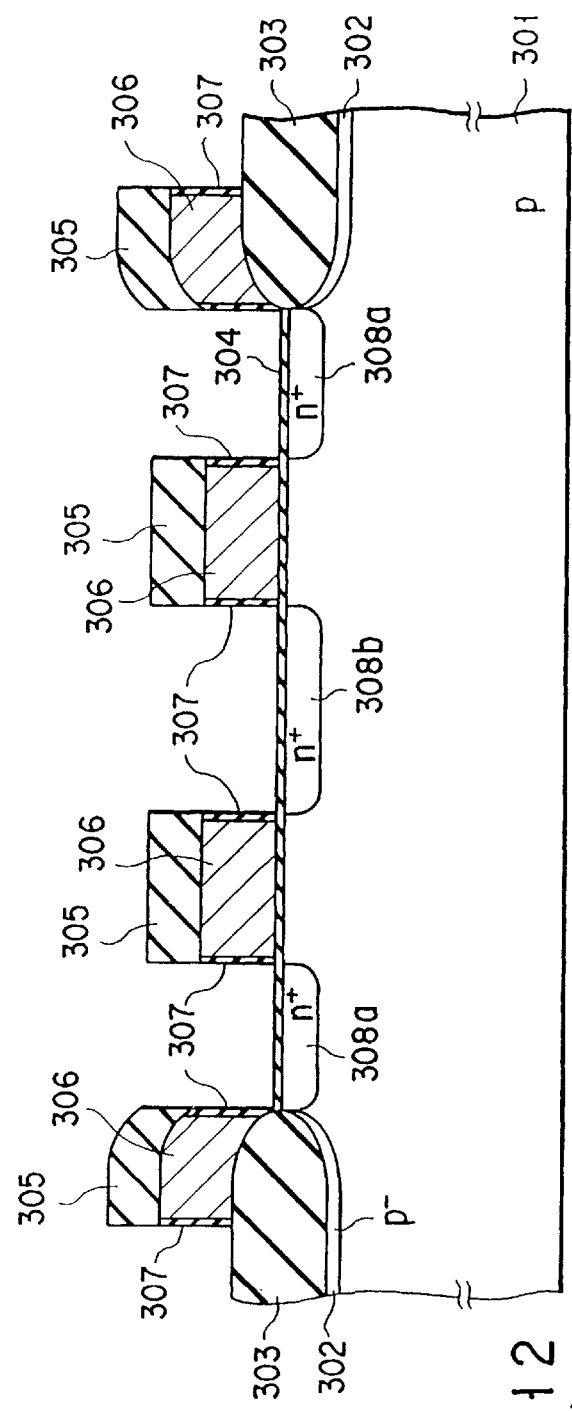
FIG. 12 is a sectional view taken along a line XII—XII in FIG. 11.
Figure 11:
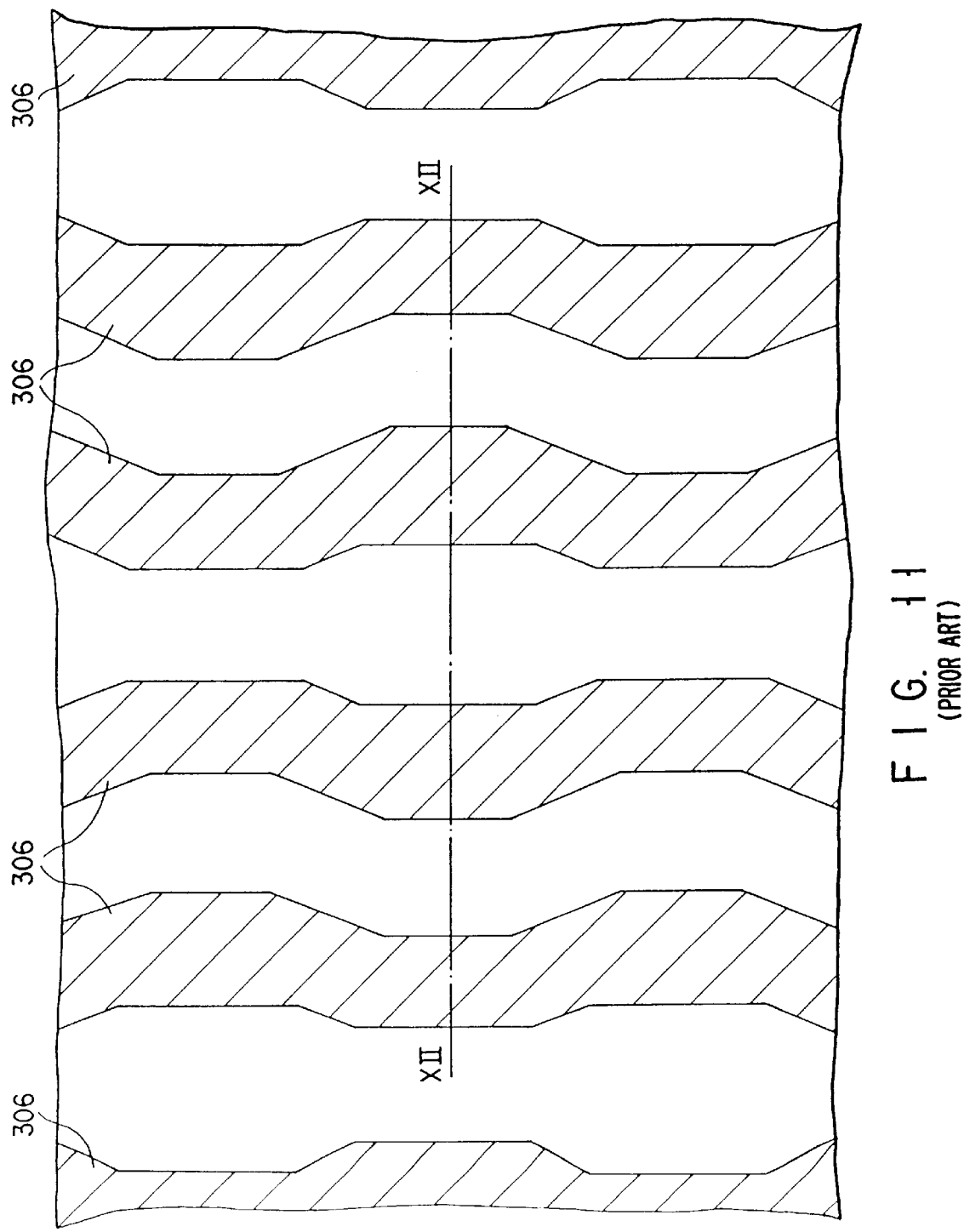
FIG. 11 is a plan view showing another step of the method of manufacturing the conventional DRAM.
Figure 13:
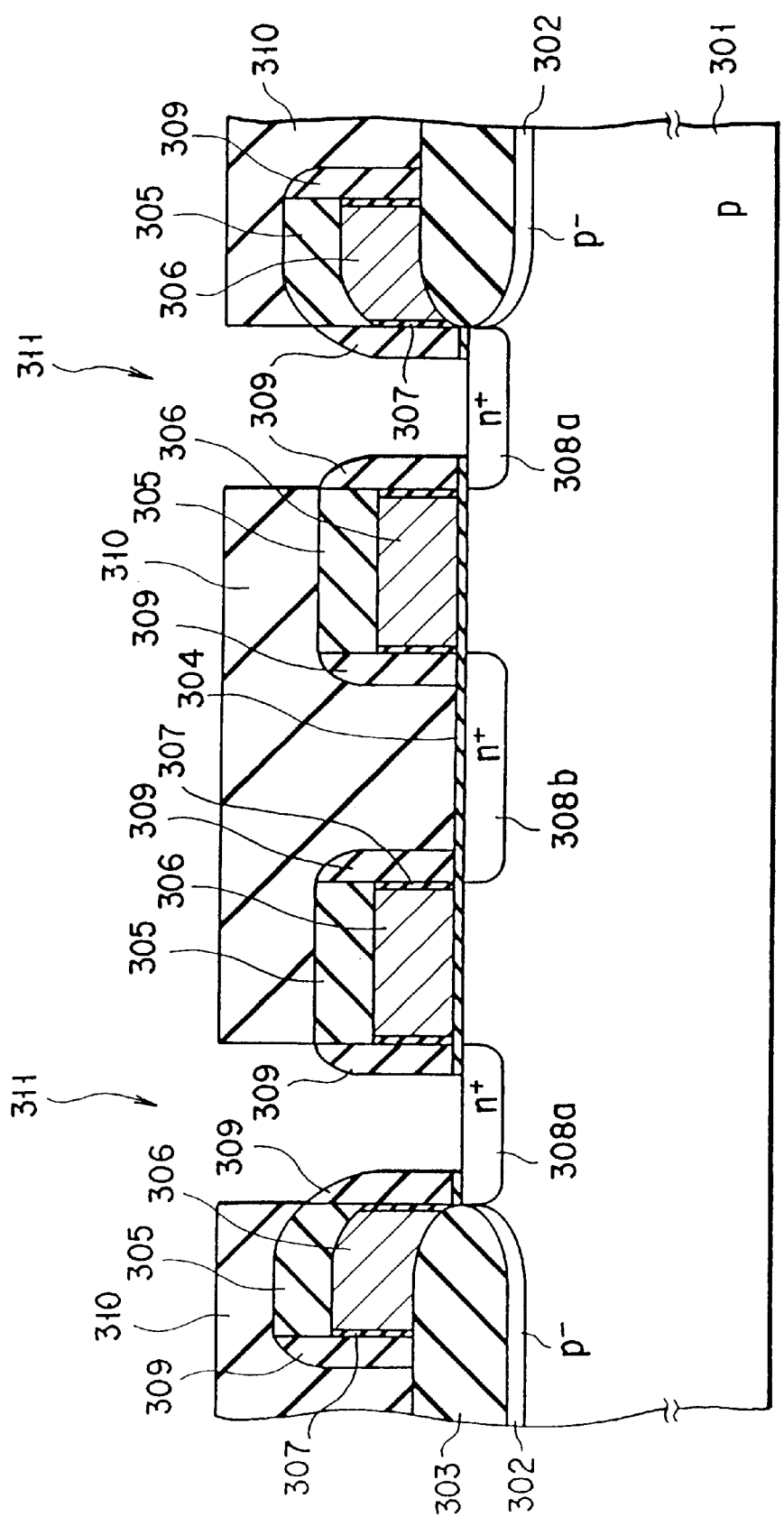
FIG. 13 is a sectional view showing still another step of the method of manufacturing the conventional DRAM.
Figure 14:
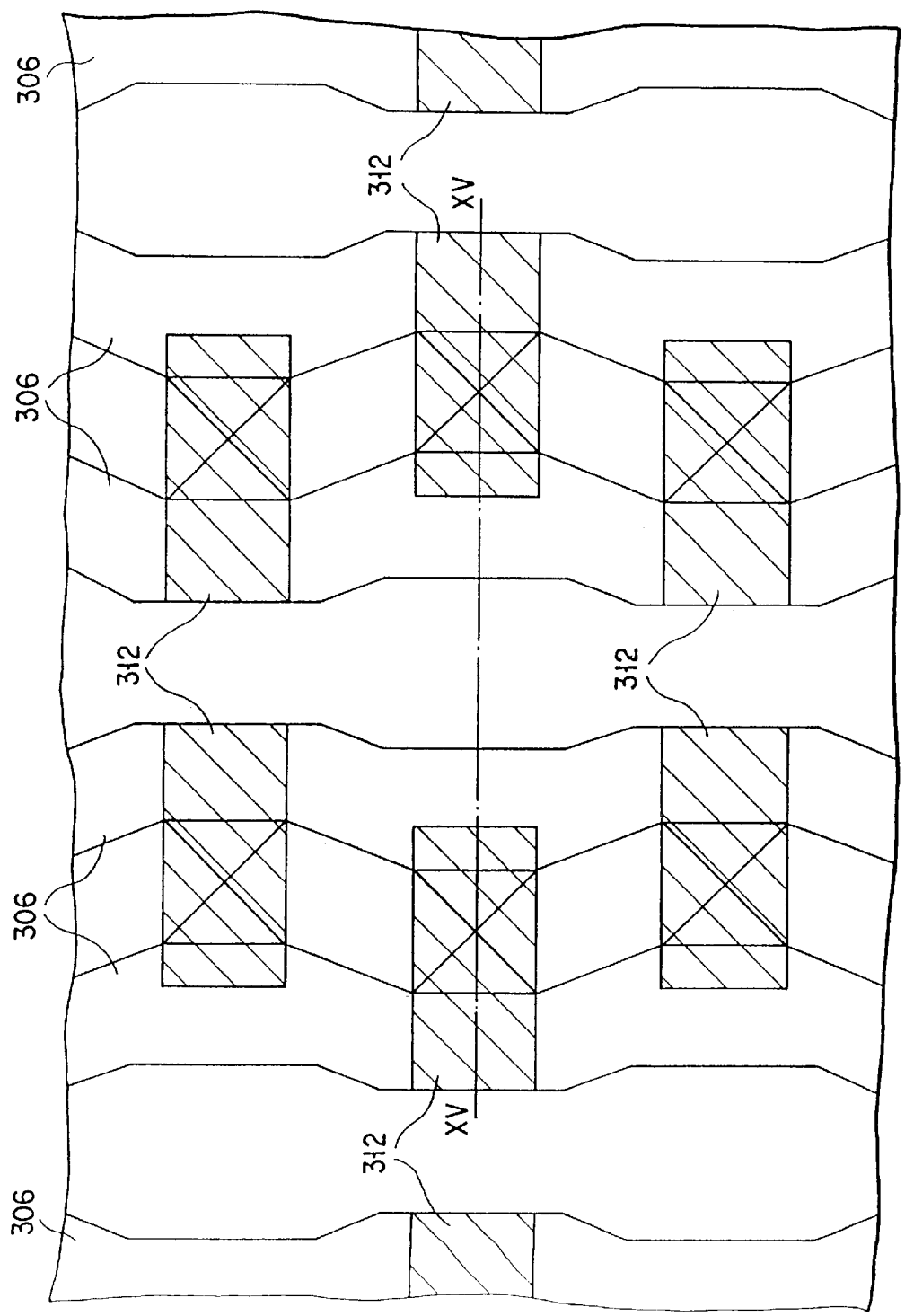
FIG. 14 is a plan view showing still another step of the method of manufacturing the conventional DRAM.
Figure 15:
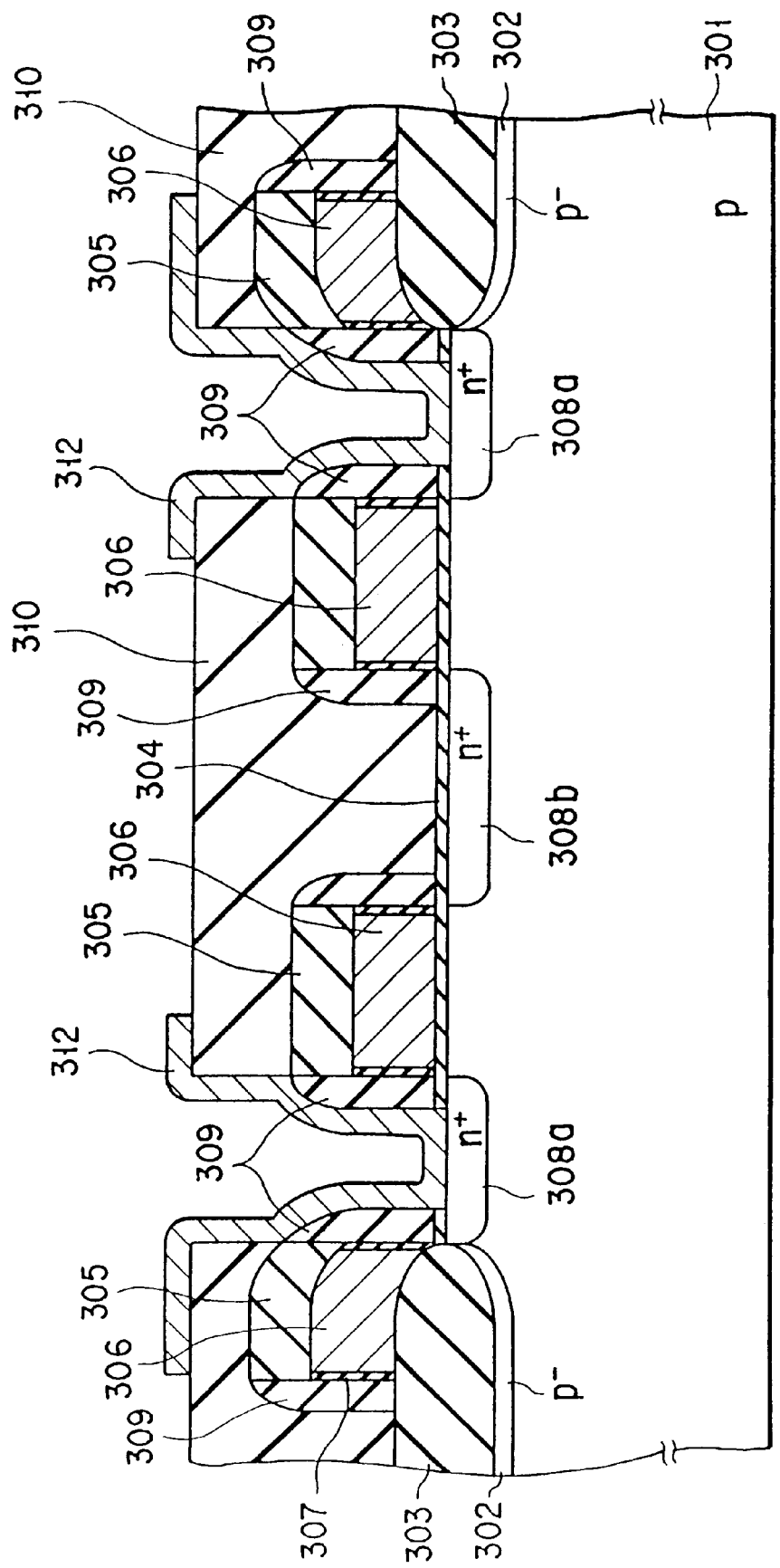
FIG. 15 is a sectional view of the conventional DRAM taken along a line XV—XV in FIG. 14.
Figure 16:
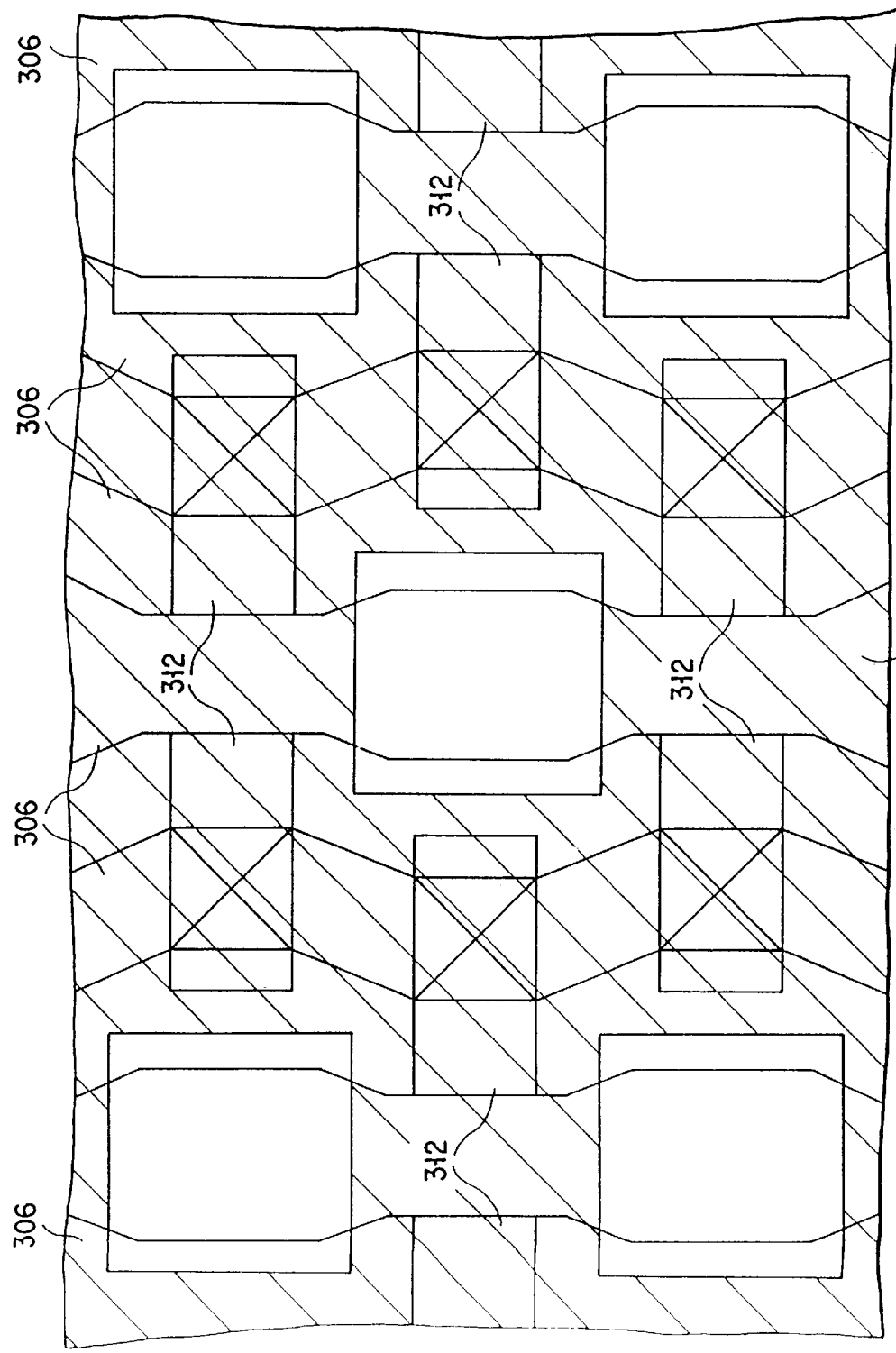
FIG. 16 is a plan view showing still another step of the method of manufacturing the conventional DRAM.
Figure 17:
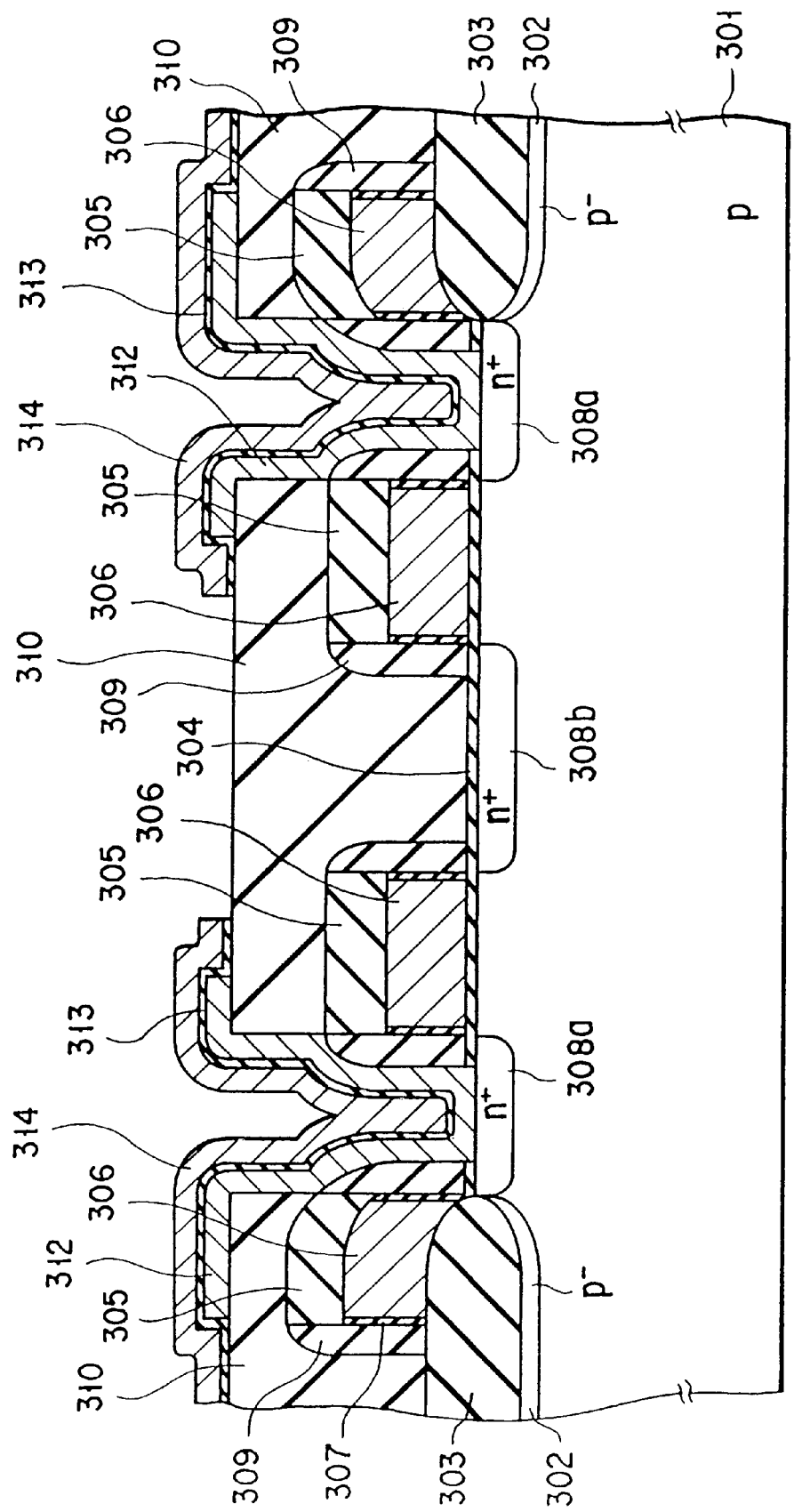
FIG. 17 is a sectional view of the conventional DRAM taken along a line XVII—XVII in FIG. 16.
Figure 18:
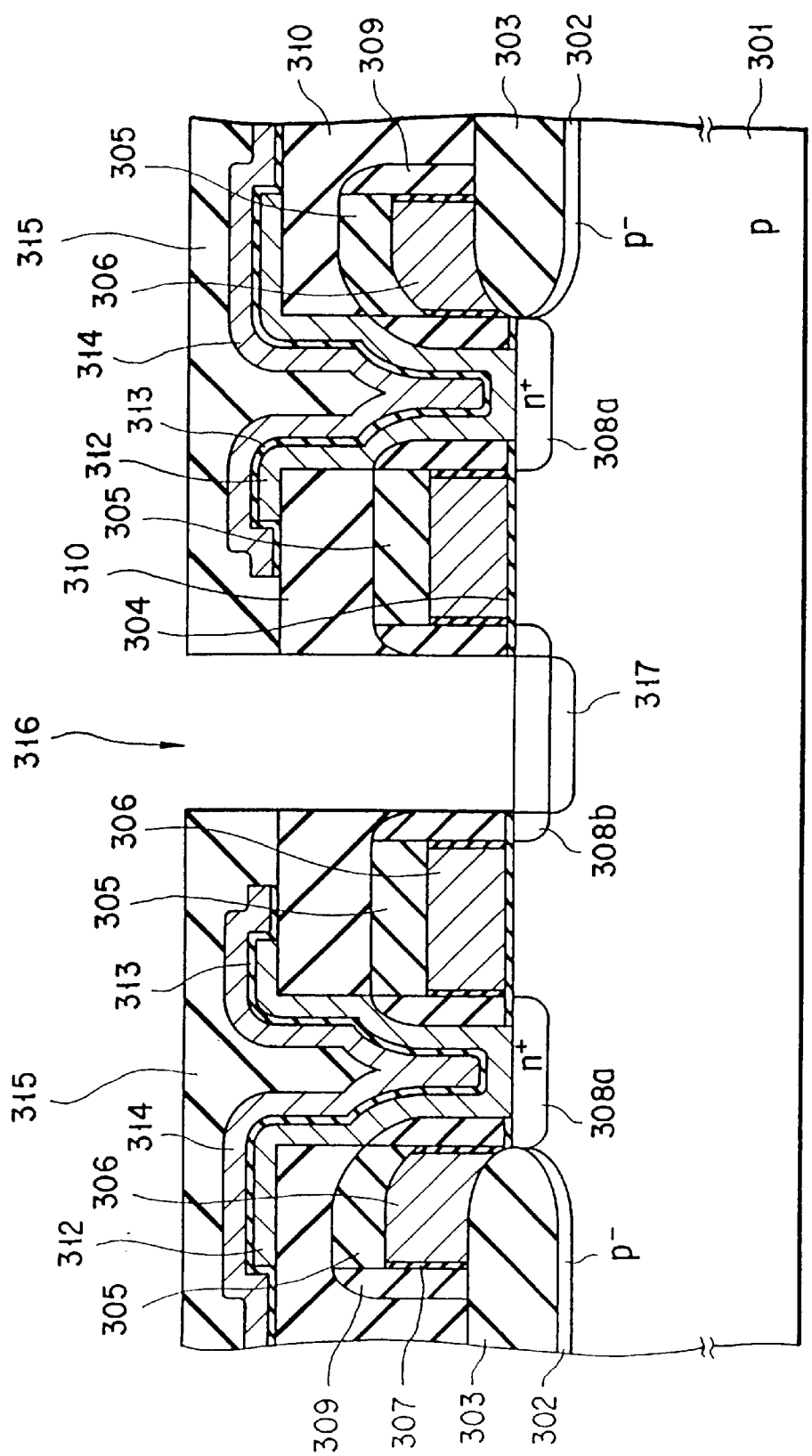
FIG. 18 is a sectional view showing still another step of the method of manufacturing the conventional DRAM.
Figure 19:
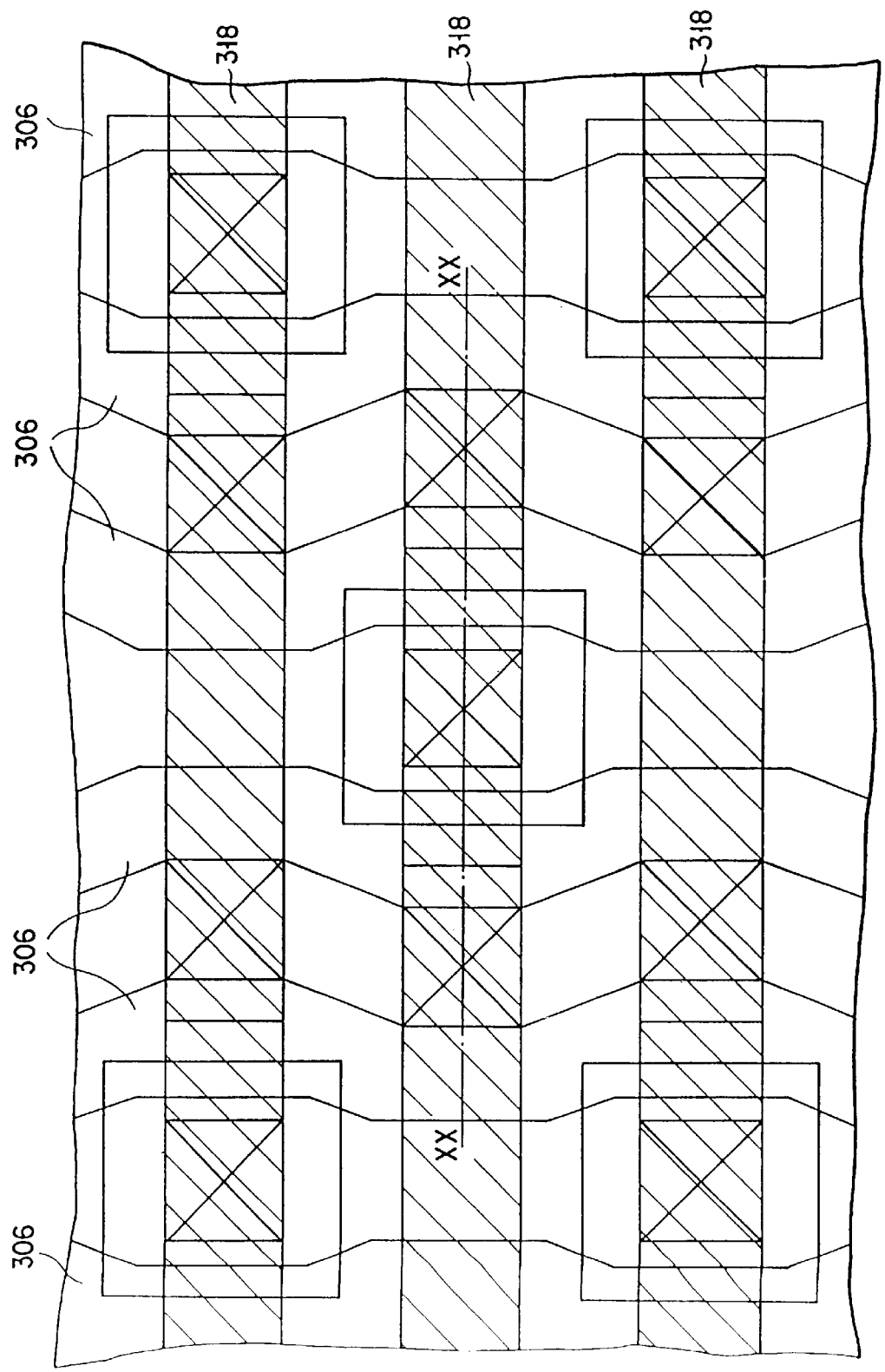
FIG. 19 is a plan view showing still another step of the method of manufacturing the conventional DRAM.
Figure 20:
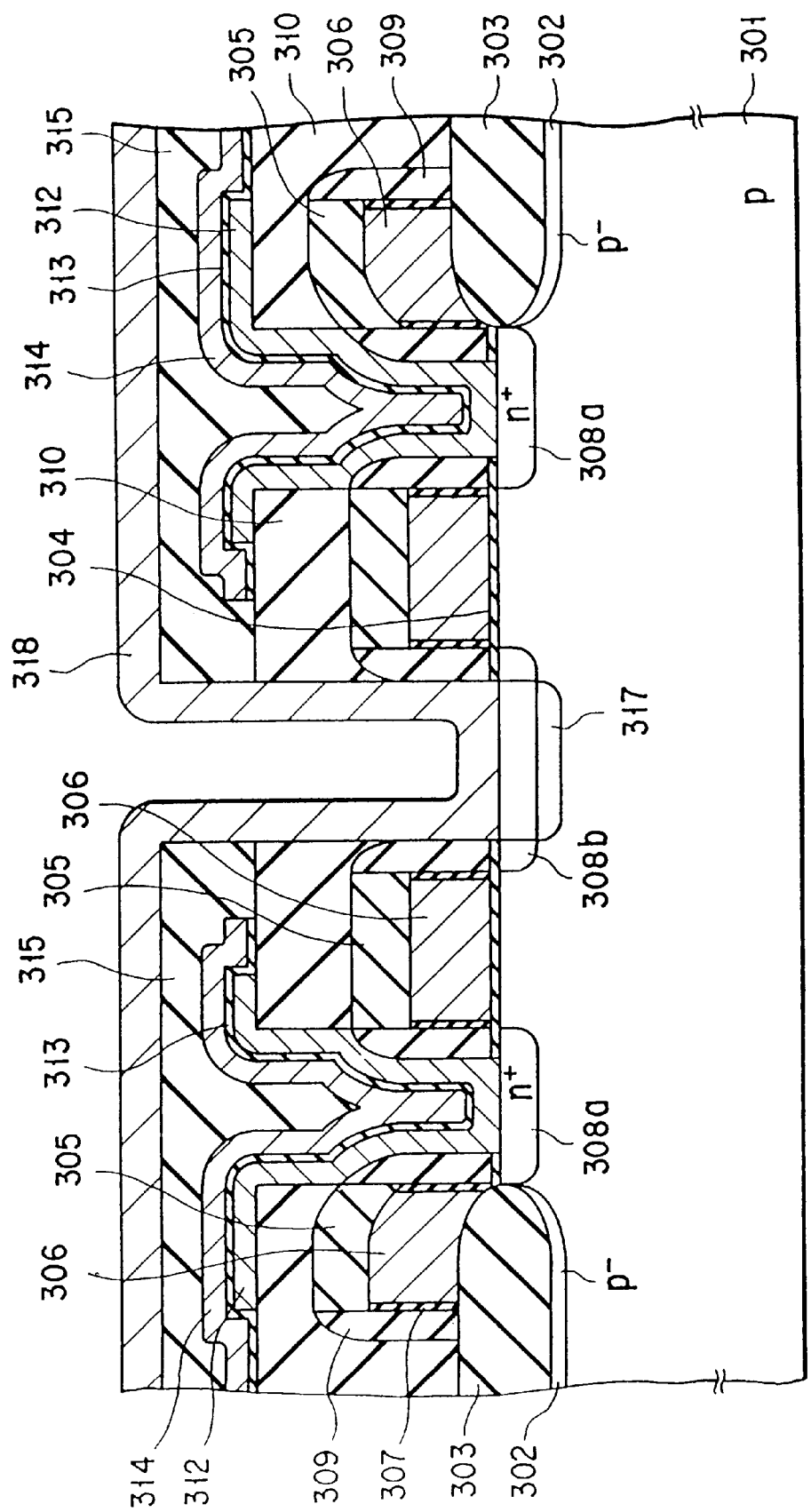
FIG. 20 is a sectional view of the conventional DRAM taken along a line XX—XX in FIG. 19.

Finally, although not shown, an insulating interlayer is formed by a known method; a contact hole is formed at a predetermined position, and a metal wiring pattern is formed. With this process, the semiconductor device shown in FIGS. 4 to 6 is completed.

According to the above manufacturing method, a wiring pattern can be buried in the silicon substrate 1 at a position right under a transistor by simple manufacturing steps. Therefore, the number of wiring patterns to be formed on the silicon substrate 1 can be reduced, and a device of a high integration density can be realized.

In each of the first to fourth embodiments, the wiring layer 9 can be made of a polysilicon film doped with an impurity having a conductivity type opposite to that of the silicon substrate 1. In each of the third and fourth embodiments, in which the inner surfaces of the contact hole 7 and the tunnel 8 are covered with the silicon oxide films 5, the wiring layer 9 may be made of a silicide film, typically a tungsten silicide film, a polycide film formed by stacking a silicide film and a polysilicon film doped with an impurity having a conductivity type opposite to that of the silicon substrate 1, a metal film, or the like.

When the wiring layer 9 is made of a polysilicon film, a silicide film, or a polycide film, the wiring layer 9 can be directly connected to the $n^+$-type diffusion layer 15 of the transistor without forming the conductive layer 16. In this case, if the conductive layer 16 is to be formed, the conductive layer 16 may be made of a monocrystalline silicon film, a polysilicon film, a silicide film, a metal film, or the like.

If the wiring layer 9 is a metal film, the conductive layer 16 may be made of a metal film.

[E] A semiconductor device according to the fifth embodiment of the present invention will be described in detail next.

FIG. 46 shows a CMOS inverter circuit according to the fifth embodiment of the present invention. FIG. 47 is a sectional view taken along a line XLVII—XLVII in FIG. 46. FIG. 48 is a sectional view taken along a line XLVIII—XLVIII in FIG. 46.

An n-type well region 25 is formed in a p-type silicon substrate 21. A $p^-$-type inversion preventing diffusion layer 26 and a field oxide film 27 are formed in a surface region of the silicon substrate 21. The field oxide film 27 is formed to surround an element region on the silicon substrate 21 and an element region on the well region 25.

A contact hole 29a is formed at the boundary between the element region on the silicon substrate 21 and the element region on the well region 25. The width of the contact hole 29a is larger than that of each element region. Therefore, the element region on the silicon substrate 21 is completely isolated from the element region on the well region 25 by the contact hole 29a. Note that the distance from the substrate surface to a tunnel 30 needs to be equal to or more than the depth of the well region 25.

The bottom portion of the contact hole 29a reaches is one end of the tunnel 30. A contact hole 29b is formed at the other end of the tunnel 30 to extend from the surface of the field oxide film 27 to the tunnel 30.

Silicon oxide films 31 are formed on the inner surfaces of the contact holes 29a and 29b and the tunnel 30. A conductive film is buried in the contact holes 29a and 29b and the tunnel 30 to form a wiring layer 32. The silicon substrate 21 and the wiring layer 32 are insulated from each other by the silicon oxide film 31.

One end of the wiring layer 32 on the contact hole 29a is connected to drains 35b and 36b of MOS transistors via a conductive film 37. That is, the conductive film 37 is formed on the wiring layer 32 and the drains 35b and 36b of the MOS transistors.

A gate electrode 34a is formed on the channel between a source 35a and the drain 35b of the n-channel MOS transistor and on the channel between a source 36a and the drain 36b of the p-channel MOS transistor. The source 35a of the MOS transistor is connected to a metal wiring pattern 40a. The source 36a of the MOS transistor is connected to a metal wiring pattern 40b.

The contact holes 29a and 29b and the tunnel 30 generally have rectangular cross-sections. However, the shapes of the cross-sections are not limited to this. The contact holes 29a and 29b and the tunnel 30 may be rectangular, circular, or the like in cross-section.

According to this arrangement, since wiring patterns can be buried in the silicon substrate 21, the number of wiring patterns to be formed on the silicon substrate 1 can be reduced. In addition, a device of a high integration density can be realized by simple manufacturing steps, as will be described in the following embodiments. Furthermore, since wiring layers can be formed right under transistors, the integration density of a device can be satisfactorily increased.

[F] A method of manufacturing a semiconductor device according to the sixth embodiment of the present invention will be described in detail next. Note that this embodiment exemplifies the method of manufacturing the CMOS inverter according to the fifth embodiment of the present invention.

FIGS. 49 to 64 show the method of manufacturing the CMOS inverter according to the sixth embodiment.

Figure 49:
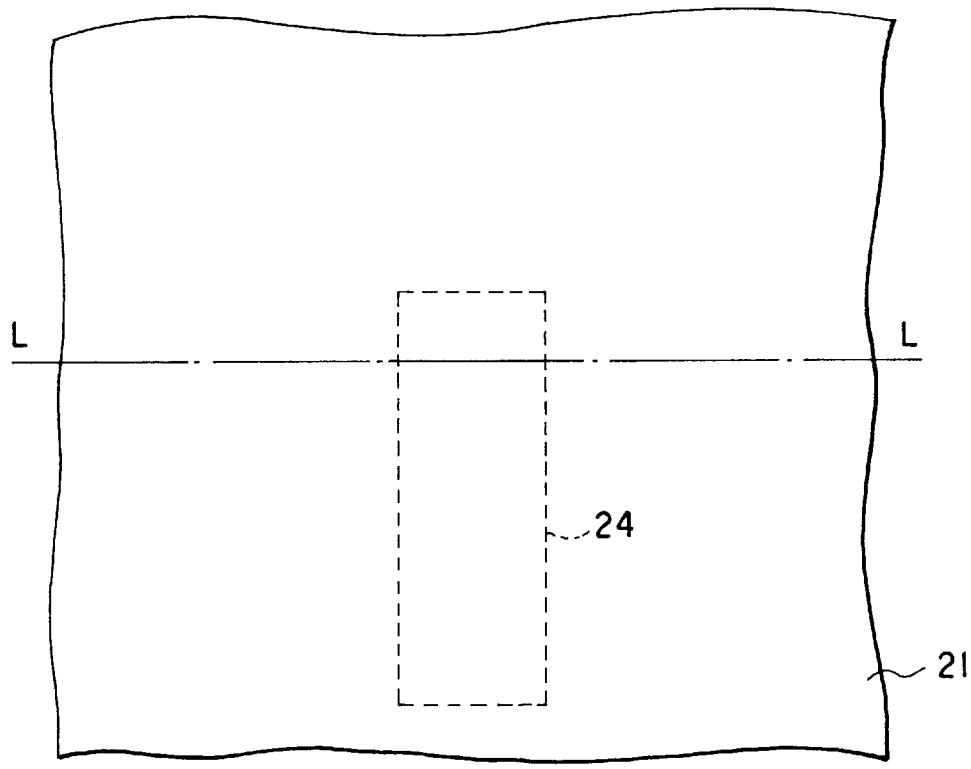
FIG. 49 is a plan view showing a step of a method of manufacturing a semiconductor device according to the sixth embodiment of the present invention.
Figure 50:
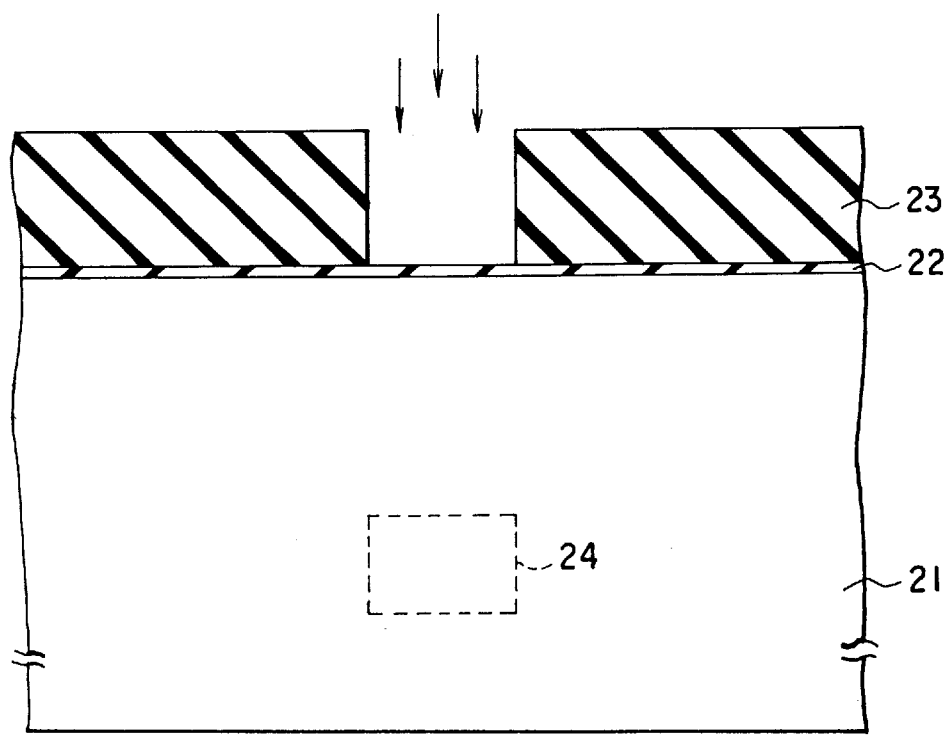
FIG. 50 is a sectional view taken along a line L—L in FIG. 49.

First, as shown in FIGS. 49 and 50, a silicon oxide film 22 is formed on a p-type silicon substrate 21. A photoresist 23 is coated on the entire surface of the silicon oxide film 22. The photoresist 23 is then patterned.

Oxygen ions are implanted in the silicon substrate 21 by an ion implantation method using the photoresist 23 as a mask. As a result, an oxygen-implanted layer 24 is formed in the silicon substrate 21 at a predetermined depth. FIG. 50 is a sectional view taken along a line L—L in FIG. 49.

Subsequently, as shown in FIGS. 51 and 52, an n-type well region 25 is formed in the p-type silicon substrate 21. One end portion of the well region 25 overlaps the oxygen-implanted layer 24. In addition, a $p^-$-type inversion preventing diffusion layer 26 and a field oxide film 27 are formed in a surface region of the silicon substrate 21.

The field oxide film 27 is formed to surround an element region E1 of the silicon substrate 21 and an element region E2 of the well region 25. Note that one end portion of the well region 25 which overlaps the oxygen-implanted layer 24 is the boundary between the element region E1 of the silicon substrate 21 and the element region E2 of the well region 25.

With this process, oxygen atoms (O) of the oxygen-implanted layer 24 are combined with silicon atoms (Si). As a result, the oxygen-implanted layer 24 is converted into an $SiO_2$ layer 24'. FIG. 52 is a sectional view taken along a line LII—LII in FIG. 51.

Figure 53:
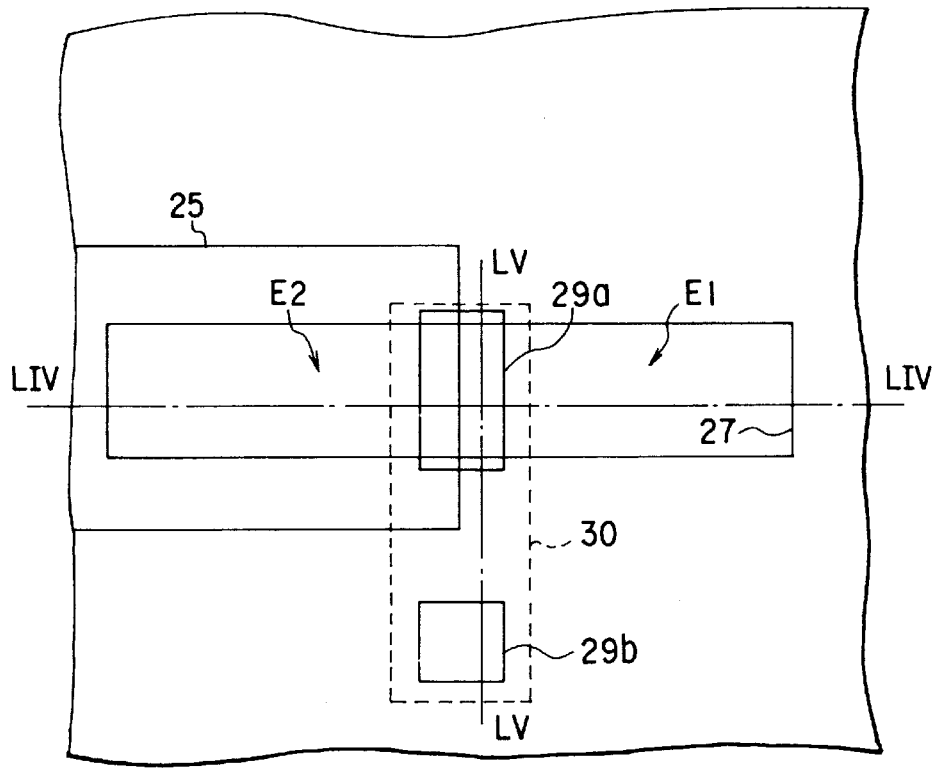
FIG. 53 is a plan view showing still another step of the method of manufacturing the semiconductor device according to the sixth embodiment of the present invention.
Figure 54:
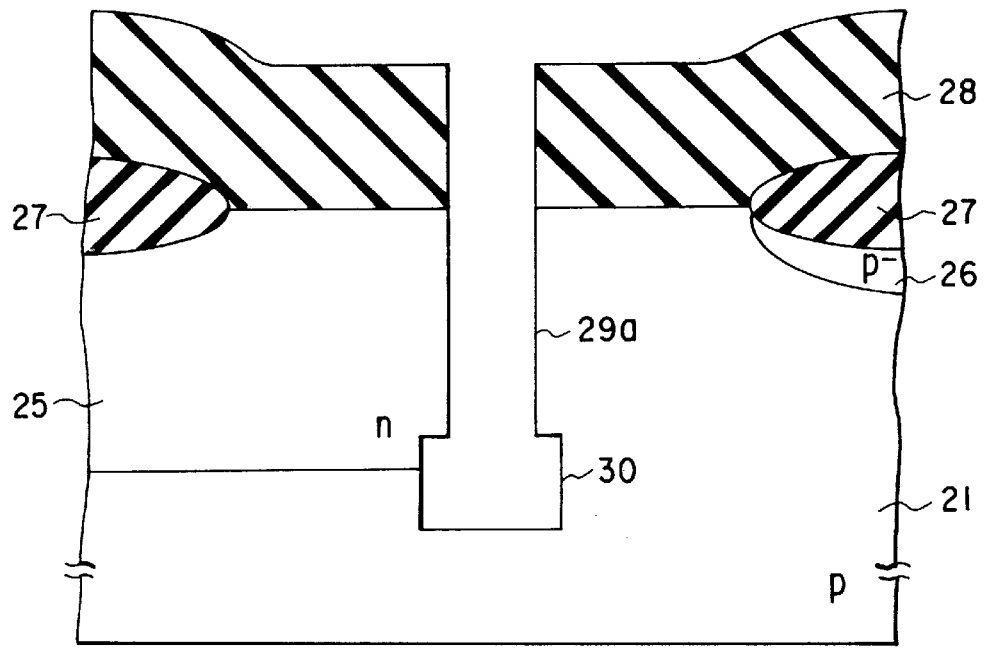
FIG. 54 is a sectional view taken along a line LIV—LIV in FIG. 53.

Subsequently, as shown in FIGS. 53 to 55, a photoresist 28 is coated on the entire surface of the silicon substrate 21. The photoresist 28 is then patterned to form openings at the two ends of the $SiO_2$ layer 24'. One of the openings is located on the boundary between the element region E1 of the silicon substrate 21 and the element region E2 of the well region 25, and the two ends of the $SiO_2$ layer 24' are located on the field oxide film 27.

The silicon substrate 21 is etched by the dry etching method using the photoresist 28 as a mask to form contact holes 29a and 29b, each extending from the surface of the silicon substrate 21 to the $SiO_2$ layer 24'. Note that the distance from the substrate surface to a tunnel 30 is larger than the depth of the well region 25. Consequently, the element region E1 of the silicon substrate 21 is completely isolated from the element region E2 of the well region 25.

When the SiO$_2$ layer 24' is etched by wet etching, the tunnel 30 is formed to extend from the contact hole 29a to the contact hole 29b. FIG. 54 is a sectional view taken along a line LIV—LIV in FIG. 53. FIG. 55 is a sectional view taken along a line LV—LV in FIG. 53.

Figure 56:
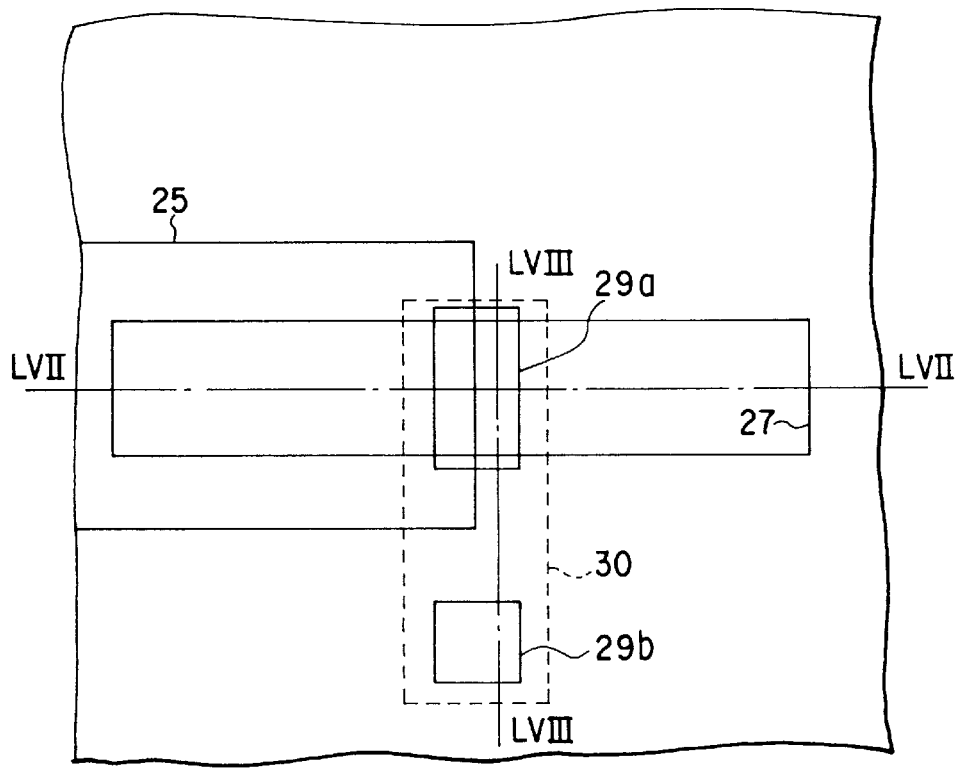
FIG. 56 is a plan view showing still another step of the method of manufacturing the semiconductor device according to the sixth embodiment of the present invention.
Figure 57:
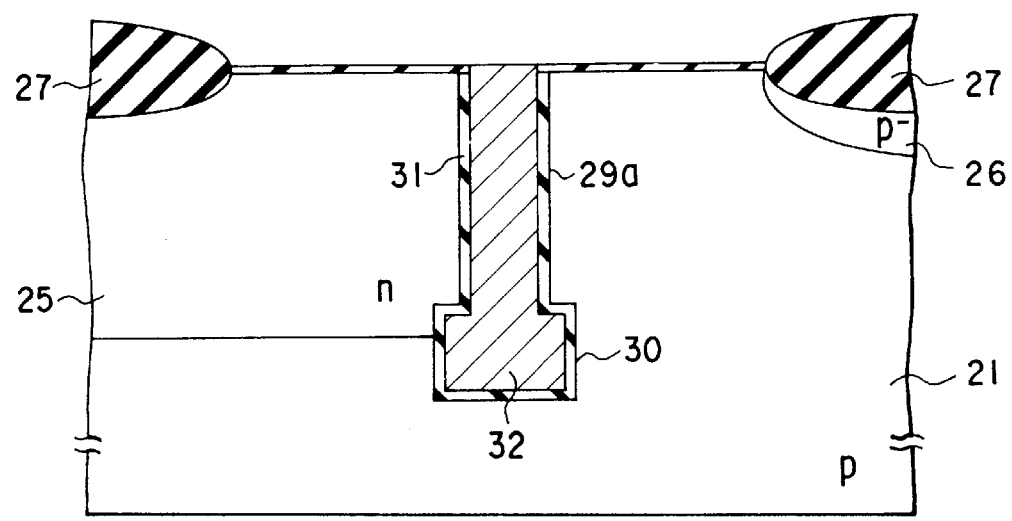
FIG. 57 is a sectional view taken along a line LVII—LVII in FIG. 56.
Figure 58:
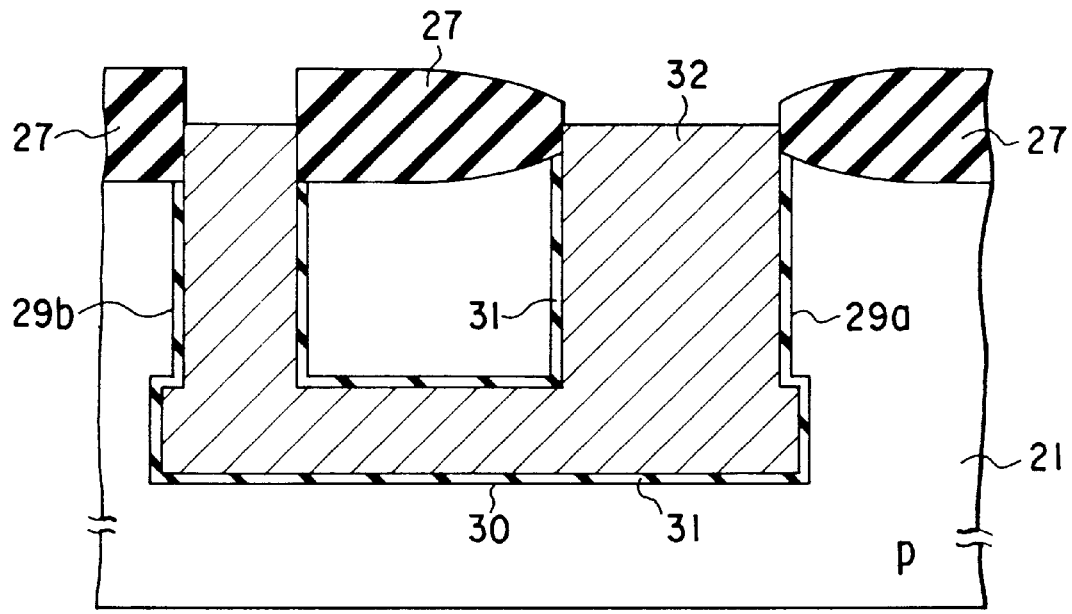
FIG. 58 is a sectional view taken along a line LVIII—LVIII in FIG. 56.

Subsequently, as shown in FIGS. 56 to 58, the photoresist 28 is removed. Silicon oxide films 31 are formed on the surface of the silicon substrate 21 and the inner surfaces of the contact holes 29a and 29b and the tunnel 30 by thermal oxidation.

A conductive film, e.g., an arsenic-doped polysilicon film, is formed to completely fill the contact holes 29a and 29b and the tunnel 30. In addition, the conductive film is etched back by dry etching to be left in only the contact holes 29a and 29b and the tunnel 30, thus forming a wiring layer 32. FIG. 57 is a sectional view taken along a line LVII—LVII in FIG. 56. FIG. 58 is a sectional view taken along a line LVIII—LVIII in FIG. 56.

Figure 61:
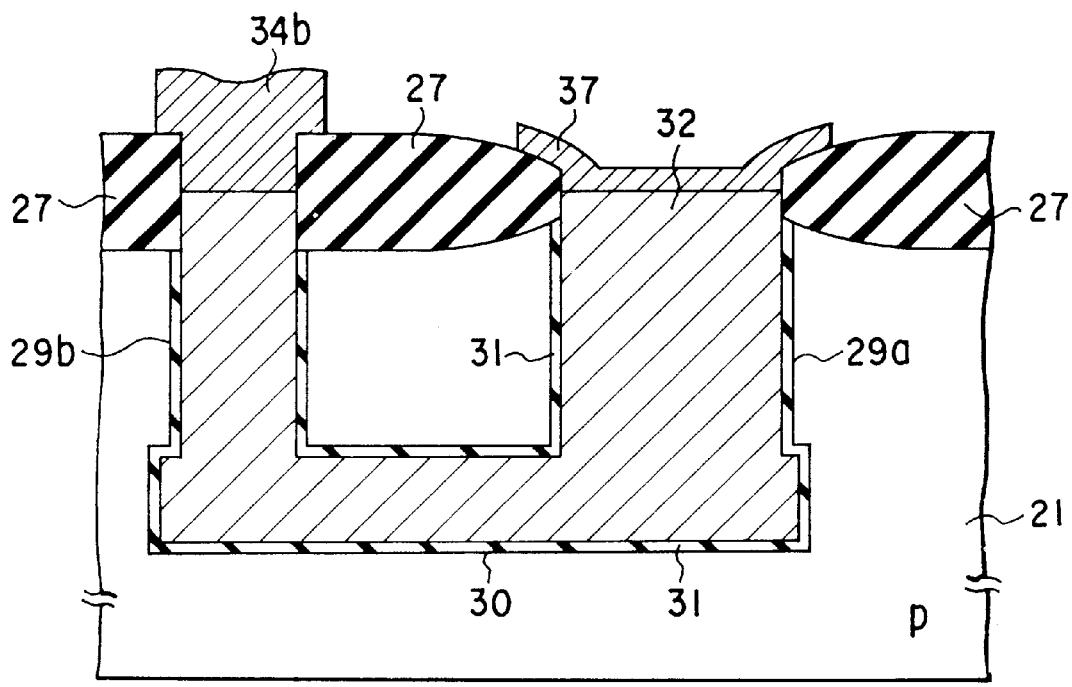
FIG. 61 is a sectional view taken along a line LXI—LXI in FIG. 59.
Figure 59:
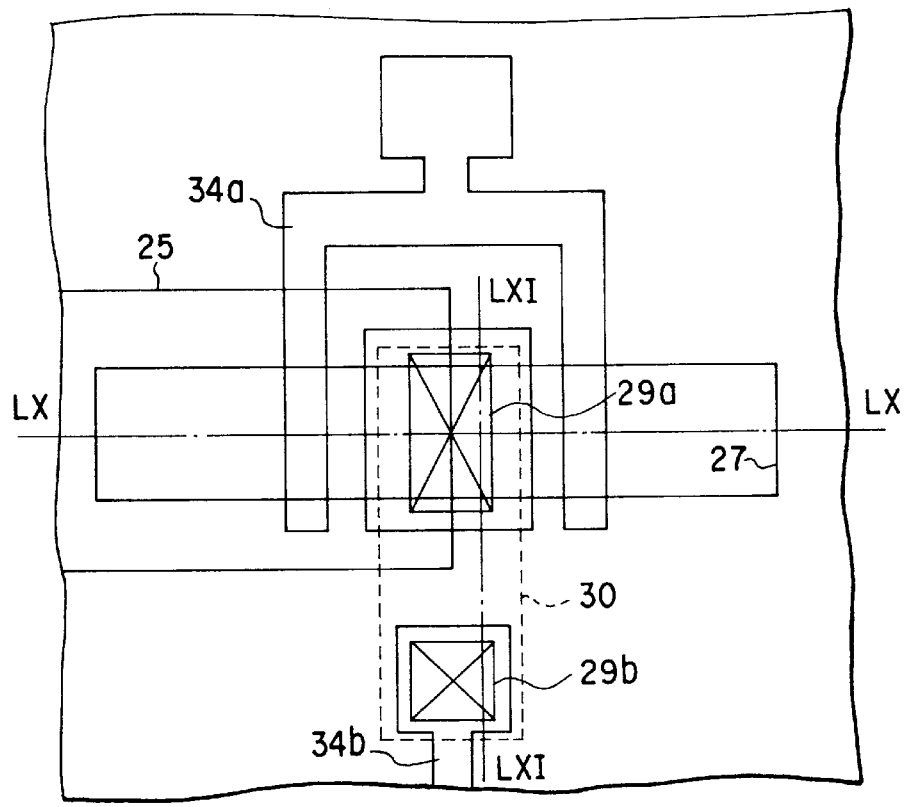
FIG. 59 is a plan view showing still another step of the method of manufacturing the semiconductor device according to the sixth embodiment of the present invention.
Figure 60:
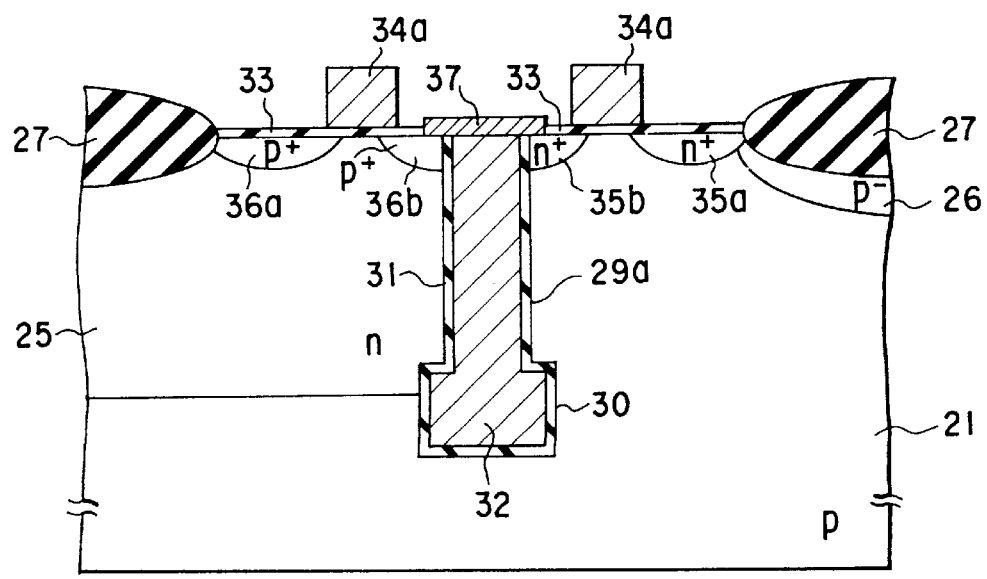
FIG. 60 is a sectional view taken along a line LX—LX in FIG. 59.

As shown FIGS. 59 to 61, the silicon oxide film 31 on the silicon substrate 21 is removed by, e.g., wet etching. A gate insulating film 33 is then formed on the silicon substrate 21 by thermal oxidation.

For example, a phosphorous-doped polysilicon film is formed on the resultant structure. This polysilicon film is then patterned to form a gate electrode 34a of n- and p-channel MOS transistors and a wiring pattern 34b for transferring an output from the inverter to a circuit on the next stage. Note that the wiring pattern 34b is connected to one end of the wiring layer 32 on the contact hole 29b.

A portion, of the silicon substrate 21, on which a p-channel MOS transistor is formed is covered with a resist, and an n-type impurity, e.g., arsenic, is implanted in the silicon substrate 21 by an ion implantation method using the field oxide film 27 and a gate electrode 34 as masks. A portion, of the silicon substrate 21, on which an n-channel MOS transistor is formed is covered with a resist, and a p-type impurity, e.g., boron, is implanted in the silicon substrate 21 by an ion implantation method using the field oxide film 27 and the gate electrode 34 as masks.

When the resultant structure is annealed in a nitrogen atmosphere, a source 35a and a drain 35b of the n-channel MOS transistor and a source 36a and a drain 36b of the p-channel MOS transistor are formed.

The gate insulating film 33 on the contact hole 29a and the drains 35b and 36b of the MOS transistors are selectively removed. A conductive film 37 is formed on one end of the wiring layer 32 on the contact hole 29a and on the drains 35b and 36b of the MOS transistors, thus connecting the wiring layer 32 to the drains 35b and 36b of the MOS transistors.

This conductive film 37 can be formed by selectively etching a polysilicon doped with, e.g., arsenic. The field oxide film 27 can also be formed by selectively growing a material capable of being selectively grown, e.g., polysilicon or a refractory metal, on the wiring layer 32 and the drains 35b and 36b of the MOS transistors. FIG. 60 is a sectional view taken along a line LX—LX in FIG. 59. FIG. 61 is a sectional view taken along a line LXI—LXI in FIG. 59.

Figure 21:
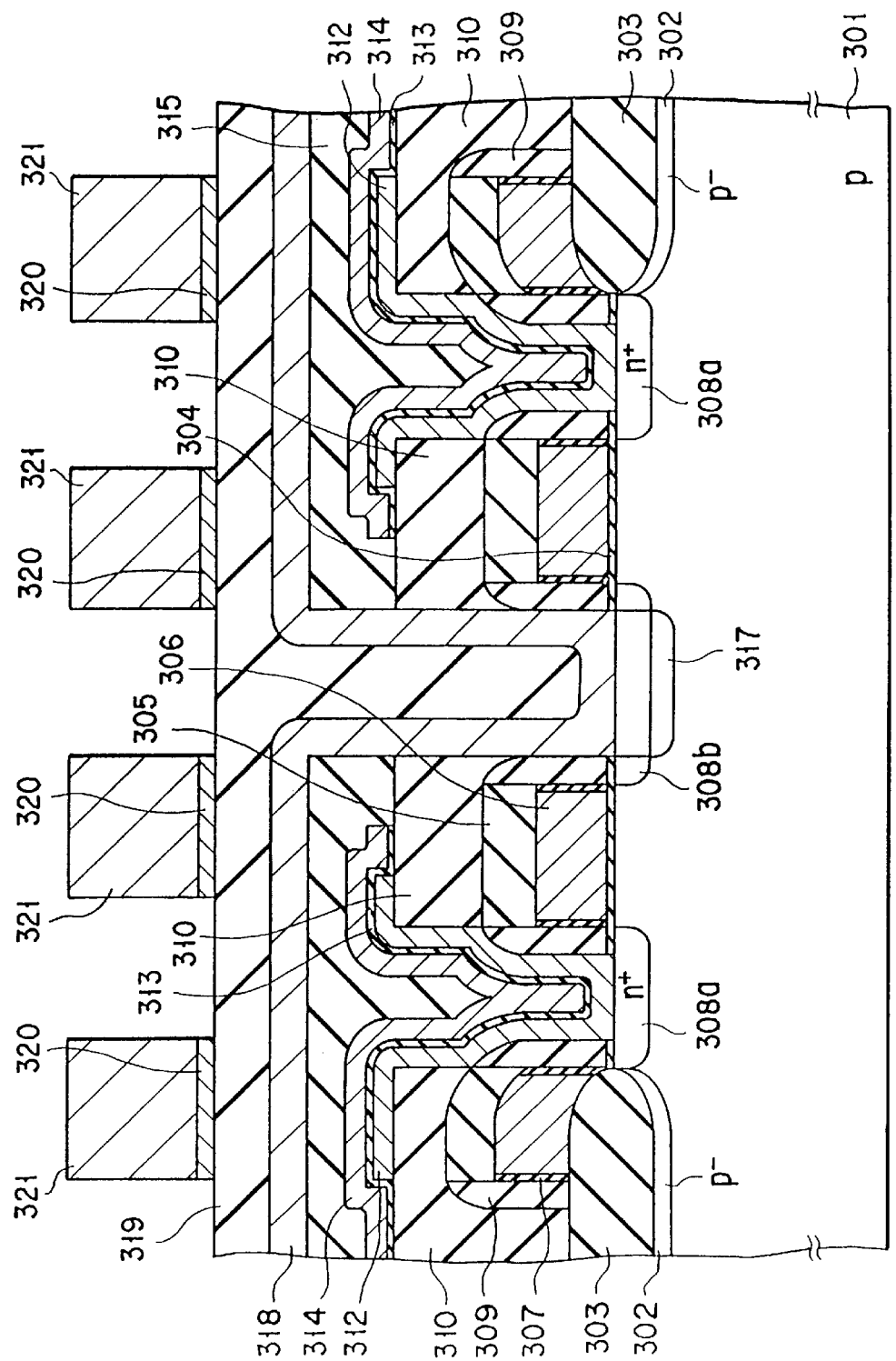
FIG. 21 is a sectional view showing still another step of the method of manufacturing the conventional DRAM.
Figure 22:
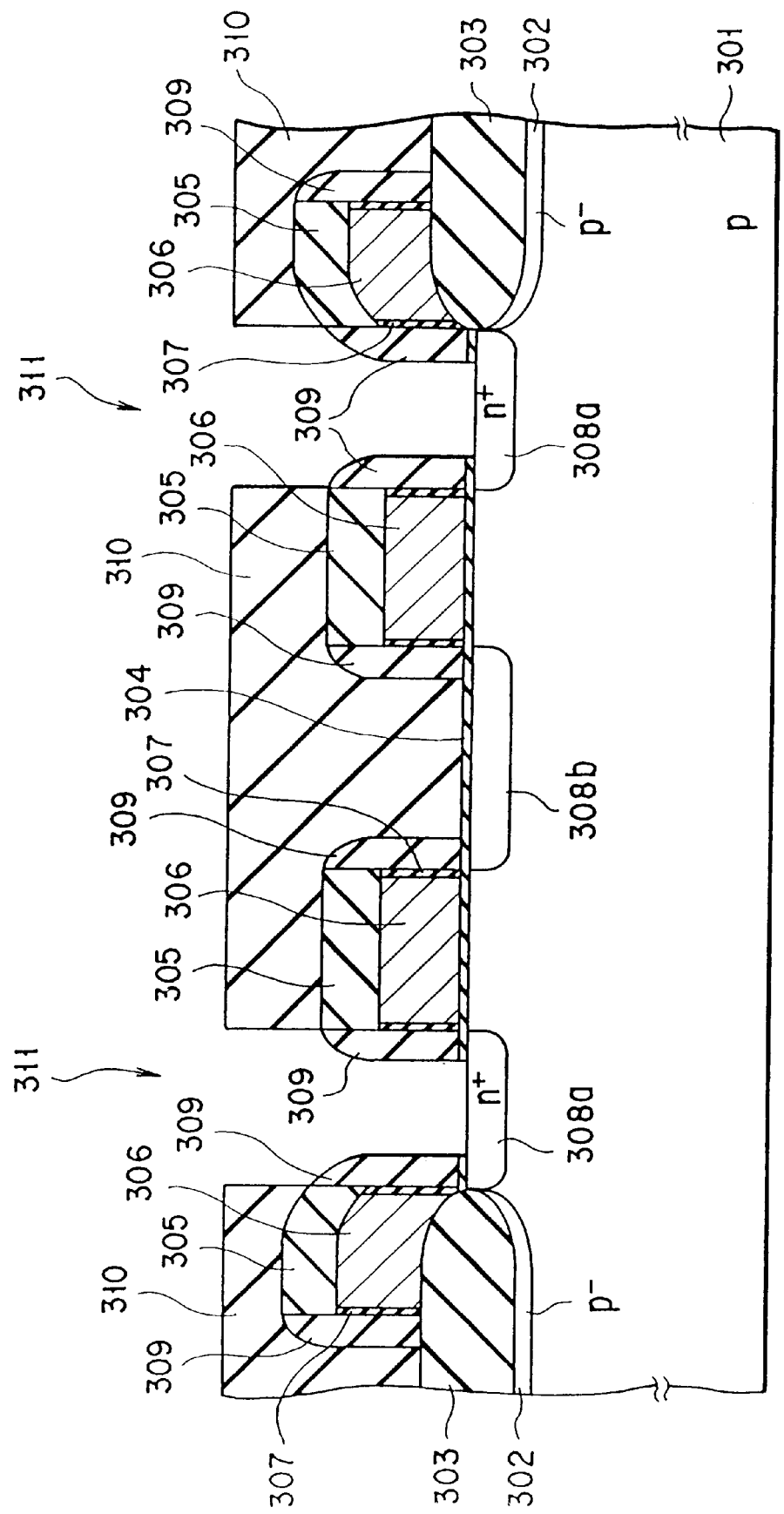
FIG. 22 is a sectional view showing a step of a method of manufacturing a conventional DRAM.
Figure 23:
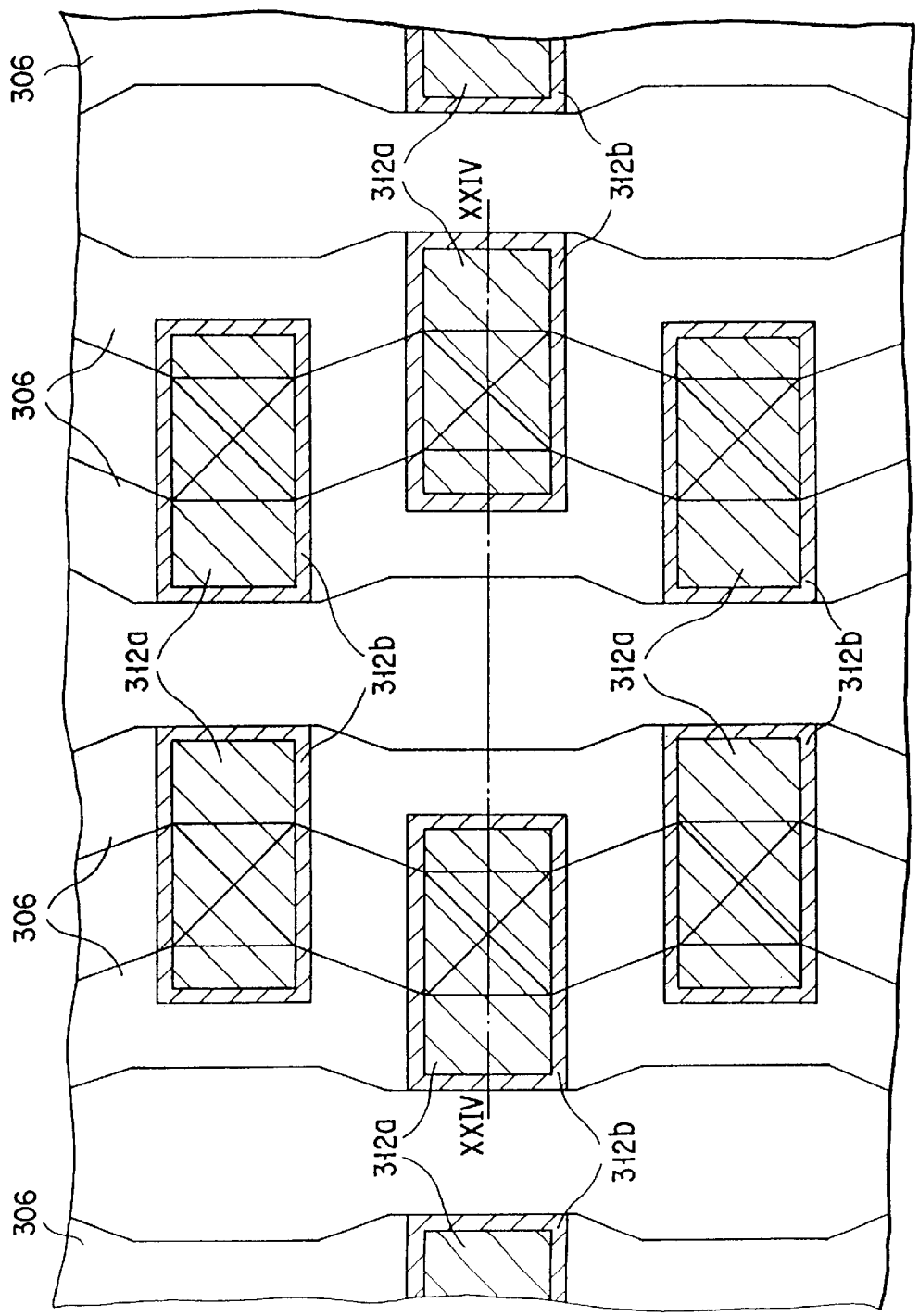
FIG. 23 is a plan view showing another step of the method of manufacturing the conventional DRAM.
Figure 24:
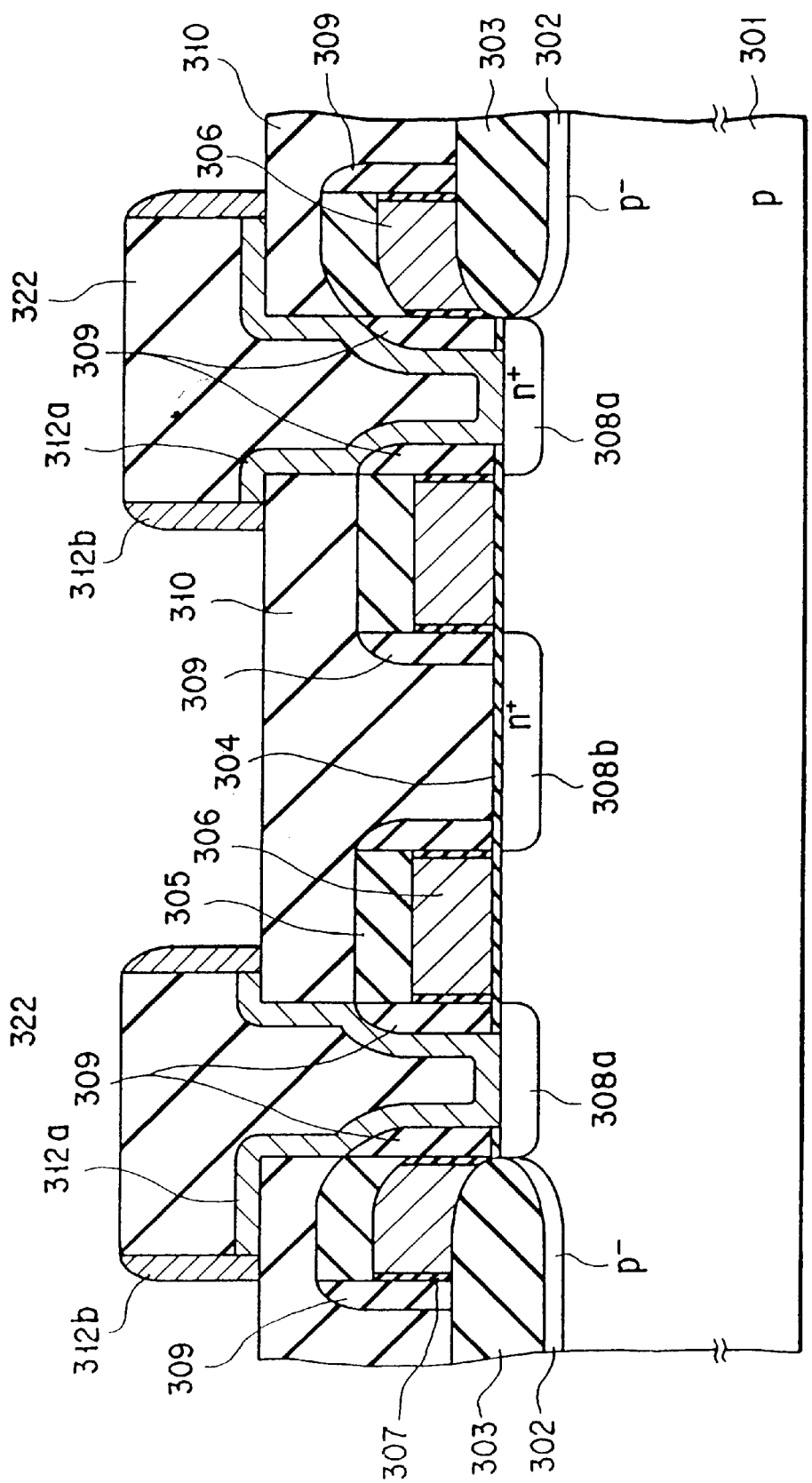
FIG. 24 is a sectional view of the conventional DRAM taken along a line XXIV—XXIV in FIG. 23.
Figure 25:
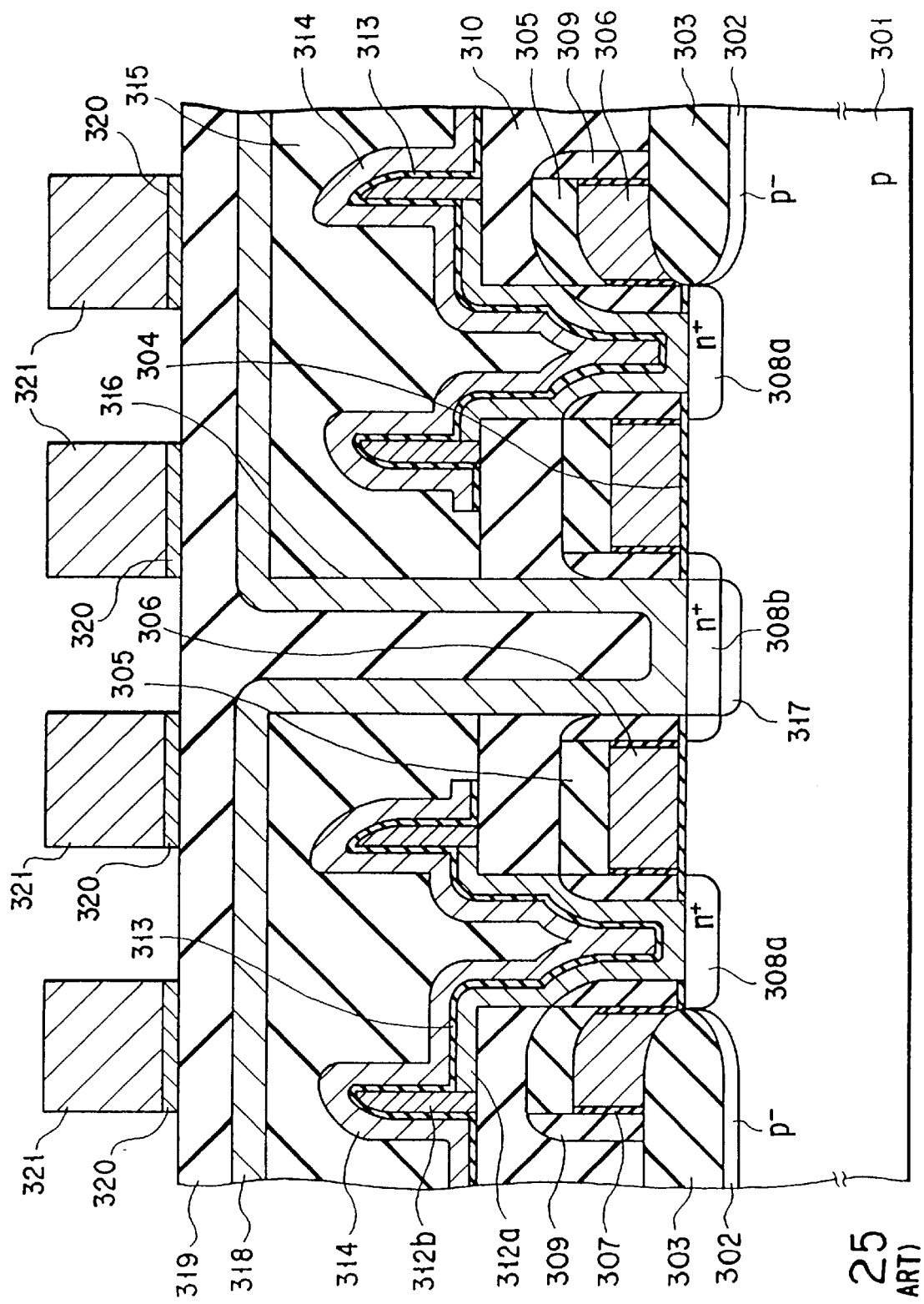
FIG. 25 is a sectional view showing still another step of the method of manufacturing the conventional DRAM.

As shown in FIGS. 62 to 64, an insulating interlayer 38, e.g., a silicon oxide film, is formed on the entire surface of the silicon substrate 21. A contact hole 39a reaching the source 35a of the n-channel MOS transistor and a contact hole 39b reaching the source 36a of the p-channel MOS transistor are formed in the insulating interlayer 38. Metal wiring patterns 40a and 40b, aluminum wiring patterns, are formed on the insulating interlayer 38 to be connected to the sources 36a and 36b of the MOS transistors. FIG. 63 is a sectional view taken along a line LXIII—LXIII in FIG. 62. FIG. 64 is a sectional view taken along a line LXIV—LXIV in FIG. 62. With this process, the CMOS inverter shown in FIGS. 21 to 23 is completed.

According to the method of manufacturing the CMOS inverter, a wiring pattern can be buried in the silicon substrate 21 at a position right under each MOS transistor by simple manufacturing steps. Therefore, the number of wiring patterns to be formed on the silicon substrate 21 can be reduced. In addition, a device of a high integration density can be realized.

In each of the fifth and sixth embodiments, the wiring layer 32 may be made of a silicide film, e.g., a tungsten silicide film, a polycide film formed by stacking a polysilicon film and a silicide film, or a metal film.

When the wiring layer 32 is made of a polysilicon film, a silicide film, or a polycide film, the wiring layer 32 can be directly connected to the drains 35b and 36b of the MOS transistors without forming the conductive layer 37.

The conductive film 37 may be made of a monocrystalline silicon film, a polysilicon film, a silicide film, a metal film, or the like. If the wiring layer 32 is a metal film, the conductive layer 37 may be made of a metal film.

Figure 65:
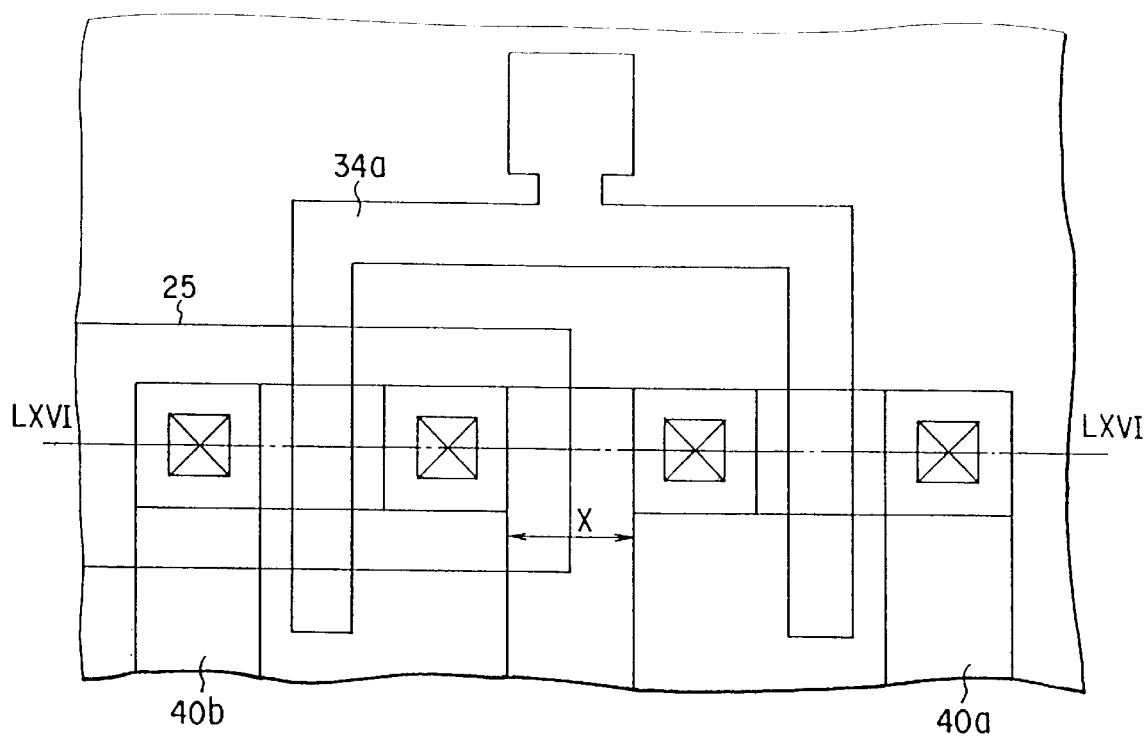
FIG. 65 is a plan view showing a conventional semiconductor device.
Figure 66:
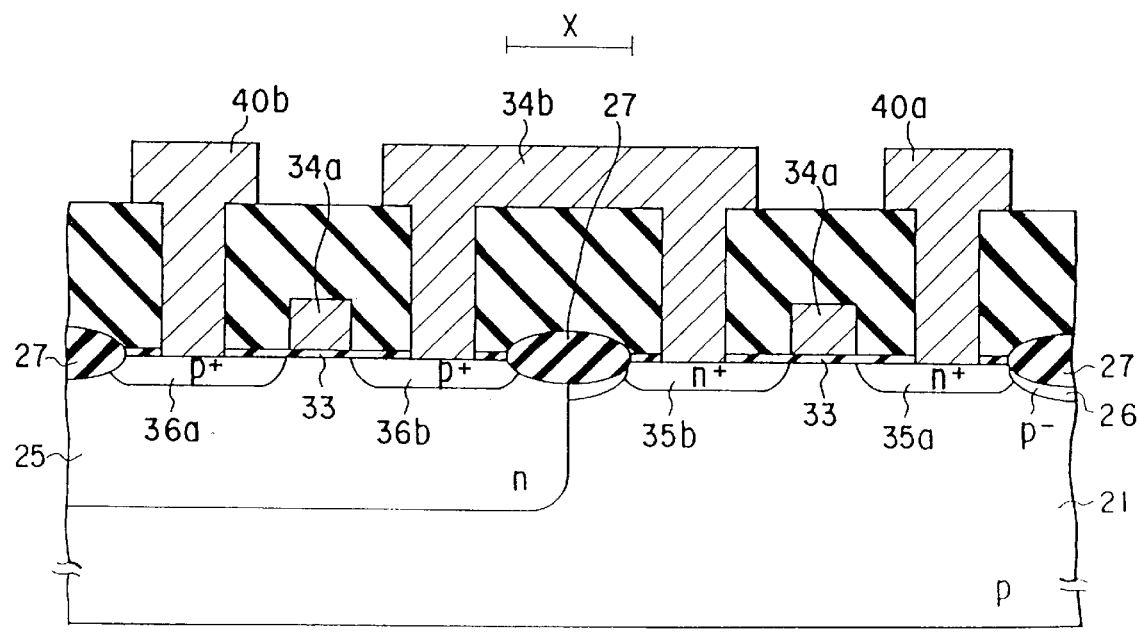
FIG. 66 is a sectional view of the conventional DRAM taken along a line LXVI—LXVI in FIG. 65.

FIGS. 65 and 66 show a technique on which the above fifth and sixth embodiments of the present invention are based. FIG. 66 is a sectional view taken along a line LXVI—LXVI in FIG. 65.

An n-type well region 25 is formed in a p-type silicon substrate 21. A p$^-$-type inversion preventing diffusion layer 26 and a field oxide film 27 are formed in a surface region of the silicon substrate 21. The field oxide film 27 is formed to surround an element region on the silicon substrate 21 and an element region on the well region 25.

The element region on the silicon substrate 21 is isolated from the element region on the well region 25 by the field oxide film 27.

A gate electrode 34a is formed on the channel between a source 35a and a drain 35b of an n-channel MOS transistor and on the channel between a source 36a and a drain 36b of a p-channel MOS transistor.

The source 35a of the MOS transistor is connected to a metal wiring pattern 40a. The source 36a of the MOS transistor is connected to a metal wiring pattern 40b. In addition, the drains 35b and 36b of the MOS transistors are connected to each other via a wiring pattern 34b.

In the CMOS inverter having such an arrangement, the element region on the silicon substrate 21 is isolated from the element region on the well region 25 by the field oxide film 27. Therefore, the distance between the n- and p-channel MOS transistors is set to be larger than at least a width X of the field oxide film 27.

In contrast to this, in the CMOS inverter according to each of the fifth and sixth embodiments of the present invention, since the contact hole 29a and the tunnel 30 also serve to isolate the elements from each other, the area for forming the CMOS inverter can be reduced as compared with the CMOS inverter shown in FIGS. 65 and 66. That is, according to each of the fifth and sixth embodiments, the integration density of elements can be increased by burying wiring patterns in the silicon substrate 21.

[G] A semiconductor device according to the seventh embodiment of the present invention will be described in detail next.

FIG. 67 shows a CMOS inverter circuit according to the seventh embodiment. FIG. 68 is a sectional view taken along a line LXVIII—LXVIII in FIG. 67. FIG. 69 is a sectional view taken along a line LXIX—LXIX in FIG. 67.

An n-type well region 25 is formed in a p-type silicon substrate 21. A p⁻-type inversion preventing diffusion layer 26 and a field oxide film 27 are formed in a surface region of the silicon substrate 21. The field oxide film 27 is formed to surround an element region on the silicon substrate 21 and an element region on the well region 25.

A contact hole 29a is formed at the boundary between the element region on the silicon substrate 21 and the element region on the well region 25. The width of the contact hole 29a is larger than that of each element region. Therefore, the element region on the silicon substrate 21 is completely isolated from the element region on the well region 25 by the contact hole 29a.

The bottom portion of the contact hole 29a reaches one end of the tunnel 30. A contact hole 29b is formed at the other end of the tunnel 30 to extend from the surface of the field oxide film 27 to the tunnel 30. Note that the distance from the substrate surface to a tunnel 30 needs to be equal to or more than the depth of the well region 25.

Silicon oxide films 31 are formed on the inner surfaces of the contact holes 29a and 29b and the tunnel 30. A conductive film is buried in the contact holes 29a and 29b and the tunnel 30 to form a wiring layer 32. The silicon substrate 21 and the wiring layer 32 are insulated from each other by the silicon oxide film 31.

One end of the wiring layer 32 on the contact hole 29a is connected to drains 35b and 36b of MOS transistors via a conductive film 37. That is, the conductive film 37 is formed on the wiring layer 32 to be in contact therewith and with the drains 35b and 36b of the MOS transistors at a portion of the side wall of the contact hole 29a.

A gate electrode 34a is formed on the channel between a source 35a and the drain 35b of the n-channel MOS transistor and on the channel between a source 36a and the drain 36b of the p-channel MOS transistor. The source 35a of the MOS transistor is connected to a metal wiring pattern 40a. The source 36a of the MOS transistor is connected to a metal wiring pattern 40b.

The contact holes 29a and 29b and the tunnel 30 generally have rectangular cross-sections. However, the shapes of the cross-sections are not limited to this. The contact holes 29a and 29b and the tunnel 30 may be rectangular, circular, or the like in cross-section.

According to this arrangement, since wiring patterns can be buried in the silicon substrate 21, the number of wiring patterns to be formed on the silicon substrate 21 can be reduced. In addition, a device of a high integration density can be realized by simple manufacturing steps, as will be described in the following embodiments. Furthermore, since wiring layers can be formed right under transistors, the integration density of a device can be satisfactorily increased.

[H] A method of manufacturing a semiconductor device according to the eighth embodiment of the present invention will be described in detail next. Note that this embodiment exemplifies the method of manufacturing the CMOS inverter according to the seventh embodiment of the present invention.

FIGS. 70 to 90 show the method of manufacturing the CMOS inverter according to the eighth embodiment.

First, as shown in FIGS. 70 and 71, a silicon oxide film 22 is formed on a p-type silicon substrate 21. A photoresist 23 is coated on the entire surface of the silicon oxide film 22. The photoresist 23 is then patterned.

Oxygen ions are implanted in the silicon substrate 21 by an ion implantation method using the photoresist 23 as a mask. As a result, an oxygen-implanted layer 24 is formed in the silicon substrate 21 at a predetermined depth. FIG. 71 is a sectional view taken along a line LXXI—LXXI in FIG. 70.

Subsequently, as shown in FIGS. 72 and 73, an n-type well region 25 is formed in the p-type silicon substrate 21. One end portion of the well region 25 overlaps the oxygen-implanted layer 24. In addition, a p⁻-type inversion preventing diffusion layer 26 and a field oxide film 27 are formed in a surface region of the silicon substrate 21.

The field oxide film 27 is formed to surround an element region E1 of the silicon substrate 21 and an element region E2 of the well region 25. Note that one end portion of the well region 25 which overlaps the oxygen-implanted layer 24 is the boundary between the element region E1 of the silicon substrate 21 and the element region E2 of the well region 25.

With this process, oxygen atoms (O) of the oxygen-implanted layer 24 are combined with silicon atoms (Si). As a result, the oxygen-implanted layer 24 is converted into an $SiO_2$ layer 24'. FIG. 73 is a sectional view taken along a line LXXIII—LXXIII in FIG. 72.

Subsequently, as shown in FIGS. 74 and 75, a gate insulating film 33 is formed on the silicon substrate 21 by thermal oxidation. In addition, a phosphorous-doped polysilicon film and a silicon nitride film 42 are formed on the resultant structure. The polysilicon film and the silicon nitride film 42 are patterned to form a gate electrode 34a of n- and p-channel MOS transistors.

A portion, of the silicon substrate 21, on which a p-channel MOS transistor is formed is covered with a resist, and an n-type impurity, e.g., arsenic, is implanted in the silicon substrate 21 by an ion implantation method using the field oxide film 27 and a gate electrode 34 as masks. A portion, of the silicon substrate 21, on which an n-channel MOS transistor is formed is covered with a resist, and a p-type impurity, e.g., boron, is implanted in the silicon substrate 21 by an ion implantation method using the field oxide film 27 and the gate electrode 34 as masks.

When the resultant structure is annealed in a nitrogen atmosphere, a source 35a and a drain 35b of the n-channel MOS transistor and a source 36a and a drain 36b of the p-channel MOS transistor are formed.

FIG. 75 is a sectional view taken along a line LXXV—LXXV in FIG. 74.

Figure 78:
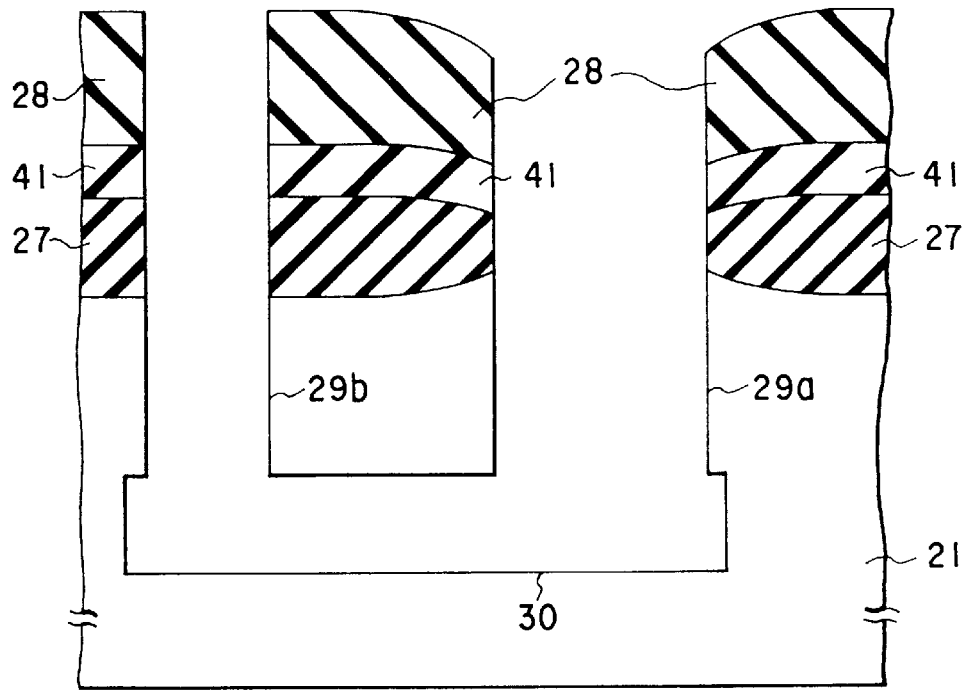
FIG. 78 is a sectional view taken along a line LXXVIII—LXXVIII in FIG. 76.

Subsequently, as shown in FIGS. 76 to 78, a silicon nitride film 41 is formed on the entire surface of the silicon substrate 21. A photoresist 28 is coated on the silicon nitride film 41. The photoresist 28 is then patterned to form openings at the two ends of the $SiO_2$ layer 24'. One of the openings is located on the boundary between the element region E1 of the silicon substrate 21 and the element region E2 of the well region 25, and the two ends of the $SiO_2$ layer 24' are located on the field oxide film 27.

The silicon substrate 21 is etched by the dry etching method using the photoresist 28 as a mask to form contact holes 29a and 29b, each extending from the surface of the silicon substrate 21 to the $SiO_2$ layer 24'. Note that the distance from the substrate surface to a tunnel 30 is larger than the depth of the well region 25. Consequently, the element region E1 of the silicon substrate 21 is completely isolated from the element region E2 of the well region 25.

When the $SiO_2$ layer 24' is etched by wet etching, the tunnel 30 is formed to extend from the contact hole 29a to the contact hole 29b. FIG. 77 is a sectional view taken along a line LXXVII—LXXVII in FIG. 76. FIG. 78 is a sectional view taken along a line LXXVIII—LXXVIII in FIG. 76.

Figure 81:
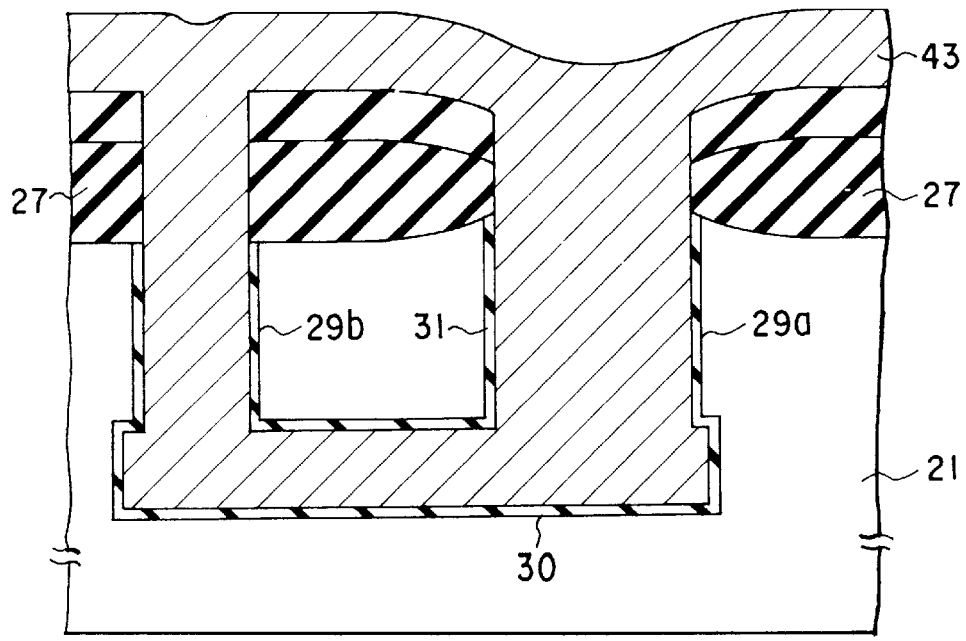
FIG. 81 is a sectional view taken along a line LXXXI—LXXXI in FIG. 79.

Subsequently, as shown in FIGS. 79 to 81, the photoresist 28 is removed. Silicon oxide films 31 are formed on the surface of the silicon substrate 21 and the inner surfaces of the contact holes 29a and 29b and the tunnel 30 by thermal oxidation. A conductive film 43, e.g., an arsenic-doped polysilicon film, is formed to completely fill the contact holes 29a and 29b and the tunnel 30. FIG. 80 is a sectional view taken along a line LXXX—LXXX in FIG. 79. FIG. 81 is a sectional view taken along a line LXXXI—LXXXI in FIG. 79.

Figure 84:
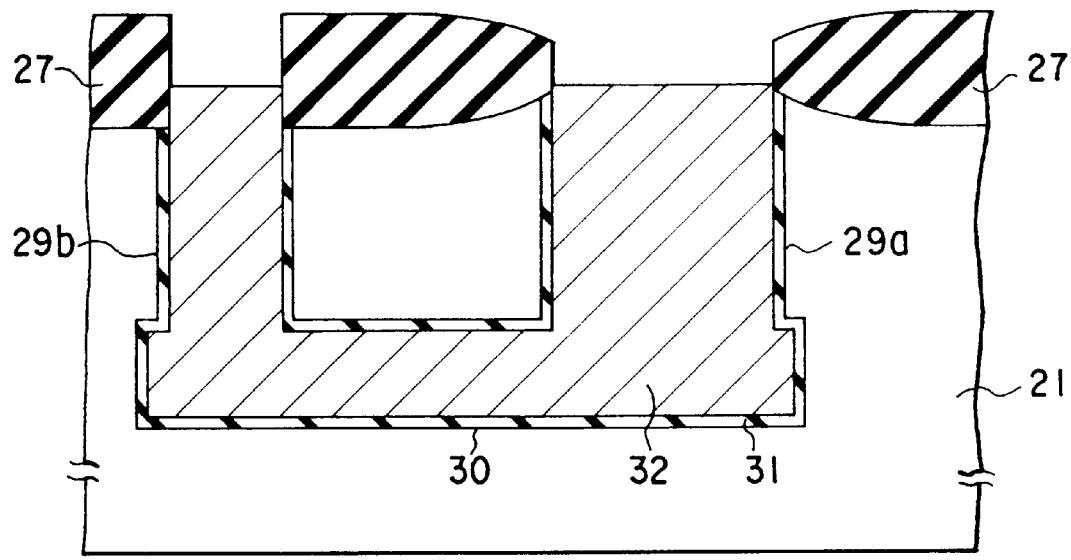
FIG. 84 is a sectional view taken along a ling LXXXIV—LXXXIV in FIG. 82.

As shown in FIGS. 82 to 84, the conductive film 43 is etched back by dry etching to be left in only the contact holes 29a and 29b and the tunnel 30, thus forming the wiring layer 32. This etching back is performed to such an extent that the etched portion reaches an upper portion of the contact hole 29a. With this process, the silicon oxide film 31 on the side wall of the upper portion of the contact hole 29a is removed, and the drains 35b and 36b of the MOS transistors are exposed at the portion from which the silicon oxide film 31 is removed.

Thereafter, a conductive film 37 capable of selective growth is formed on the wiring layer 32 by selective growth. The conductive film 37 is composed of, e.g., polysilicon or a refractory metal. With this process, one end of the wiring layer 32 on the upper portion of the contact hole 29a is connected to the drains 35b and 36b of the MOS transistors.

Note that after an arsenic-doped polysilicon film is formed, this polysilicon film may be selectively etched. FIG. 83 is a sectional view taken along a line LXXXIII—LXXXIII in FIG. 82. FIG. 84 is a sectional view taken along a line LXXXIV—LXXXIV in FIG. 82.

Figure 87:
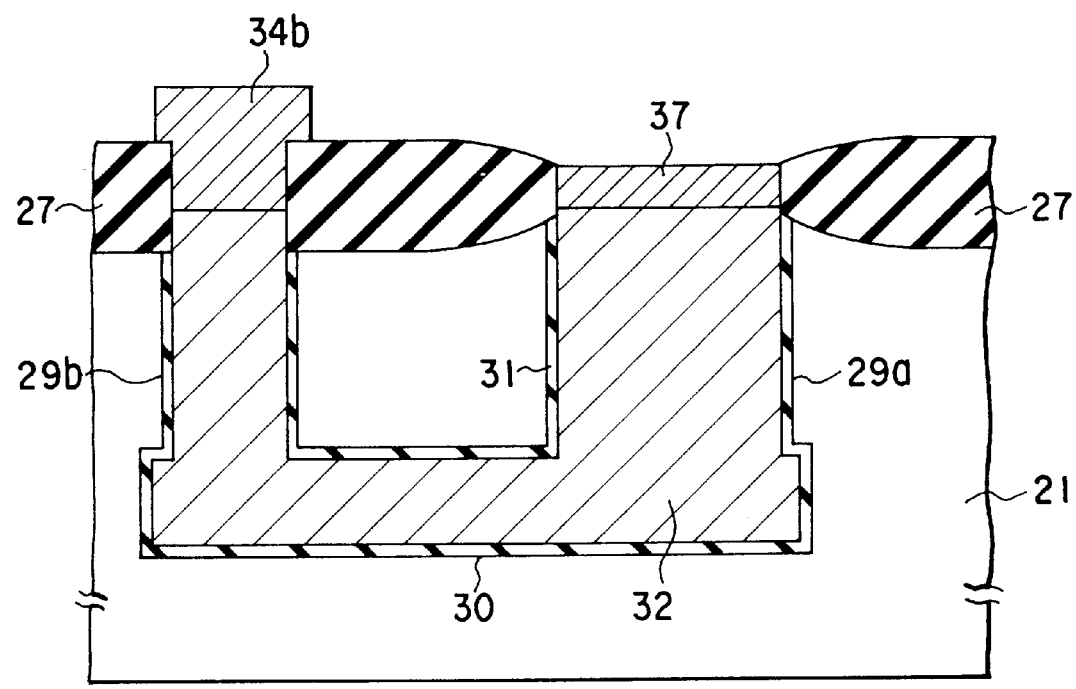
FIG. 87 is a sectional view taken along a line LXXXVII—LXXXVII in FIG. 85.

As shown in FIGS. 85 to 87, a wiring pattern 34b for transferring an output from the CMOS inverter to a circuit on the next stage is formed on the contact hole 29b. This wiring pattern 34b is composed of a semiconductor, silicide, polycide, a metal, or the like. FIG. 86 is a sectional view taken along a line LXXXVI—LXXXVI in FIG. 85. FIG. 87 is a sectional view taken along a line LXXXVII—LXXXVII in FIG. 85.

Figure 88:
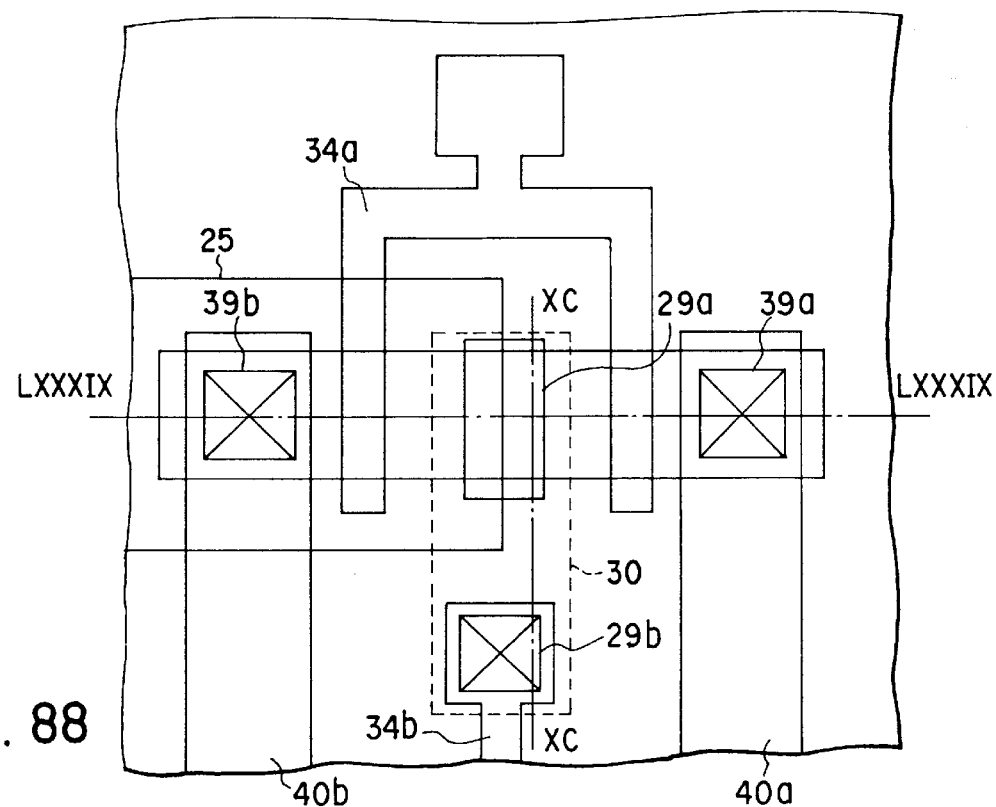
FIG. 88 is a plan view showing still another step of the method of manufacturing the semiconductor device according to the eighth embodiment of the present invention.
Figure 89:
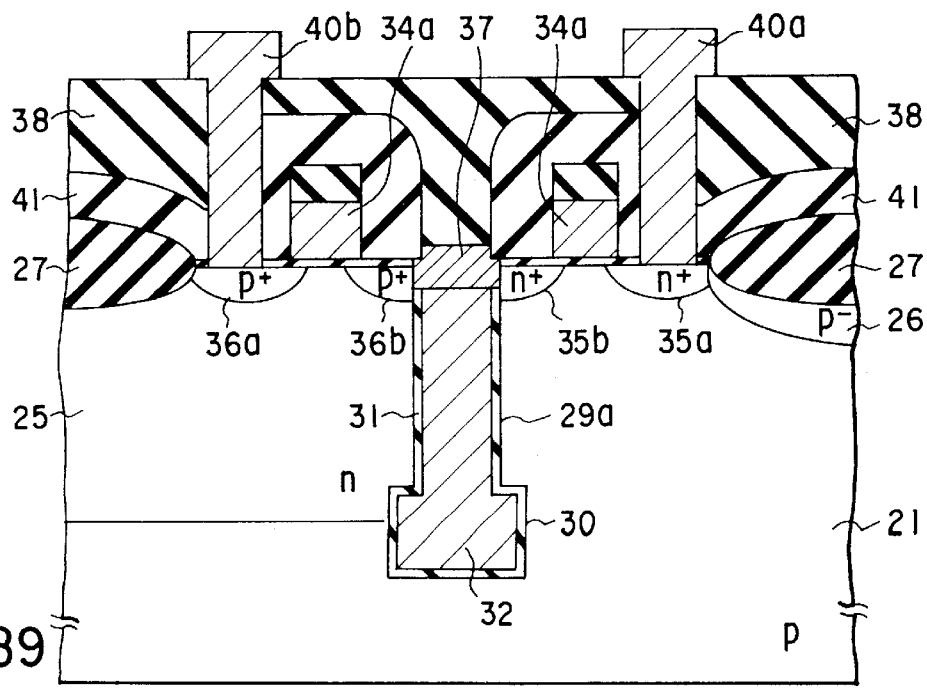
FIG. 89 is a sectional view taken along a line LXXXIX—LXXXIX in FIG. 88.

As shown in FIGS. 88 to 90, an insulating interlayer 38, e.g., a silicon oxide film, is formed on the entire surface of the silicon substrate 21. Contact holes 39a and 39b respectively reaching the sources 35a and 36b of the n- and p-channel MOS transistors are formed in the insulating interlayer 38. Metal wiring patterns 40a and 40b, e.g., aluminum wiring patterns, to be connected to the sources 36a and 36b of the MOS transistors are formed on the insulating interlayer 38. FIG. 89 is a sectional view taken along a line LXXXIX—LXXXIX in FIG. 88. FIG. 90 is a sectional view taken along a line XC—XC in FIG. 88. With this process, the CMOS inverter shown in FIGS. 42 to 44 is completed.

According to the method of manufacturing the CMOS inverter, since wiring patterns can be buried in the silicon substrate 21, the number of wiring patterns to be formed on the silicon substrate 21 can be reduced.

Note that in each of the fifth and sixth embodiments, the wiring layer 32 may be made of a silicide film, e.g., a tungsten silicide film, a polycide film formed by stacking a polysilicon film and a silicide film, or a metal film.

When the wiring layer 32 is made of a polysilicon film, a silicide film, or a polycide film, the wiring layer 32 can be directly connected to the drains 35b and 36b of the MOS transistors without forming the conductive layer 37.

The conductive film 37 may be made of a monocrystalline silicon film, a polysilicon film, a silicide film, a metal film, or the like. If the wiring layer 32 is a metal film, the conductive layer 37 may be made of a metal film.

[I] A semiconductor device according to the ninth embodiment of the present invention will be described in detail next.

Figure 91:
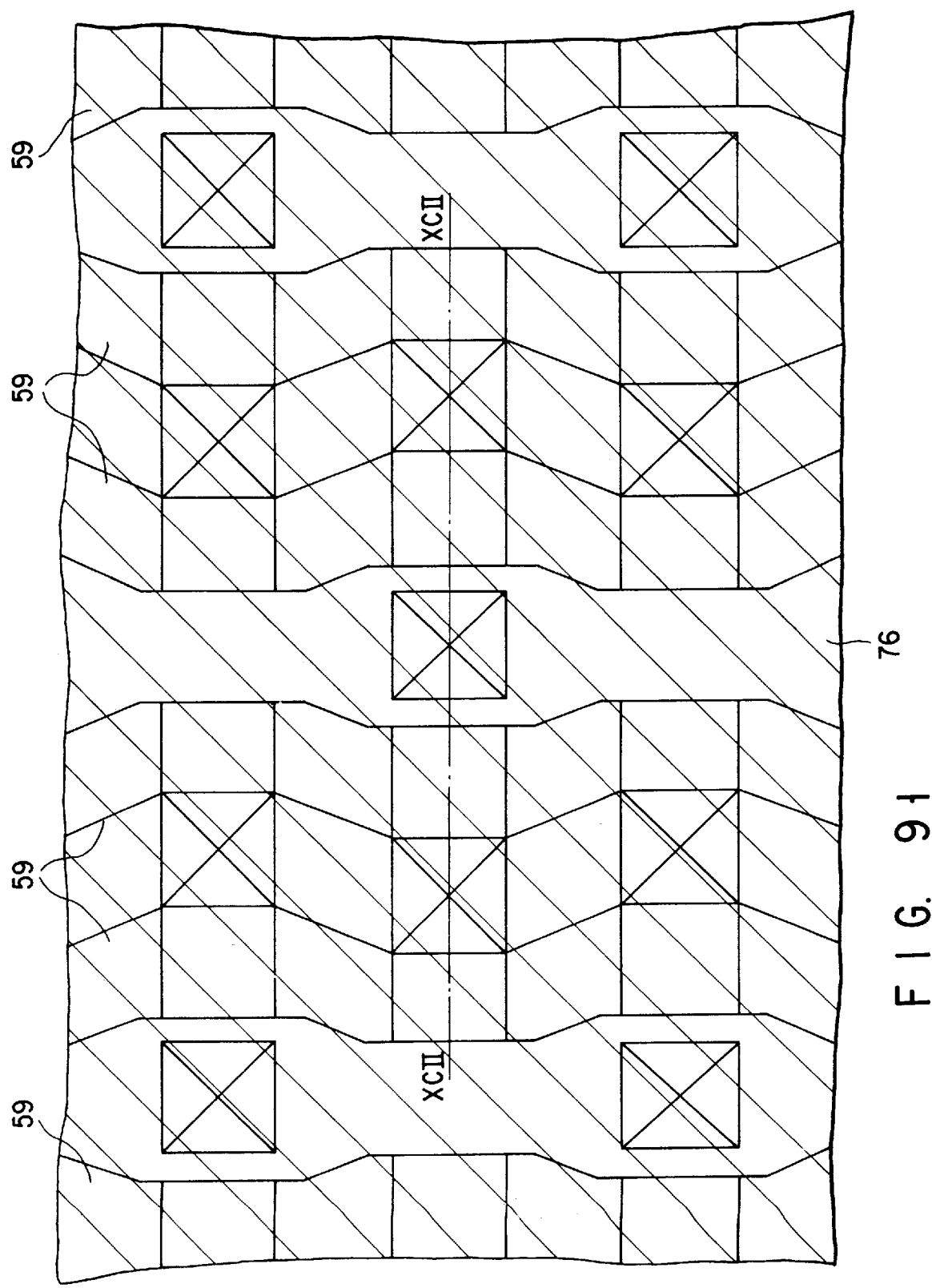
FIG. 91 is a plan view showing a semiconductor device according to the ninth embodiment of the present invention.
Figure 92:
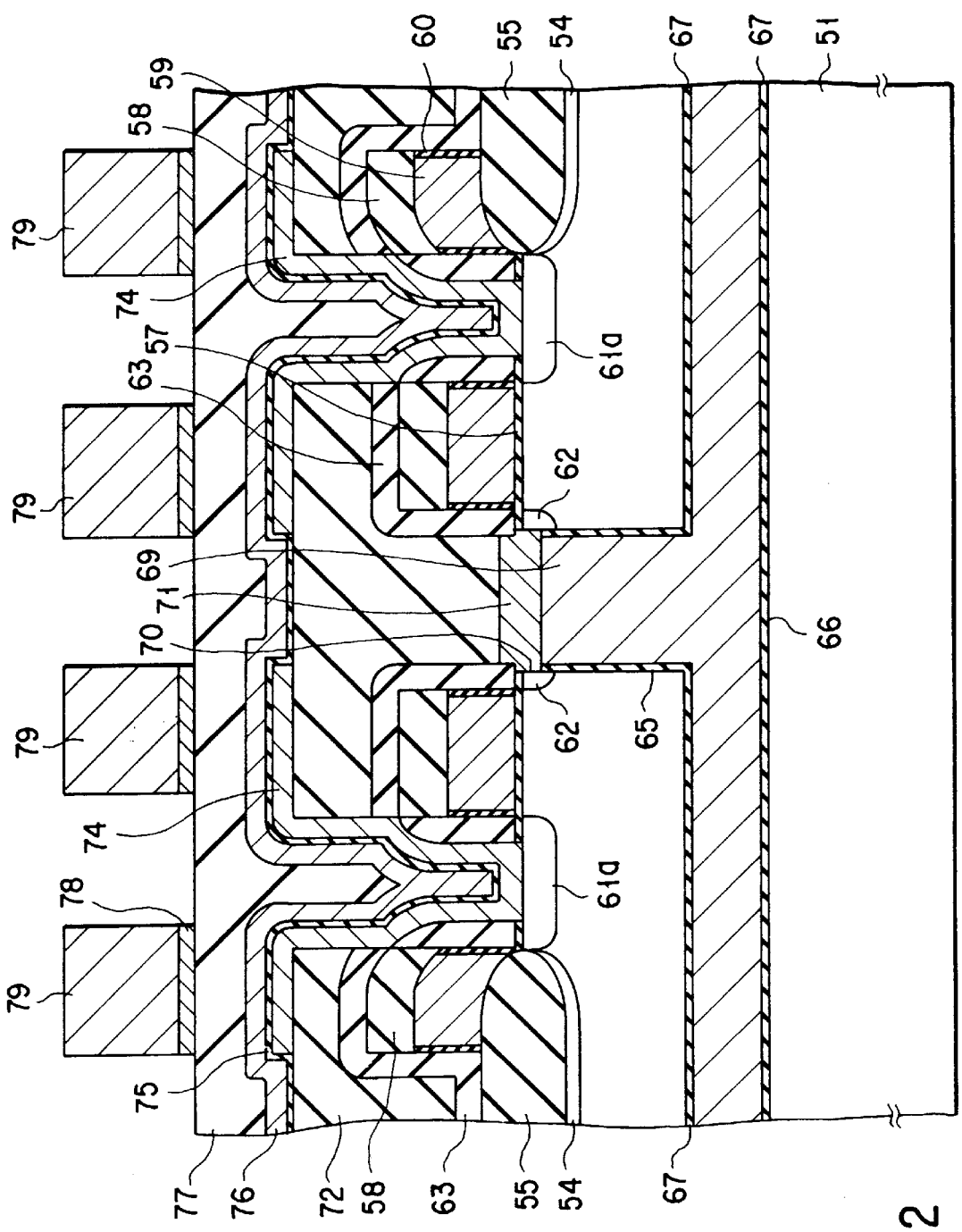
FIG. 92 is a sectional view taken along a line XCII—XCII in FIG. 91.

FIG. 91 shows a DRAM having a stacked capacitor according to the ninth embodiment of the present invention. FIG. 92 is a sectional view taken along a line XCII—XCII in FIG. 91.

An inversion preventing diffusion layer 54 and a field oxide film 55 are formed on a silicon substrate 51. Memory cell transistors are formed in an element region surrounded by the field oxide film 55.

Two memory cell transistors are formed in one element region. A contact hole 65 is formed in the silicon substrate 51 at a position between the two memory cell transistors. This contact hole 65 reaches a tunnel 66 in the silicon substrate 51. The tunnel 66 is linearly formed to be parallel to the surface of the silicon substrate 51.

A wiring layer 69 made of, e.g., phosphorous-doped polysilicon is completely buried in the contact hole 65 and the tunnel 66. This wiring layer 69 serves as a bit line.

The wiring layer 69 is connected to a drain 62 of a memory cell transistor via a conductive film 71 at the side surface of the upper portion of the contact hole 65.

A gate electrode 59 of the memory cell transistor is linearly formed to extend parallel to the surface of the silicon substrate 51 and perpendicular to the wiring layer 69. The gate electrode 59 serves as a word line.

A storage electrode 74 of a capacitor is formed on sources 61a and 61b of the memory cell transistors. The storage electrode 74 is arranged on a silicon oxide film 72 in consideration of only an alignment margin with respect to another storage electrode 74 adjacent thereto. That is, the storage electrode 74 can be arranged without considering the contact region between the drain 62 of the memory cell transistor and the wiring layer (bit line) 69. This is because the wiring layer 69 is formed in the silicon substrate 51.

A capacitor insulating film 75 is formed on the storage electrode 74 of the capacitor. A plate electrode 76 is formed on the capacitor insulating film 75. The plate electrode 76 can be formed on almost the entire surface of the silicon substrate 51. This is because the wiring layer 69 is formed in the silicon substrate 51.

A silicon oxide film 77 is formed on the plate electrode 76 of the capacitor. A wiring layer constituted by an aluminum-silicon film 79 and a barrier metal 78 is formed on the silicon oxide film 77.

According to the above arrangement, wiring layers are formed in the silicon substrate at arbitrary positions right under memory cell transistors. Therefore, the degree of freedom of the pattern of wiring layers formed on a silicon substrate and the like increases, and a device with a high integration density can be realized.

Especially, in a DRAM having a stacked capacitor, bit lines can be formed in a silicon substrate. Therefore, there is no need to ensure an alignment margin between a capacitor and a bit line contact portion, resulting in an increase in capacitor area.

[J] A method of manufacturing a semiconductor device according to the tenth embodiment of the present invention will be described in detail next. This embodiment exemplifies the method of manufacturing the semiconductor device according to the ninth embodiment.

FIGS. 93 to 110 show the method of manufacturing the semiconductor device according to the tenth embodiment of the present invention.

Figure 93:
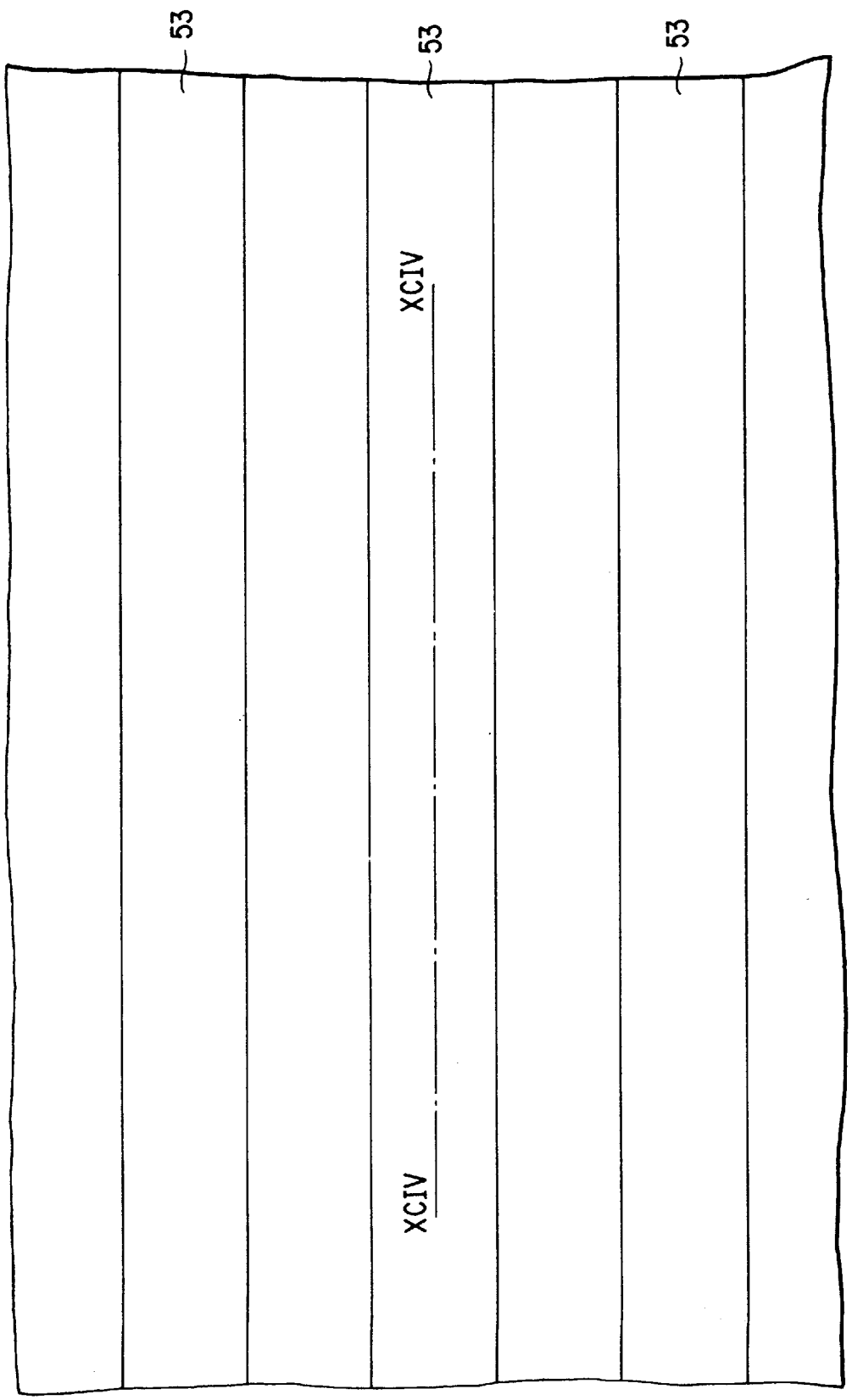
FIG. 93 is a plan view showing a step of a method of manufacturing a semiconductor device according to the tenth embodiment of the present invention.

As shown in FIGS. 93 and 94, a silicon oxide film ($SiO_2$) 52 is formed on a p-type silicon substrate 51 by thermal oxidation. A photoresist is formed on the silicon oxide film 52. The photoresist is then patterned.

Predetermined atoms, e.g., oxygen atoms, are implanted in the silicon substrate 51 by an ion implantation method using the photoresist as a mask to form a plurality of linear oxygen-implanted layers 53. The oxygen-implanted layers 53 are arranged to be parallel to each other. FIG. 94 is a sectional view taken along a line XCIV—XCIV in FIG. 93.

Figure 95:
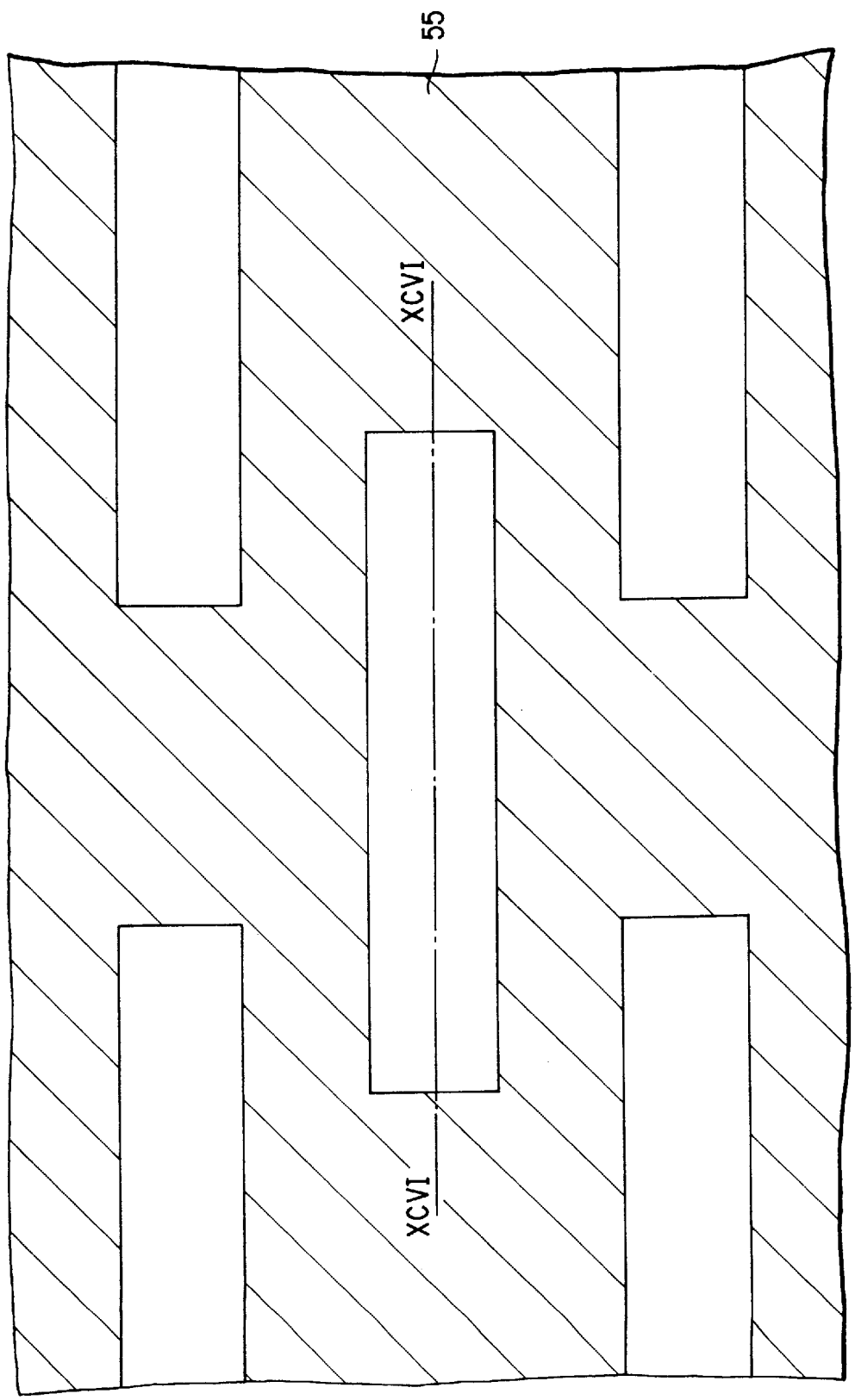
FIG. 95 is a plan view showing another step of the method of manufacturing the semiconductor device according to the tenth embodiment of the present invention.

As shown in FIGS. 95 and 96, after the photoresist and the silicon oxide film 52 are removed, a silicon oxide film is formed again on the silicon substrate 51 by thermal oxidation. In addition, a silicon nitride film is formed on the silicon oxide film. A photoresist is formed on the silicon nitride film. The photoresist is then patterned.

The silicon nitride film is etched by the dry etching method using the photoresist as a mask. Thereafter, a p-type impurity (e.g., boron) is implanted in the silicon substrate 51 by using the silicon oxide film as a mask.

When thermal oxidation is performed after the photoresist is removed, a p-type inversion preventing diffusion layer 54 is formed in the silicon substrate 51. Furthermore, a field oxide film 55 is formed on the inversion preventing diffusion layer 54. After this process, the silicon oxide film and the silicon nitride film are completely removed.

In this step, since oxygen atoms in the oxygen-implanted layer 53 are combined with silicon atoms in the silicon substrate 51, the oxygen-implanted layer 53 is converted into an $SiO_2$ layer 56. FIG. 96 is a sectional view taken along a line XCVI—XCVI in FIG. 95.

Figure 97:
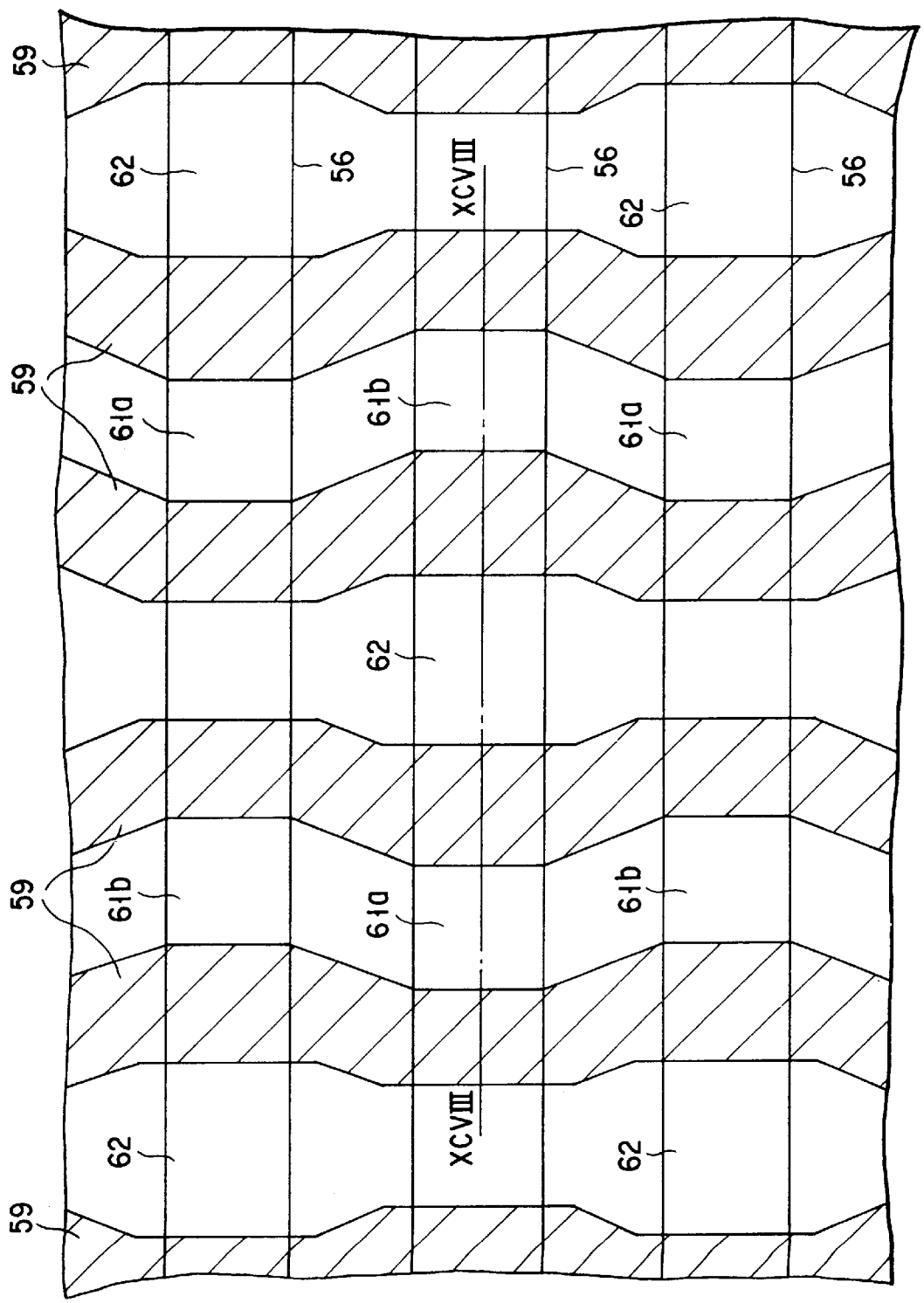
FIG. 97 is a plan view showing still another step of the method of manufacturing the semiconductor device according to the tenth embodiment of the present invention.
Figure 98:
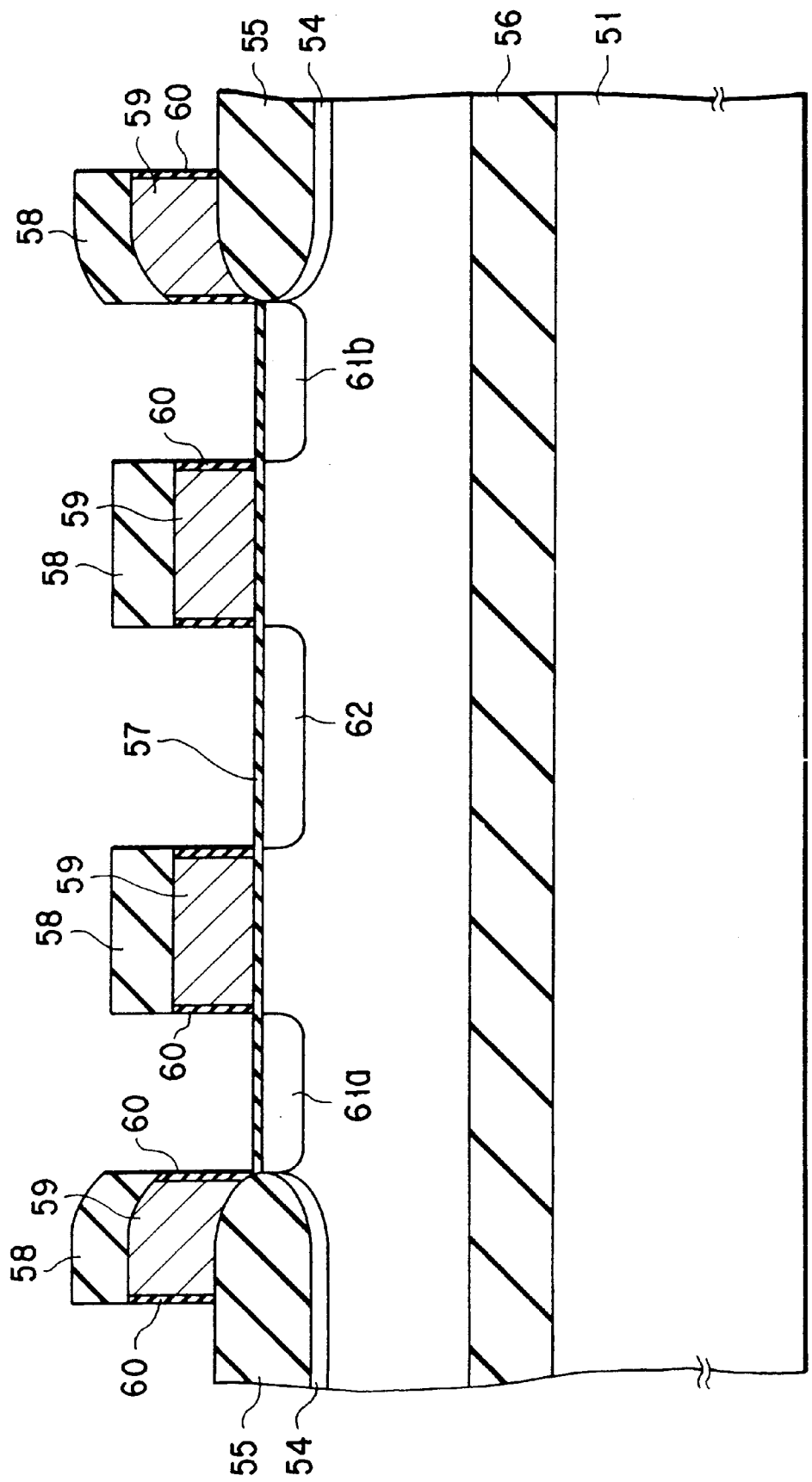
FIG. 98 is a sectional view taken along a line XCVIII—XCVIII in FIG. 97.

As shown in FIGS. 97 and 98, a gate oxide film 57 of a transistor is formed in an element region by thermal oxidation. A polysilicon doped with, e.g., phosphorous is formed on the resultant structure by an LPCVD method. Subsequently, a silicon nitride film ($Si_3N_4$) 58 is formed on the polysilicon film.

A photoresist is newly formed on the silicon nitride film 58. The photoresist is then patterned. The silicon nitride film 58 and the polysilicon film are etched by the dry etching method using the photoresist as a mask. As a result, a plurality of gate electrodes (word lines) 59 of transistors are formed. These gate electrodes 59 are arranged to be almost parallel to each other.

After the photoresist is removed, an n-type impurity (e.g., arsenic) is implanted in the silicon substrate 51 by using the silicon nitride film 58 and the gate electrodes 59 as masks. Thereafter, a silicon oxide film 60 is formed on the side surface of each gate electrode 59, and n-type sources 61a and 61b and an n-type drain 62 of transistors are formed in an element region of the silicon substrate 51. FIG. 98 is a sectional view taken along a line XCVIII—XCVIII in FIG. 97.

Figure 99:
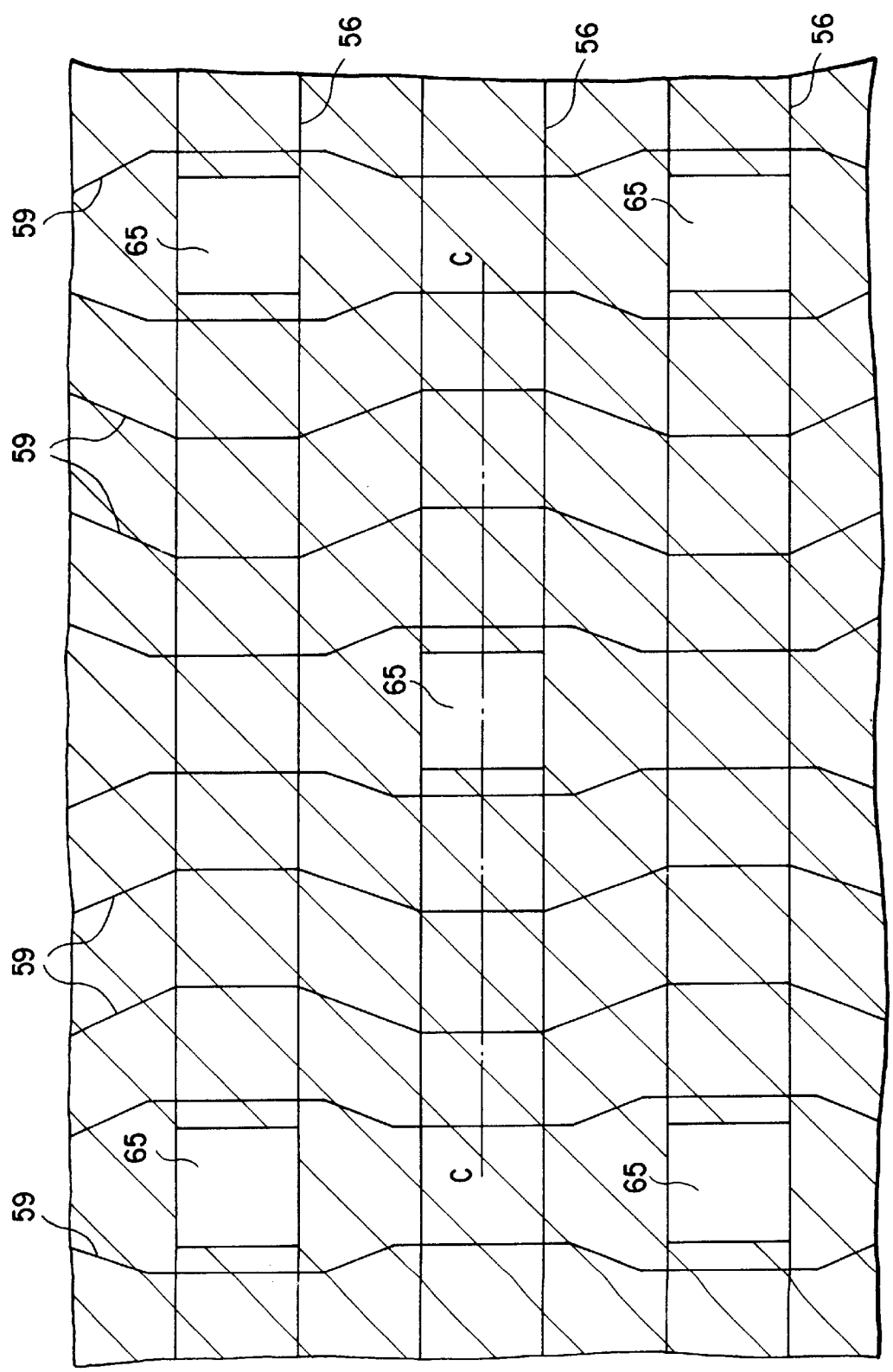
FIG. 99 is a plan view showing still another step of the method of manufacturing the semiconductor device according to the tenth embodiment of the present invention.
Figure 100:
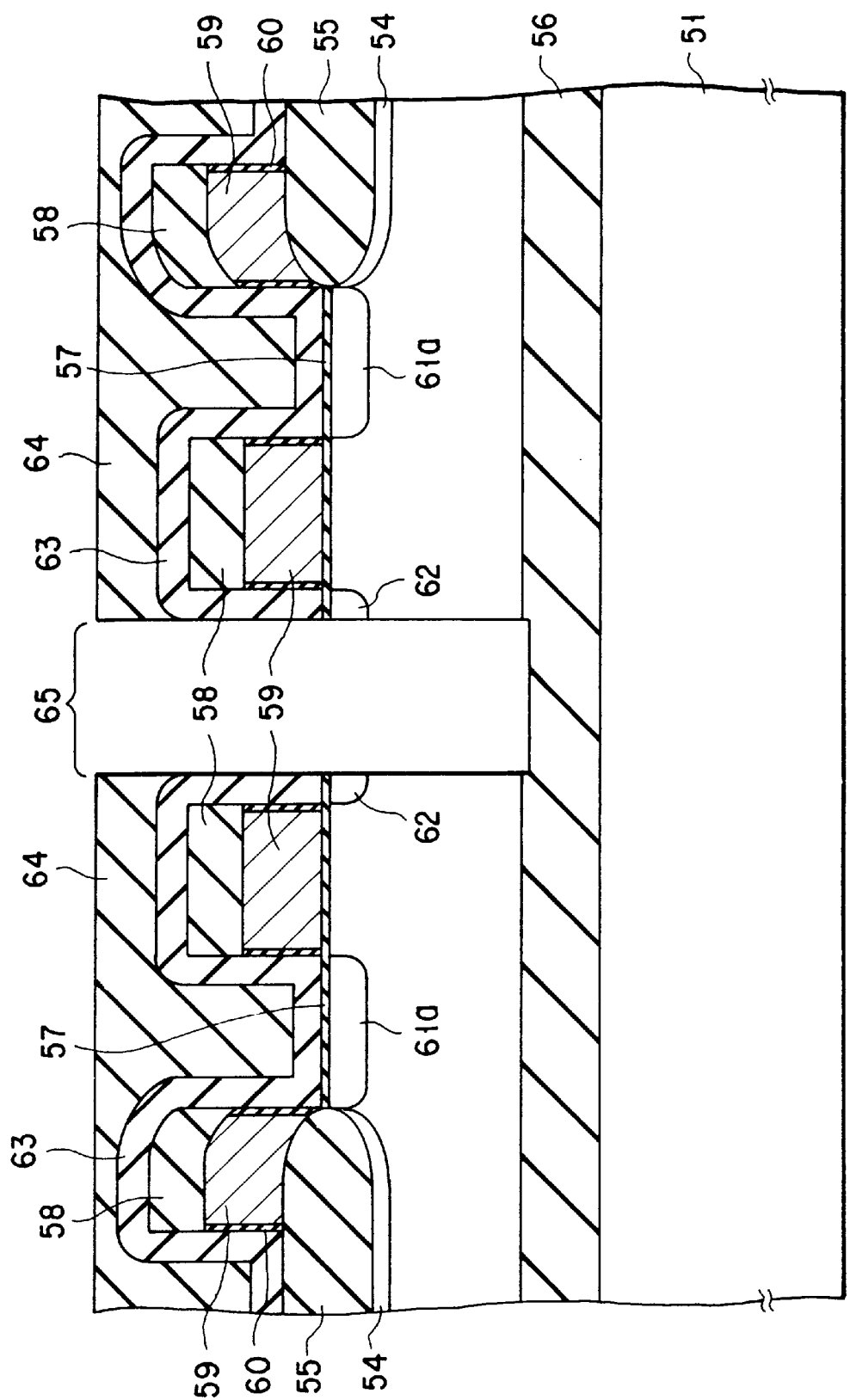
FIG. 100 is a sectional view taken along a line C—C in FIG. 99.

As shown in FIGS. 99 and 100, a silicon nitride film ($Si_3N_4$) 63 is formed on the resultant structure by the LPCVD method. A photoresist 64 is newly formed on the silicon nitride film 63. The photoresist 64 is then patterned. The silicon nitride film 63 and the silicon substrate 51 are etched by the dry etching method using the photoresist 64 as a mask to form a contact hole 65 extending through the drain 62 and reaching the $SiO_2$ layer 56. Thereafter, the photoresist 64 is removed. FIG. 100 is a sectional view taken along a line C—C in FIG. 99.

Figure 101:
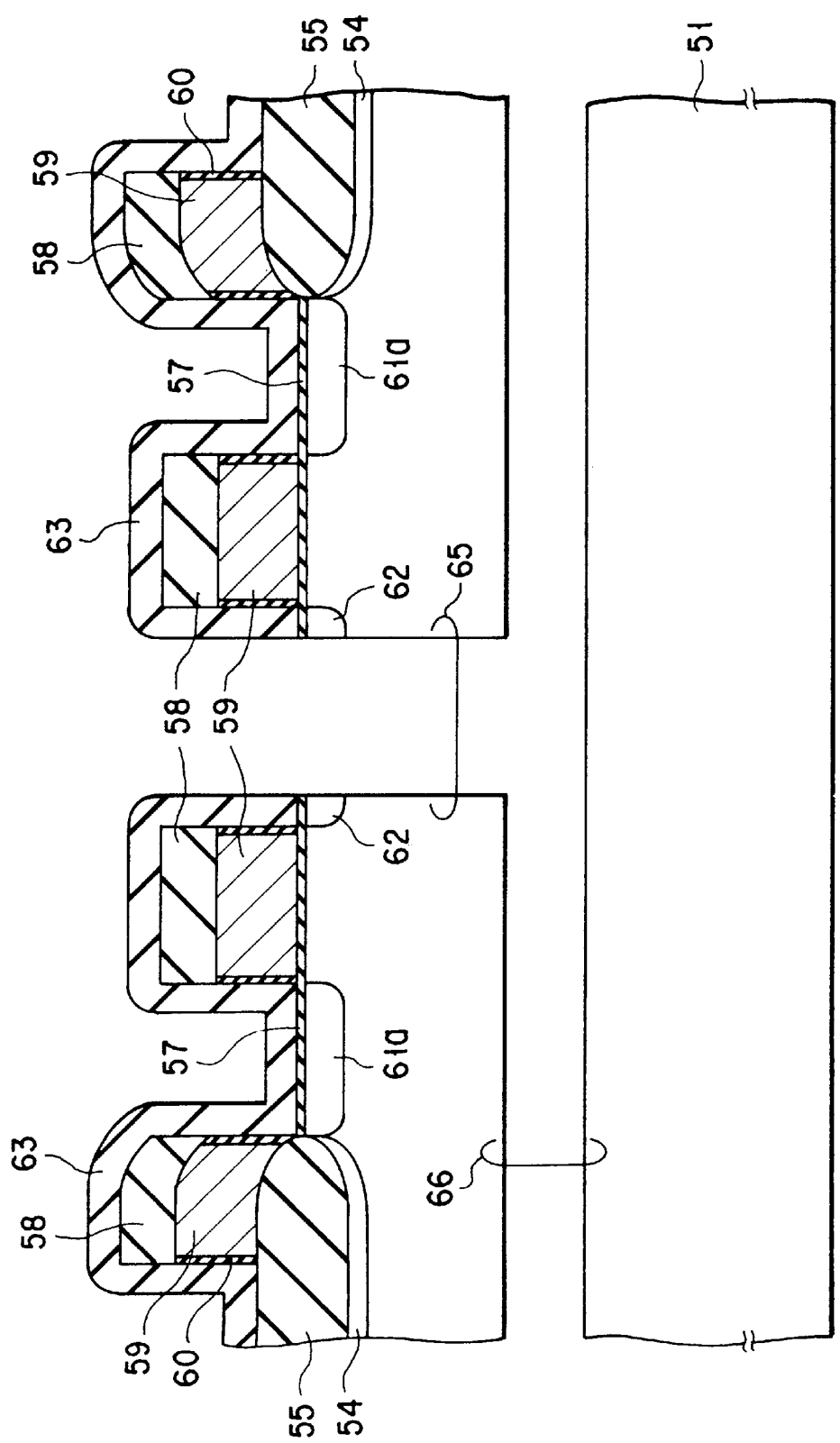
FIG. 101 is a sectional view showing still another step of the method of manufacturing the semiconductor device according to the tenth embodiment of the present invention.

As shown in FIG. 101, the $SiO_2$ layer 56 is selectively etched by, e.g., wet etching to form a tunnel 66 in the silicon substrate 51.

As shown in FIG. 102, a silicon oxide film 67 is formed on the inner surfaces of the contact hole 65 and the tunnel 66 by thermal oxidation. A polysilicon film 68 doped with, e.g., phosphorous is formed by the LPCVD method. This polysilicon film 68 is completely buried in the contact hole 65 and the tunnel 66.

Figure 103:
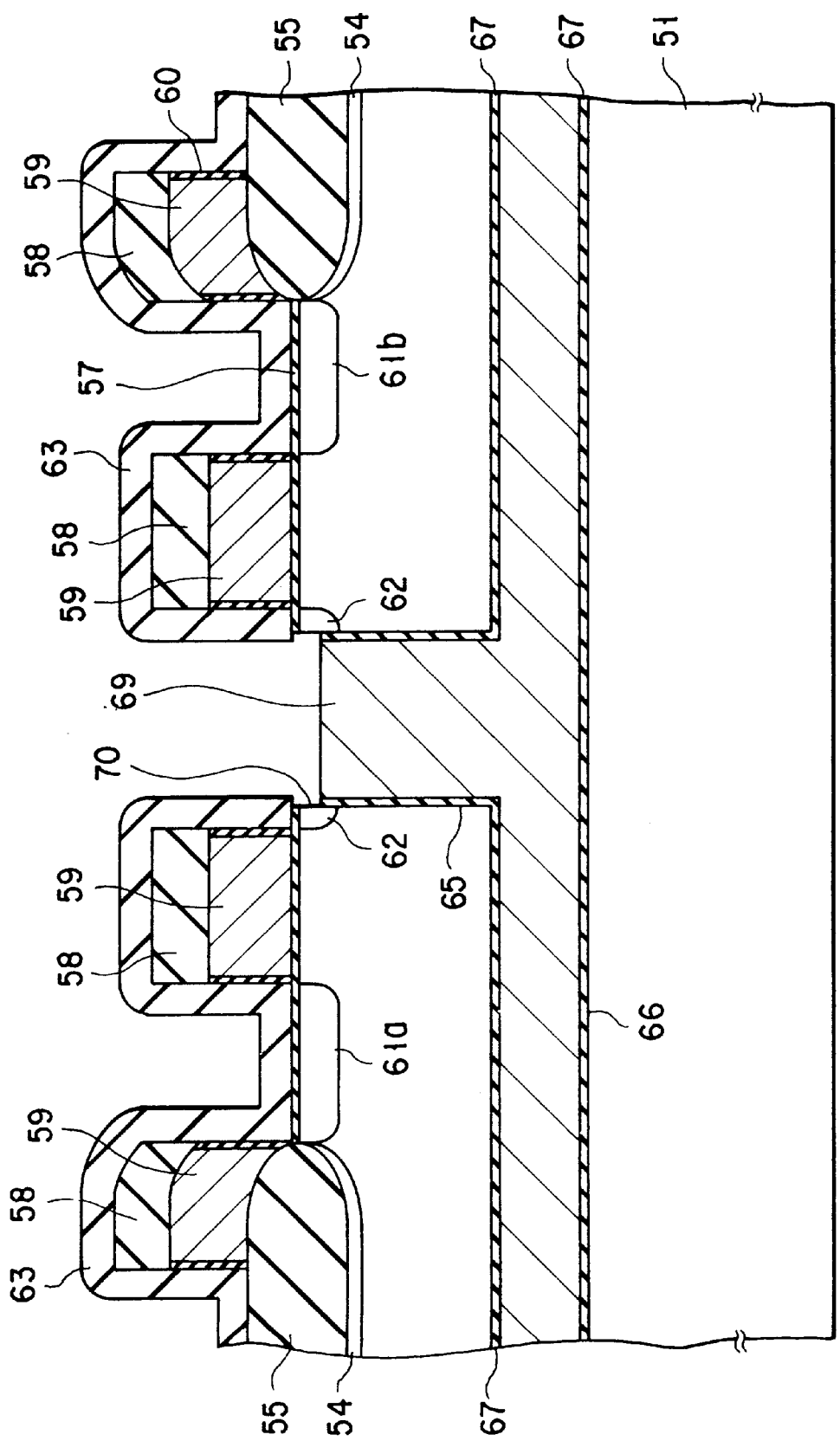
FIG. 103 is a sectional view showing still another step of the method of manufacturing the semiconductor device according to the tenth embodiment of the present invention.

As shown in FIG. 103, the polysilicon film 68 is etched back by, e.g., dry etching to form a wiring layer (bit line) 69 in the contact hole 65 and the tunnel 66. This etching back is performed to a position lower than the surface of the silicon substrate 51, e.g., a position between the surface of the silicon substrate 51 and the lower end of the drain 62.

Subsequently, the silicon oxide film 67 on the side wall of an upper portion of the contact hole 65 is selectively etched by, e.g., wet etching to form a contact hole 70. With this process, the drain 62 of the memory cell transistor is exposed to the side surface of the upper portion of the contact hole 65.

Figure 104:
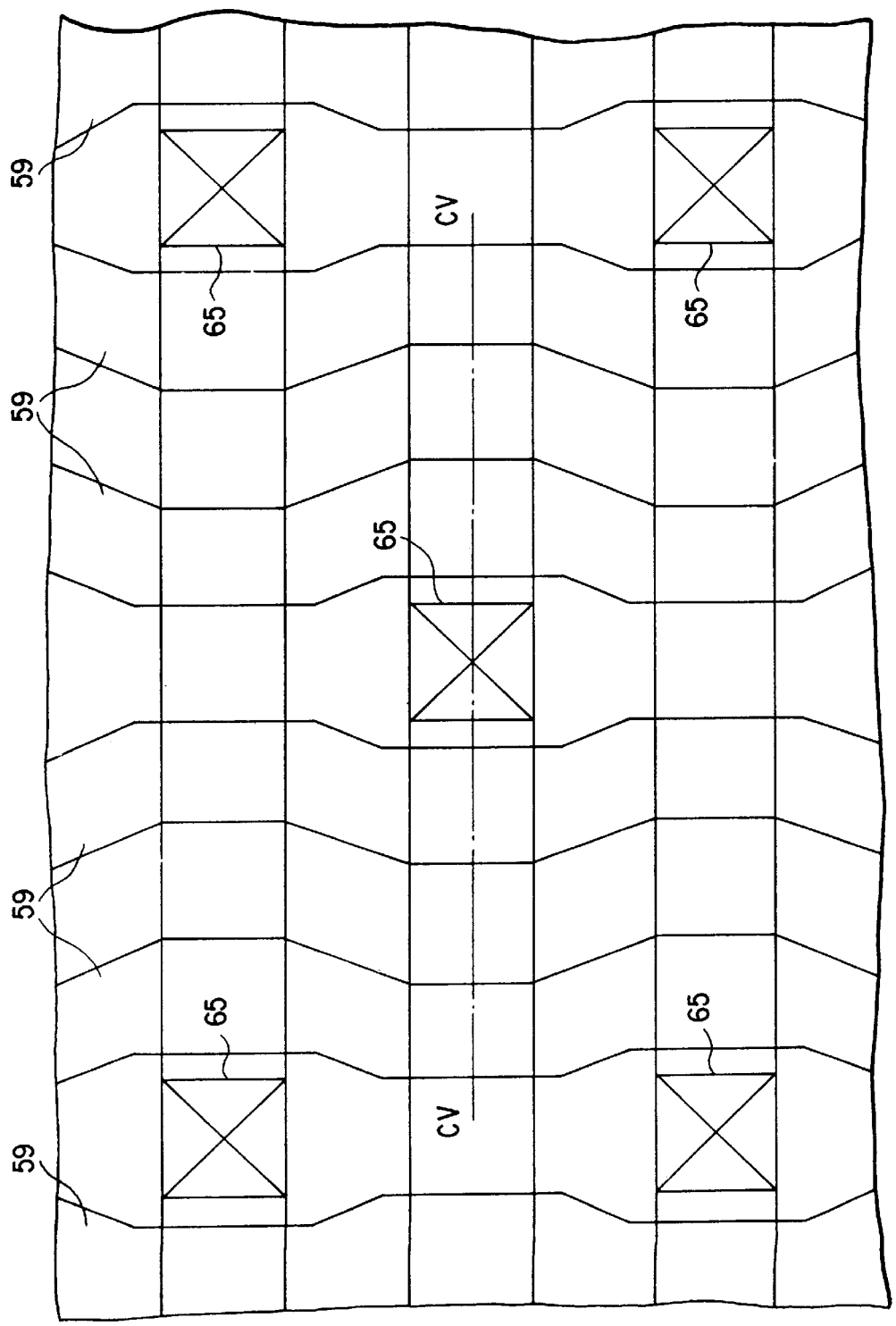
FIG. 104 is a plan view showing still another step of the method of manufacturing the semiconductor device according to the tenth embodiment of the present invention.
Figure 105:
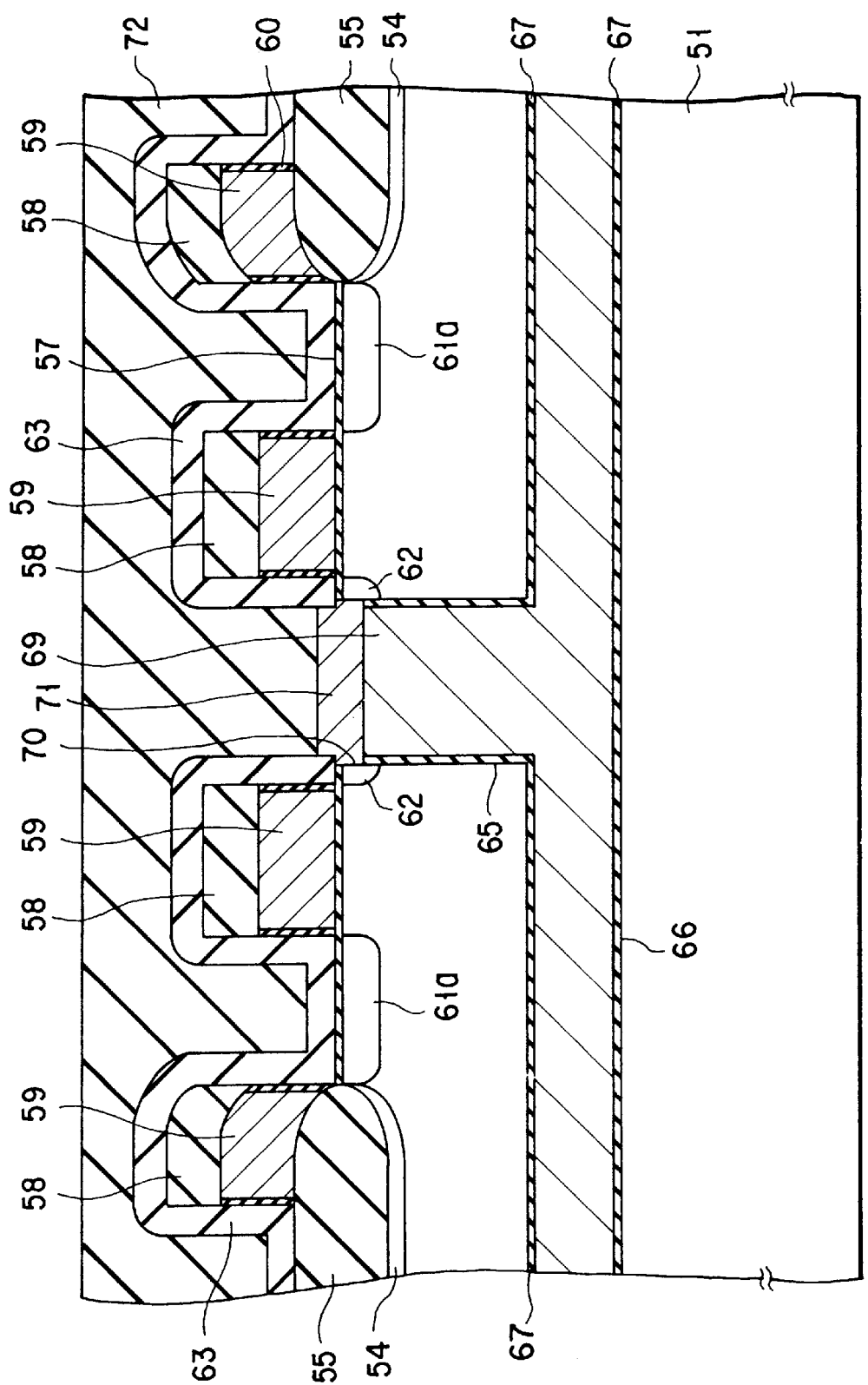
FIG. 105 is a sectional view taken along a line CV—CV in FIG. 104.

As shown in FIGS. 104 and 105, a wafer conductive film 71, e.g., a phosphorous-doped polysilicon film, is selectively formed on only the wiring layer 69 on the upper portion of the contact hole 65 by the LPCVD method. A silicon oxide film 72 is formed on the entire surface of the silicon substrate 51 by the LPCVD method. FIG. 105 is a sectional view taken along a line CV—CV in FIG. 104.

As shown in FIGS. 106 and 107, a photoresist is formed on the silicon oxide film 72. The photoresist is then patterned. The silicon oxide films 57 and 72 and the silicon nitride film 63 are etched by the dry etching method using this photoresist to form a contact hole 73 reaching the sources 61a and 61b of the memory cell transistors. Thereafter, the photoresist is removed.

A polysilicon is formed on the entire surface of the silicon substrate 51. A photoresist is newly formed on this polysilicon film. The photoresist is then patterned. The polysilicon is etched by the dry etching method using the photoresist to form a storage electrode (storage node) 74 of the capacitor of the memory cell transistor.

This storage electrode 74 can be arranged without considering the contact region between the drain 62 of the memory cell transistor and the wiring layer 69. This is because the wiring layer 69 is formed in the silicon substrate 51. Thereafter, the photoresist is removed. FIG. 107 is a sectional view taken along a line CVII—CVII in FIG. 106.

Figure 108:
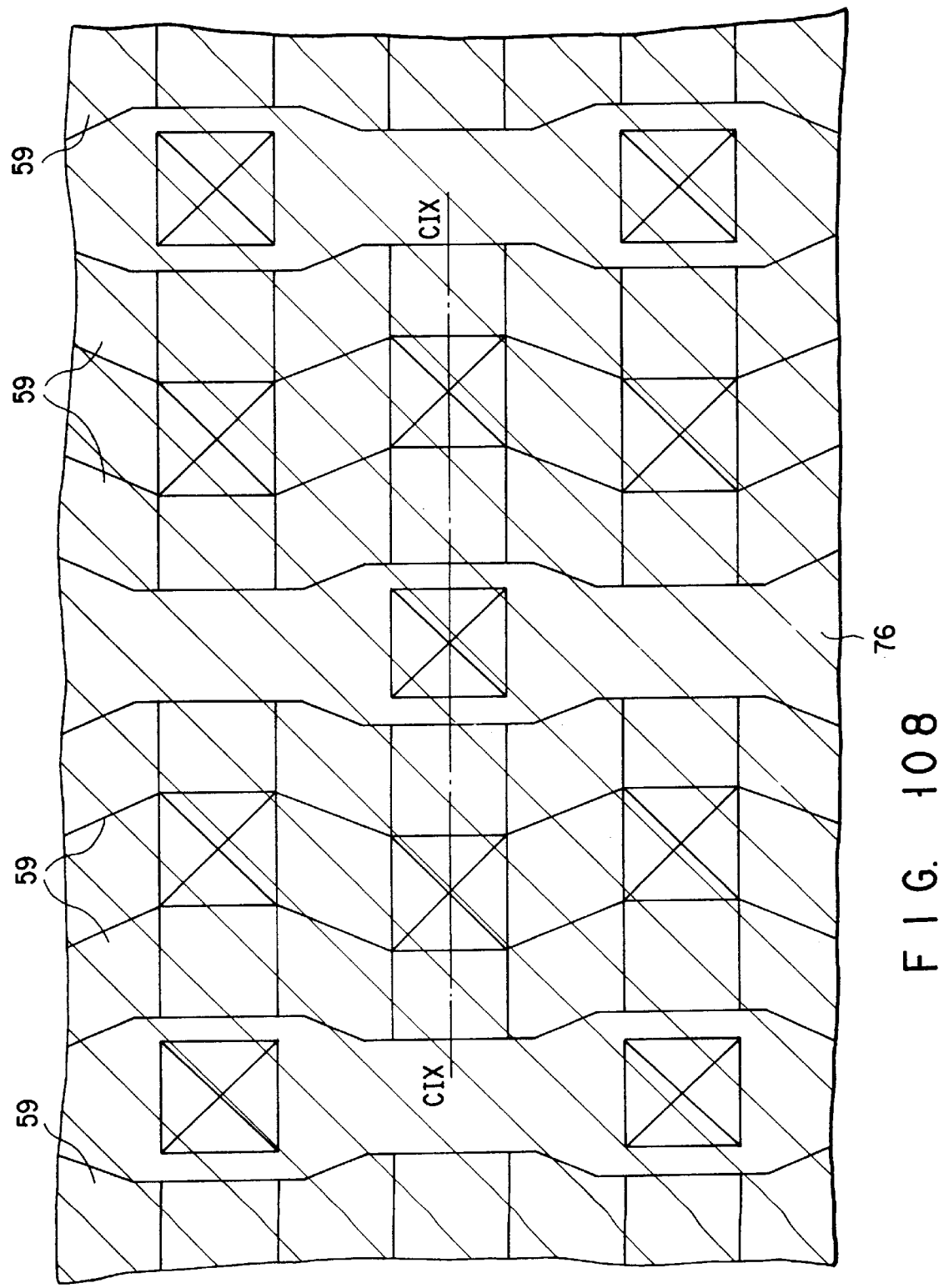
FIG. 108 is a plan view showing still another step of the method of manufacturing the semiconductor device according to the tenth embodiment of the present invention.
Figure 109:
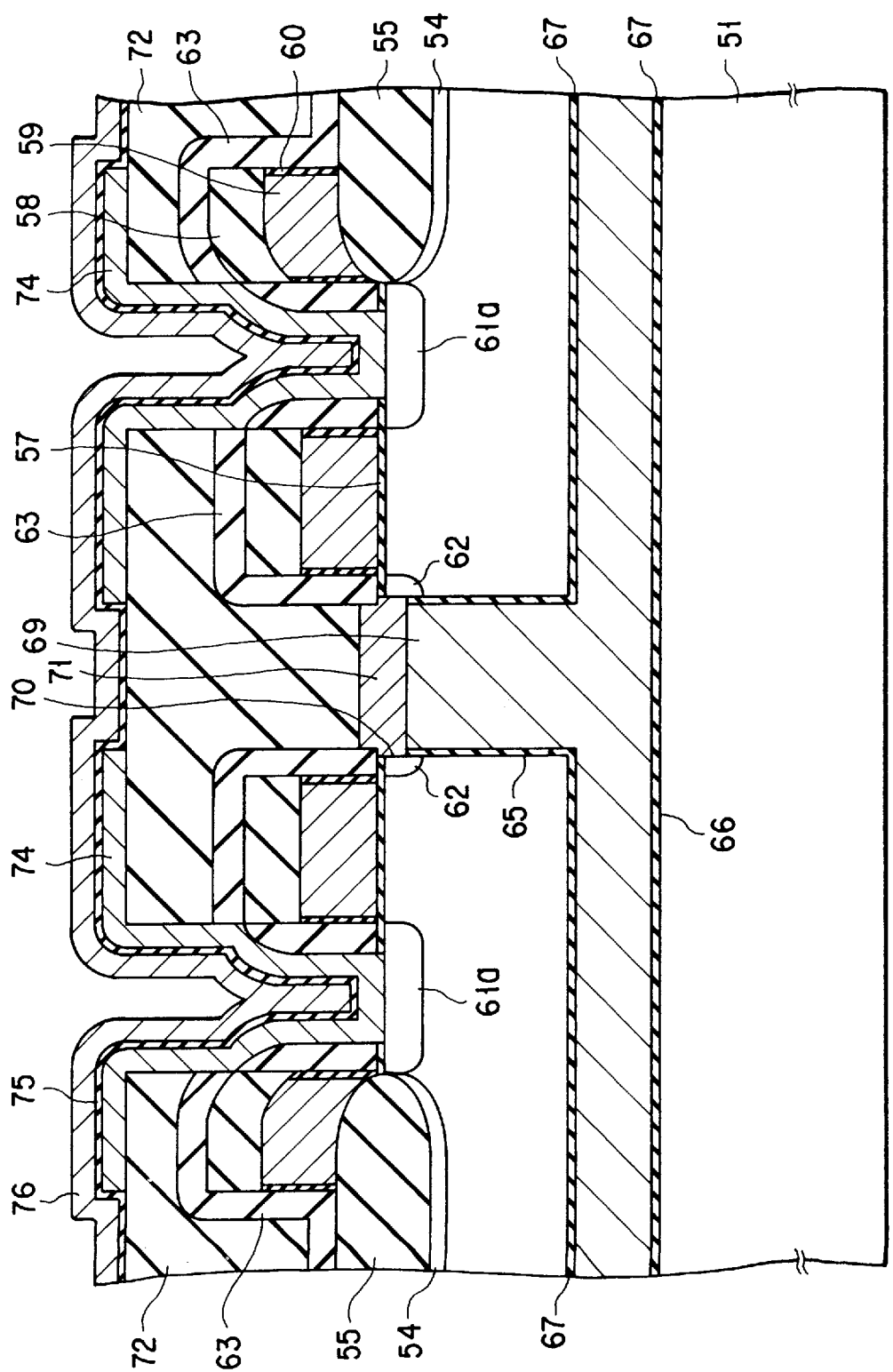
FIG. 109 is a sectional view taken along a line CIX—CIX in FIG. 108.

As shown in FIGS. 108 and 109, a capacitor insulating film 75, e.g., a multilayered film (NO film) composed of silicon nitride and silicon oxide layers, is formed on the storage electrode 74. In addition, a phosphorous-doped polysilicon film is formed on the entire surface of the silicon substrate 51 by the LPCVD method to form a plate electrode 76 of the capacitor of the memory cell transistor.

This plate electrode 76 can be arranged on the entire surface of the silicon substrate 51 without considering the contact region between the drain 62 of the memory cell transistor and the wiring layer 69. This is because the wiring layer 69 is formed in the silicon substrate 51. FIG. 109 is a sectional view taken along a line CIX—CIX in FIG. 108.

Figure 110:
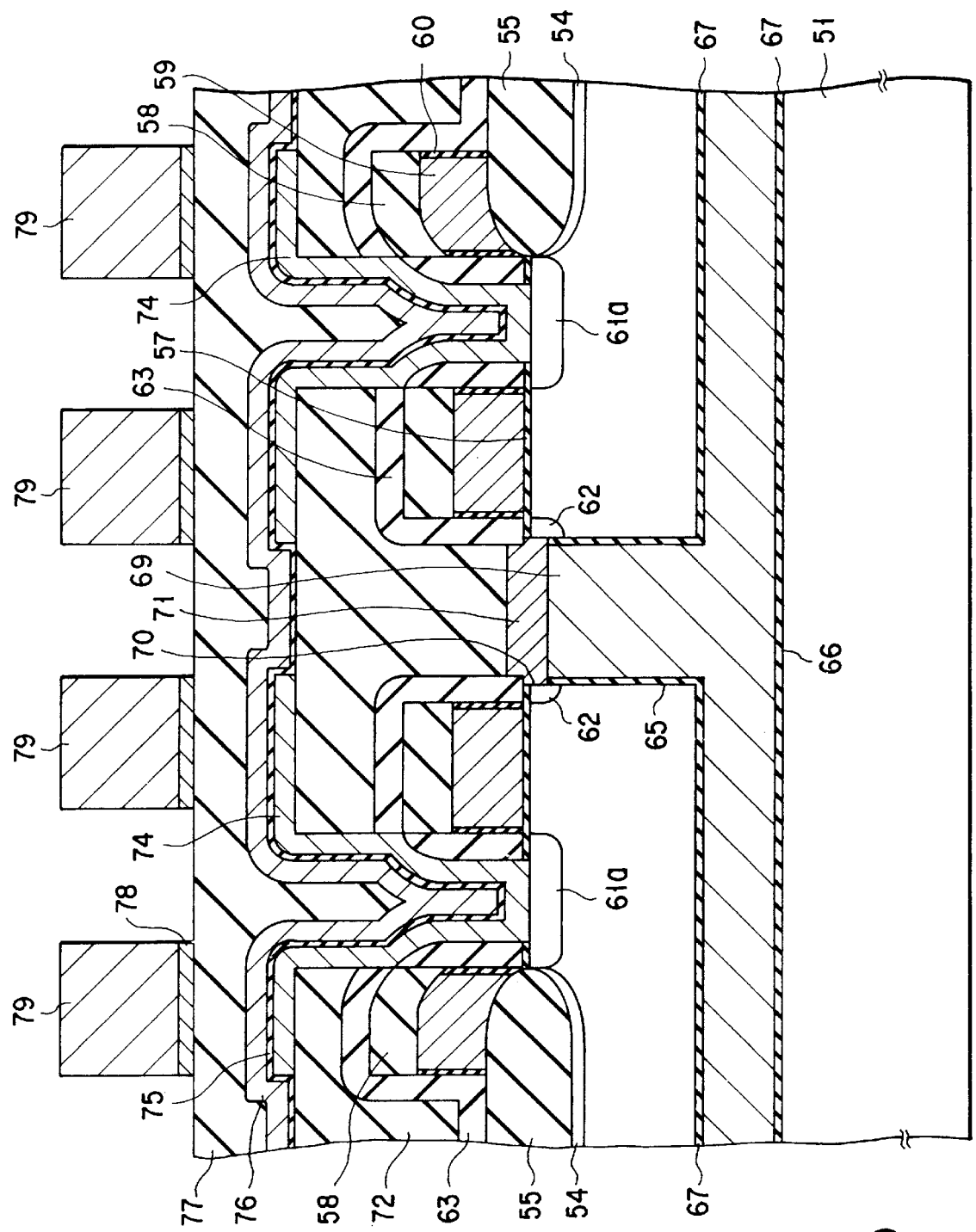
FIG. 110 is a sectional view showing still another step of the method of manufacturing the semiconductor device according to the tenth embodiment of the present invention.

As shown in FIG. 110, a silicon oxide film 77 is formed on the entire surface of the silicon substrate 51 by the LPCVD method, and a contact hole is formed at a predetermined position in the silicon oxide film 77. A barrier metal (e.g., a multilayered film composed of titanium and titanium nitride layers) 78 and an aluminum.silicon (Al.Si) film 79 are formed on the silicon oxide film 77.

A photoresist is formed on the aluminum.silicon film 79. The photoresist is then patterned. The aluminum.silicon film 79 and the barrier metal 78 are etched by the dry etching method using the photoresist as a mask to form a wiring layer. Thereafter, the photoresist is removed. With this process, the DRAM having the static capacitor shown in FIGS. 66 and 67 is completed.

In each of the ninth and tenth embodiments described above, the wiring layer 69 can be made of a polysilicon film doped with an impurity having a conductivity type opposite or identical to that of the silicon substrate 51, a silicide film, typically a tungsten silicide film, a polycide film formed by stacking polysilicon and silicide layers on each other, a metal film, or the like.

When the wiring layer 69 is to be made of a polysilicon film, a silicide film, or a polycide film, the conductive film 71 can be made of a monocrystalline silicon film, a polysilicon film, a silicide film, a metal film, or the like. If the wiring layer 69 is a metal film, the conductive film 71 can be made of a metal film.

In the above-described manufacturing method, a storage electrode 74 of the capacitor of a memory cell can be arranged without considering the contact portion between the drain of the memory cell transistor and the wiring layer. In addition, the plate electrode of the capacitor of the memory cell can be formed on the entire surface of the silicon substrate.

That is, in the DRAM formed by this manufacturing method, there is no need to ensure an alignment margin between a capacitor electrode and a bit line contact region, and a sufficiently large capacitor area can be ensured. Therefore, a decrease in cell capacity with an increase in the integration density (miniaturization) of elements can be prevented.

[K] A method of manufacturing a semiconductor device according to the eleventh embodiment of the present invention will be described next. This embodiment exemplifies the method of forming a multilayered wiring pattern in a semiconductor substrate.

FIGS. 111 to 122 show the method of manufacturing the semiconductor device according to the eleventh embodiment of the present invention.

Figure 111:
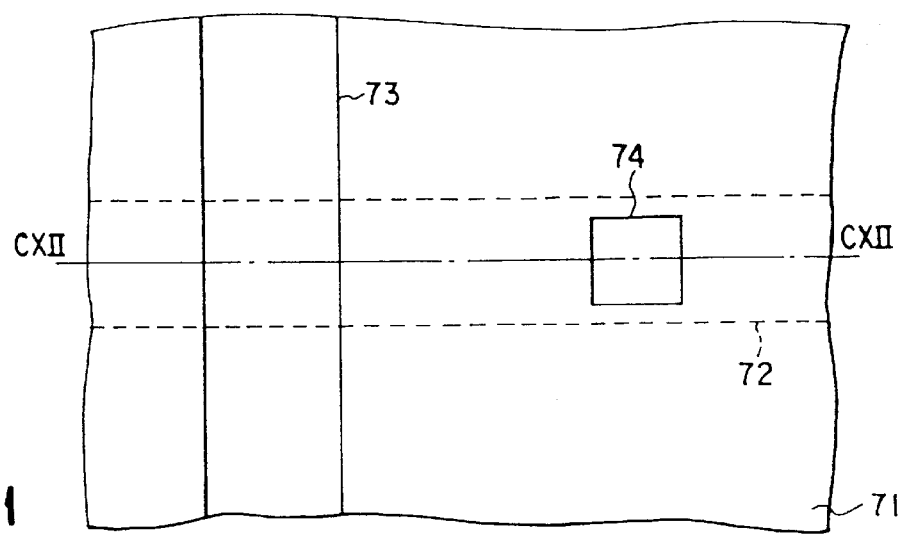
FIG. 111 is a plan view showing a step of a method of manufacturing a semiconductor device according to the eleventh embodiment of the present invention.
Figure 112:
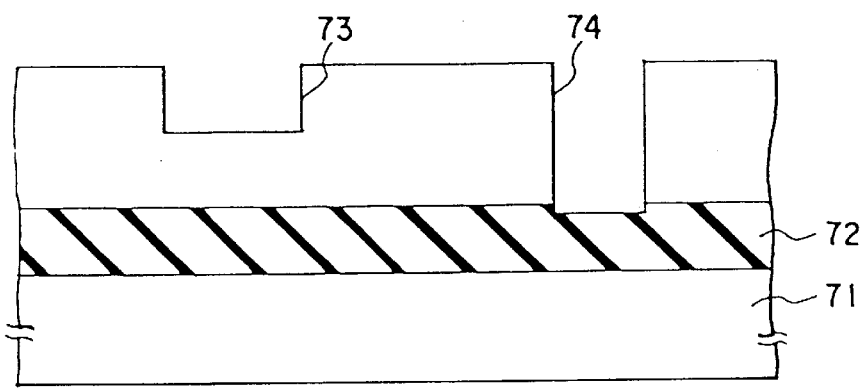
FIG. 112 is a sectional view taken along a line CXII—CXII in FIG. 111.

As shown in FIGS. 111 and 112, a silicon oxide film (SiO$_2$ film) is formed on a p-type silicon substrate 71 by thermal oxidation. A photoresist is formed on the silicon oxide film. The photoresist is then patterned.

Predetermined atoms, e.g., oxygen atoms, are implanted in the silicon substrate 71 by an ion implantation method using the photoresist as a mask to form an oxygen-implanted layer. After the photoresist is removed, annealing is performed to convert the oxygen-implanted layer into an SiO$_2$ layer 72.

A photoresist newly formed on the silicon oxide film. The photoresist is then patterned. The silicon substrate 71 is etched by the dry etching method using the photoresist as a mask to form a trench 73 in the silicon substrate 71. Thereafter, the photoresist is removed.

A photoresist is newly formed on the silicon oxide film. The photoresist is then patterned. The silicon substrate 71 is etched by the dry etching method to form a contact hole 74 reaching the SiO$_2$ layer 72 at a predetermined position. FIG. 112 is a sectional view taken along a line CXII—CXII in FIG. 111.

Figure 113:
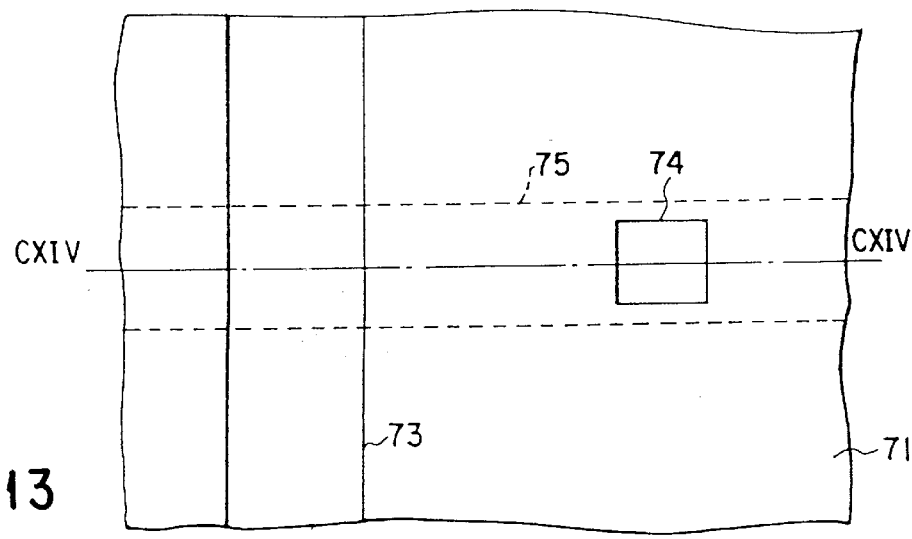
FIG. 113 is a plan view showing another step of the method of manufacturing the semiconductor device according to the eleventh embodiment of the present invention.
Figure 114:
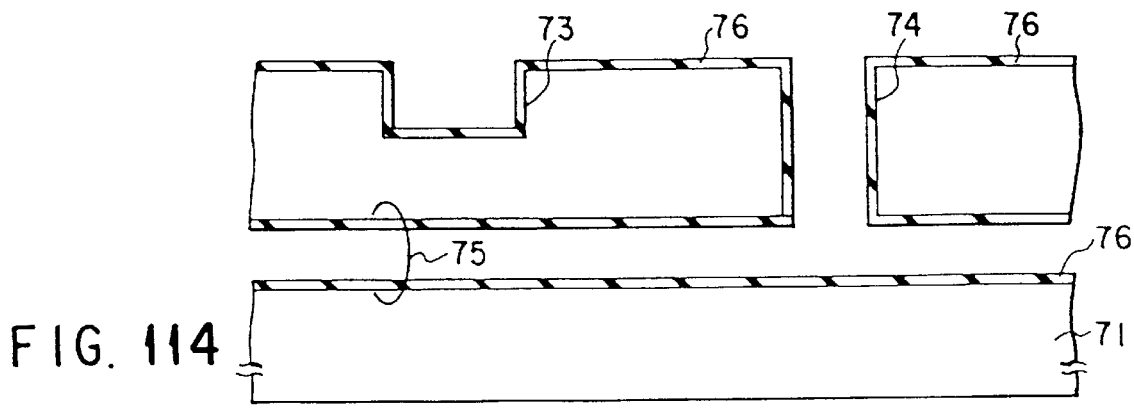
FIG. 114 is a sectional view taken along a line CXIV—CXIV in FIG. 113.

As shown in FIGS. 113 and 114, the photoresist and the silicon oxide film are removed. The SiO$_2$ layer 72 is then selectively etched by a wet etching method to form a tunnel 75 in the silicon substrate 71.

Silicon oxide films 76 are formed on the surface of the silicon substrate 71 and the inner surfaces of the trench 73, the contact hole 74, and the tunnel 75 by thermal oxidation. FIG. 114 is a sectional view taken along a ling CXIV—CXIV in FIG. 113.

Figure 115:
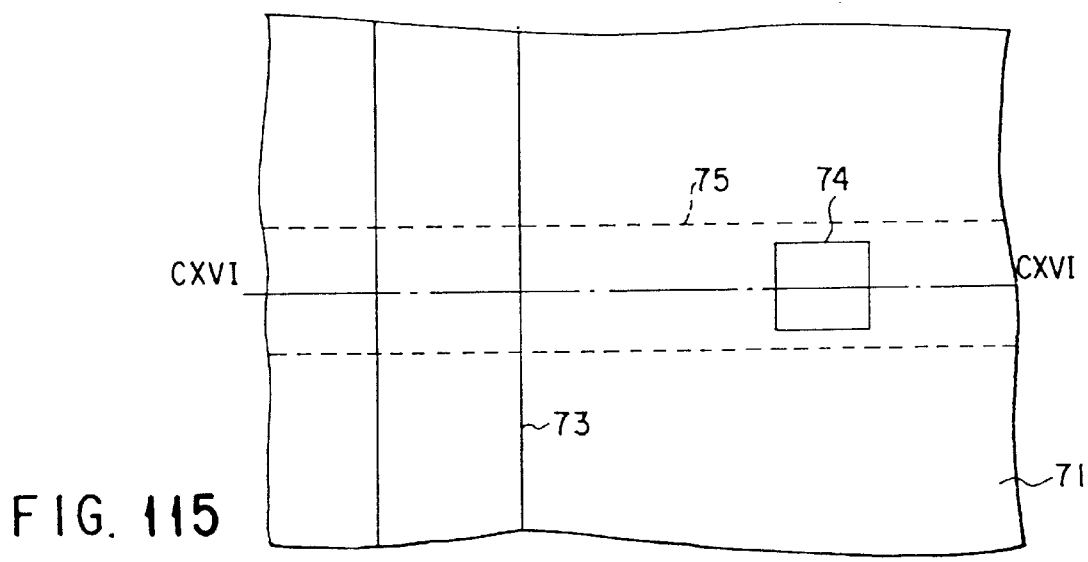
FIG. 115 is a plan view showing still another step of the method of manufacturing the semiconductor device according to the eleventh embodiment of the present invention.
Figure 116:
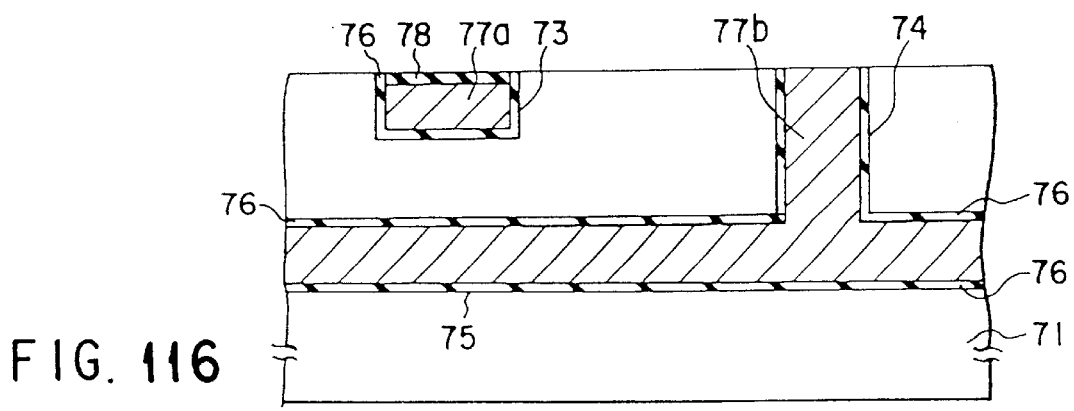
FIG. 116 is a sectional view taken along a line CXVI—CXVI in FIG. 115.

As shown in FIGS. 115 and 116, a conductive film, e.g., an aluminum film, is formed on the silicon substrate 71. This aluminum film is formed to completely fill the trench 73, the contact hole 74, and the tunnel 75.

The aluminum film is polished by a polishing method to form a first wiring layer 77a in the trench 73; and a second wiring layer 77b in the tunnel and the conduct hole. In addition, only the aluminum film in the trench 73 is etched such that the upper surface of the first wiring layer 77a is located closer to the silicon substrate 71 side than the surface of the silicon substrate 71 (e.g., about 0.05 μm away from the surface of the silicon substrate 71).

A silicon oxide film 78 is formed on the silicon substrate 71 by the LPCVD method. The silicon oxide film 78 is polished by a polishing method so as to be left in only the trench 73. FIG. 116 is a sectional view taken along a line CXVI—CXVI in FIG. 115.

Figure 117:
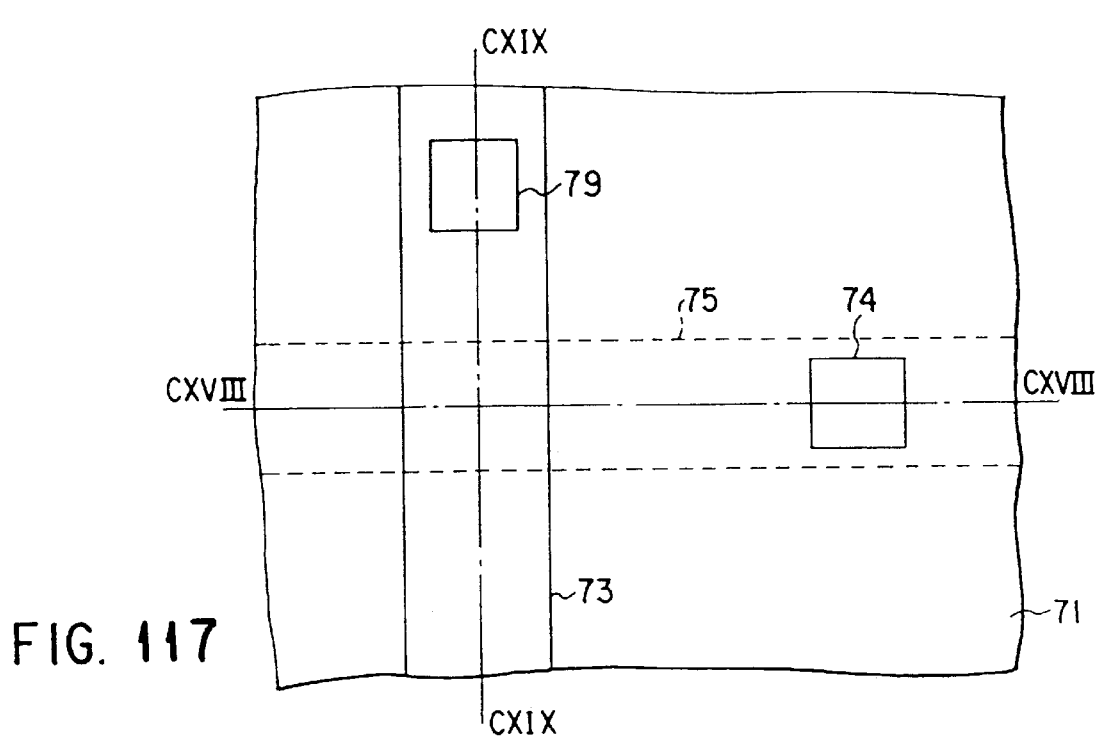
FIG. 117 is a plan view showing still another step of the method of manufacturing the semiconductor device according to the eleventh embodiment of the present invention.
Figure 118:
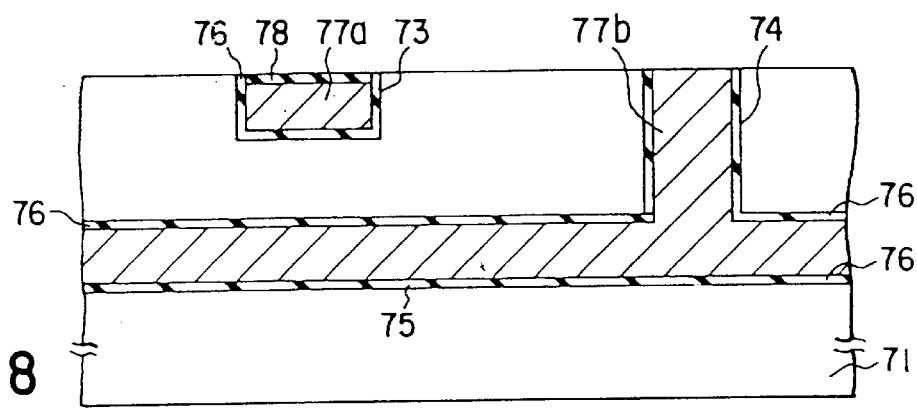
Figure 119:
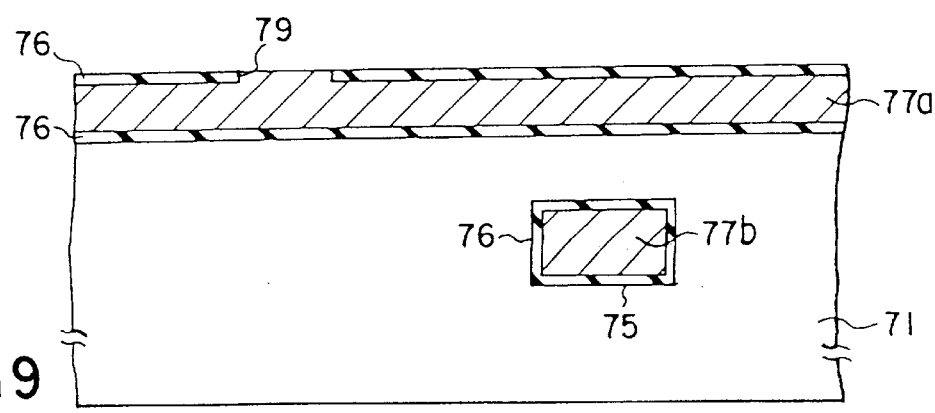

As shown in FIGS. 117 to 119, a contact hole 79 is formed in the silicon oxide film 78 on the first wiring layer 77a. An aluminum film is selectively formed in the contact hole 79. The position of the upper surface of the first wiring layer 77a in the contact hole 79 is aligned with that of the surface of the silicon substrate 71. FIG. 118 is a sectional view taken along a line CXVIII—CXVIII in FIG. 117. FIG. 119 is a sectional view taken along a line CXIX—CXIX in FIG. 117.

Figure 120:
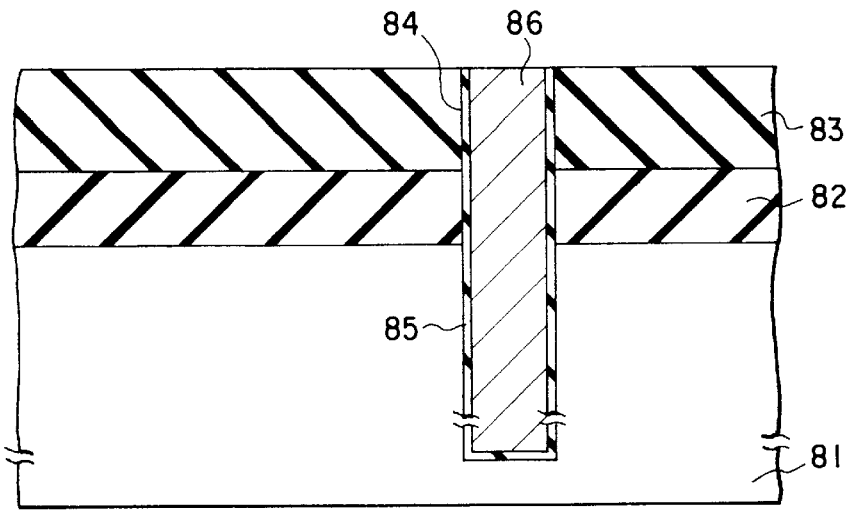

As shown in FIG. 120, a field oxide film 82 is formed on a silicon substrate 81 to separate the surface of the silicon substrate 81 into an element region and a field region. In the element region, a semiconductor element, e.g., a memory cell in the case of a DRAM, is formed.

After a semiconductor element is formed on the silicon substrate 81, the silicon oxide film 83 is formed on the entire surface of the silicon substrate 81.

A photoresist is formed on the silicon oxide film 83. The photoresist is then patterned. The silicon oxide film 83, the field oxide film 82, and the silicon substrate 81 are etched by the dry etching method using the photoresist as a mask to form a contact hole 84. The depth of this contact hole 84 is set to be, e.g., about 3 μm from the surface of the silicon substrate 81.

A silicon oxide film 85 is formed on the inner surface of the contact hole 84 by thermal oxidation. A conductive film 86, e.g., an aluminum film, is formed on the entire surface of the silicon substrate 81. This conductive film 86 is completely buried in the contact hole 84. The conductive film 86 is etched back to be left in only the contact hole 84.

Figure 121:
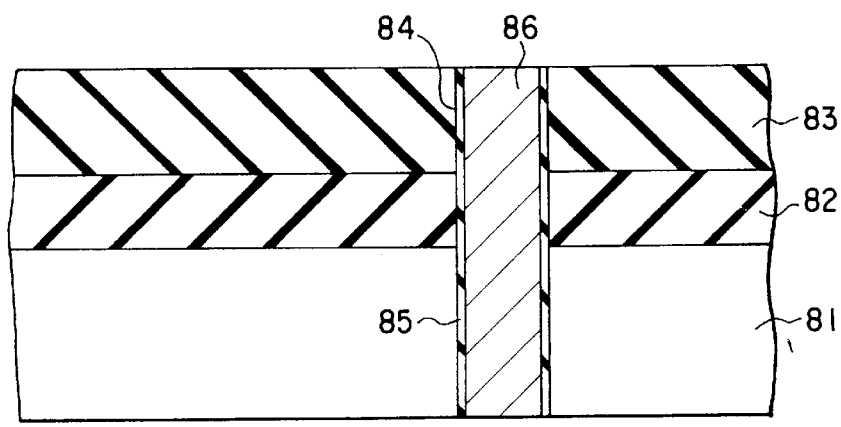

As shown in FIG. 121, the lower surface of the silicon substrate 81 is polished. With this process, the conductive film 86 in the contact hole. 84 is exposed on the lower surface of the silicon substrate 81.

Figure 122:
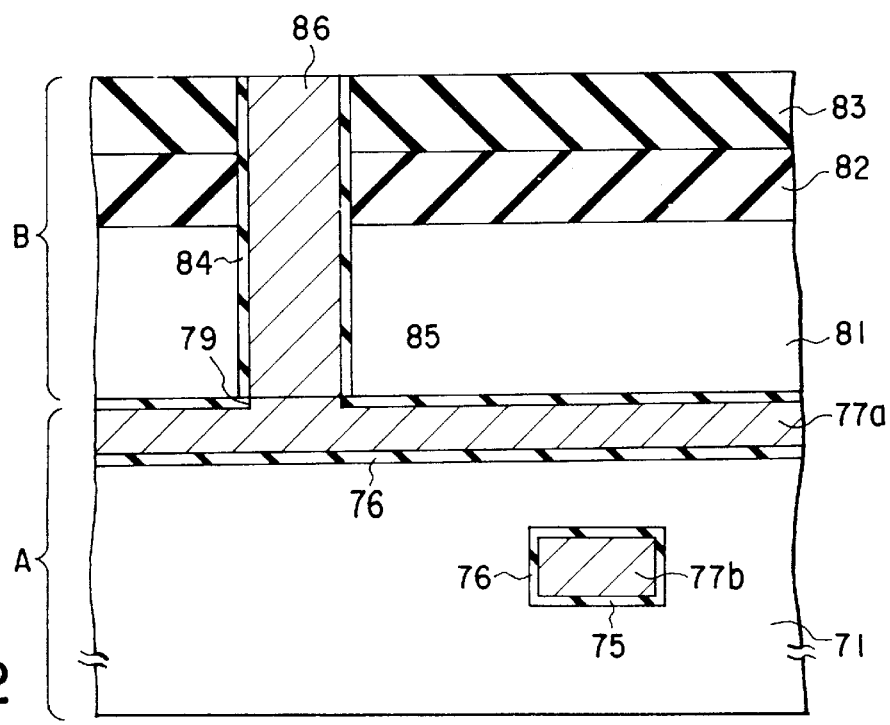

Subsequently, as shown in FIG. 122, a semiconductor device A in which only the wiring layers obtained in the steps shown in FIGS. 111 to 119 is formed is combined with a semiconductor device B having the semiconductor elements obtained in the steps shown in FIGS. 120 to 122. In this case, the first wiring layer 77a of the semiconductor device A is electrically connected to the conductive film in the contact hole 84 of the semiconductor device B.

In the eleventh embodiment, a polysilicon doped with a p- or n-type impurity, a silicide film, typically a tungsten silicide film, a polycide film formed by stacking polysilicon and silicide layers on each other, a metal film, or the like may be used for the wiring layers 77a and 77b and the conductive film 86.

According to the above manufacturing method, a multilayered wiring pattern can be formed in a silicon substrate. Therefore, the degree of freedom increases in terms of patterns, contributing to an increase in the integration density of elements.

[L] A semiconductor device according to the twelfth embodiment of the present invention will be described in detail next. Note that this embodiment is associated with the semiconductor device manufactured by the method of the eleventh embodiment.

FIGS. 123 to 125 show the semiconductor device according to the twelfth embodiment of the present invention. FIG. 123 is a sectional view of a central portion of a semiconductor chip. FIGS. 124 and 125 are sectional views of a peripheral portion of the semiconductor chip.

This semiconductor chip is constituted by two semiconductor devices A and B.

For example, the semiconductor device A is a DRAM. More specifically, an inversion preventing diffusion layer 54 and a field oxide film 55 are formed on a silicon substrate 81. Memory transistors are formed in an element region surrounded by the field oxide film 55.

Two memory cell transistors are formed in one element region. A gate electrode 59 of a memory cell transistor is linearly formed to extend parallel to the surface of the silicon substrate 81. The gate electrode 59 serves as a word line.

A storage electrode 74 of a capacitor is formed on sources 61a and 61b of the memory cell transistors. A capacitor insulating film 75 is formed on the storage electrode 74 of the capacitor. A plate electrode 76 is formed on the capacitor insulating film 75.

A silicon oxide film 77 is formed on the plate electrode 76 of the capacitor. A contact hole reaching a drain 62 is formed in the silicon oxide film 77. A bit line 90 is formed on the silicon oxide film 77 to be in electrical contact with the drain 62. A silicon oxide film 91 is formed on the bit line 90.

For example, the semiconductor device B has only a wiring layer. More specifically, a linear trench 73 is formed in a surface region of a silicon substrate 71. A silicon oxide film 76 is formed on the inner surface of the trench 73. Polysilicon doped with, e.g., phosphorous is buried in the trench 73 to form a first wiring layer 77a. A silicon oxide film 78 is formed on the first wiring layer 77a.

A tunnel 75 is formed in the silicon substrate 71. A silicon oxide film 76 is formed on the inner surface of the tunnel 75. A conductive film, e.g., a phosphorous-doped polysilicon film, is buried in the tunnel 75 to form a second wiring layer 77b.

Contact holes 84a and 84b are formed in the peripheral portion of the semiconductor chip. The contact holes 84a and 84b serve to connect elements (e.g., transistors constituted word and bit line selection circuits) formed in the semiconductor device A to the first and second wiring layers 77a and 77b of the semiconductor device B.

A silicon oxide film 85 is formed on the inner surface of the contact hole 84a. A conductive film, e.g., a phosphorous-doped polysilicon film, is buried in the contact hole 84a.

With this structure, a metal wiring pattern 93 of the semiconductor device A is electrically connected to the first wiring layer 77a of the semiconductor device B.

A silicon oxide film 76 is formed on the inner surface of the contact hole 84b. A conductive film, e.g., a phosphorous-doped polysilicon film, is buried in the contact hole 84b. With this structure, a meal wiring pattern 93 of the semiconductor device B is electrically connected to the second wiring layer 77b of the semiconductor device B.

In the twelfth embodiment, a polysilicon film doped with a p- or n-type impurity, a silicide film, typically a tungsten silicide film, a polycide film formed by stacking a polysilicon film and a silicide film, a metal film, or the like may be used for the first and second wiring layers 77a and 77b.

According to the above arrangement, a multilayered wiring pattern can be formed in a silicon substrate. Therefore, the degree of freedom increases in terms of patterns, contributing to an increase in the integration density of elements.

[M] A method of manufacturing a semiconductor device according to the thirteenth embodiment of the present invention will be described next. This embodiment exemplifies the method of forming a multilayered wiring pattern in a semiconductor substrate.

FIGS. 126 to 137 show the method of manufacturing the semiconductor device according to the thirteenth embodiment of the present invention.

Figure 126:
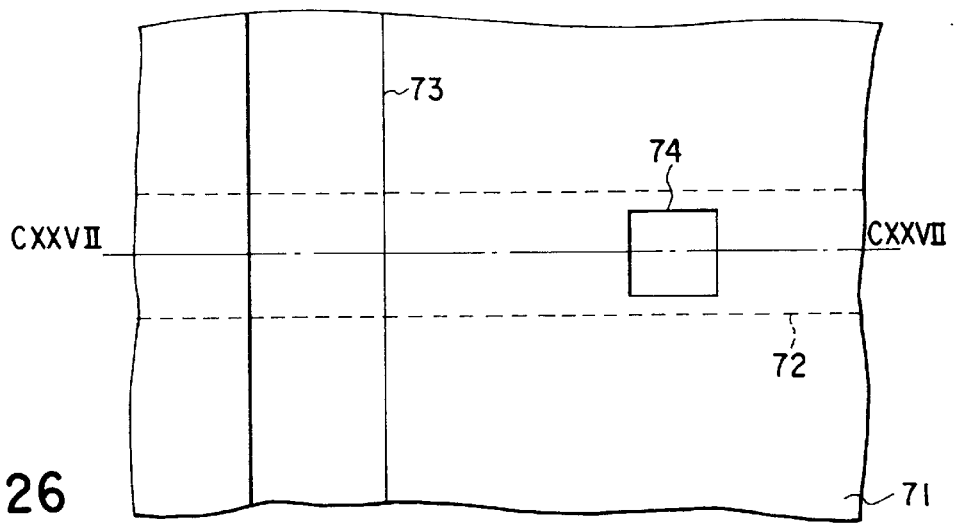
Figure 127:
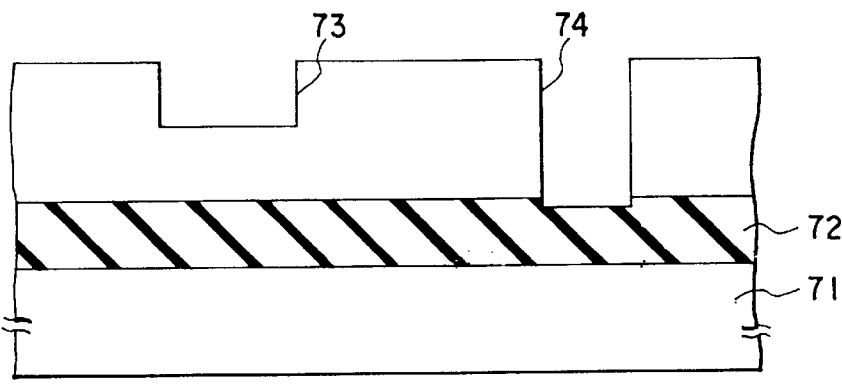

As shown in FIGS. 126 and 127, a silicon oxide film ($SiO_2$ film) is formed on a p-type silicon substrate 71 by thermal oxidation. A photoresist is formed on the silicon oxide film. The photoresist is then patterned.

Predetermined atoms, e.g., oxygen atoms, are implanted in the silicon substrate 71 by an ion implantation-method using the photoresist as a mask to form an oxygen-implanted layer. After the photoresist is removed, annealing is performed to convert the oxygen-implanted layer into an $SiO_2$ layer 72.

A photoresist newly formed on the silicon oxide film. The photoresist is then patterned. The silicon substrate 71 is etched by the dry etching method using the photoresist as a mask to form a trench 73 in the silicon substrate 71. Thereafter, the photoresist is removed.

A photoresist is newly formed on the silicon oxide film. The photoresist is then patterned. The silicon substrate 71 is etched by the dry etching method to form a contact hole 74 reaching the $SiO_2$ layer 72 at a predetermined position. FIG. 127 is a sectional view taken along a line CXXVII—CXXVII in FIG. 126.

Figure 128:
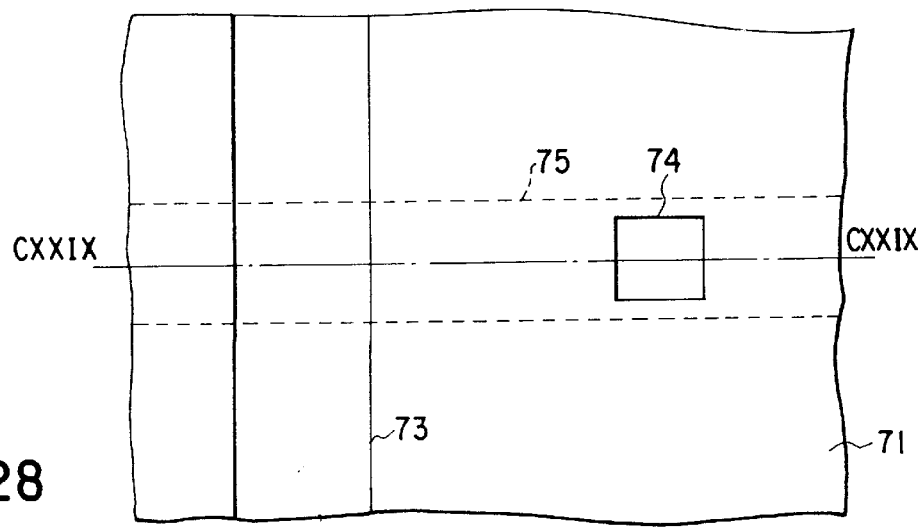
Figure 129:
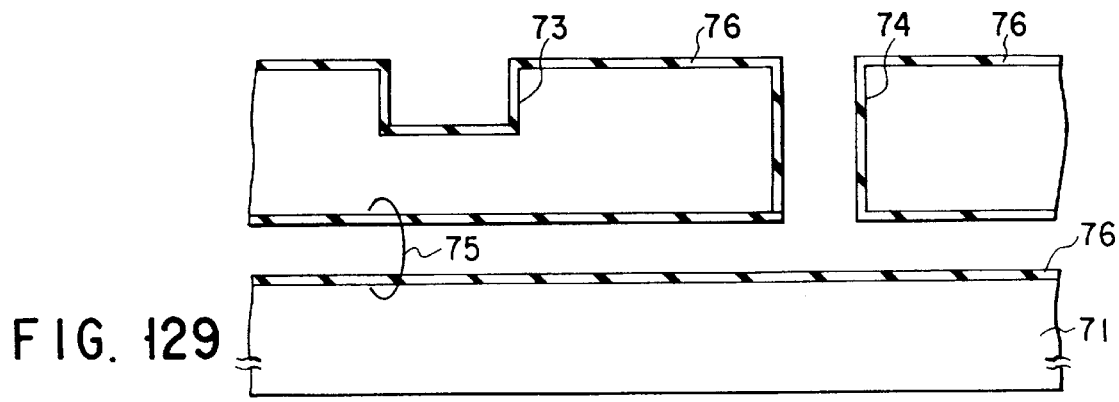

As shown in FIGS. 128 and 129, the photoresist and the silicon oxide film are removed. The $SiO_2$ layer 72 is then selectively etched by a wet etching method to form a tunnel 75 in the silicon substrate 71.

Silicon oxide films 76 are formed on the surface of the silicon substrate 71 and the inner surfaces of the trench 73, the contact hole 74, and the tunnel 75 by thermal oxidation. FIG. 129 is a sectional view taken along a ling CXXIX—CXXIX in FIG. 128.

As shown in FIGS. 130 and 131, a conductive film, e.g., an aluminum film, is formed on the silicon substrate 71. This aluminum film is formed to completely fill the trench 73, the contact hole 74, and the tunnel 75.

The aluminum film is polished by a polishing method to form a first wiring layer 77a in the trench 73; and a second wiring layer 77b in the tunnel and the conduct hole. In addition, only the aluminum film in the trench 73 is etched such that the upper surface of the first wiring layer 77a is located closer to the silicon substrate 71 side than the surface of the silicon substrate 71 (e.g., about 0.05 μm away from the surface of the silicon substrate 71).

A silicon oxide film 78 is formed on the silicon substrate 71 by the LPCVD method. The silicon oxide film 78 is polished by a polishing method so as to be left in only the trench 73. FIG. 131 is a sectional view taken along a line CXXI in FIG. 130.

As shown in FIGS. 132 to 134, a contact hole 79 is formed in the silicon oxide film 78 on the first wiring layer 77a. An aluminum film is selectively formed in the contact hole 79. The position of the upper surface of the first wiring layer 77a in the contact hole 79 is aligned with that of the surface of the silicon substrate 71. FIG. 133 is a sectional view taken along a line CXXXIII—CXXXIII in FIG. 132. FIG. 134 is a sectional view taken along a line CXXXIV—CXXXIV in FIG. 132.

As shown in FIG. 135, a field oxide film 82 is formed on a silicon substrate 81 to separate the surface of the silicon substrate 81 into an element region and a field region. In the element region, a semiconductor element, e.g., a memory cell in the case of a DRAM, is formed. After a semiconductor element is formed on the silicon substrate 81, the silicon oxide film 83 is formed on the entire surface of the silicon substrate 81.

As shown in FIG. 136, the lower surface of the silicon substrate 81 is polished.

As shown in FIG. 137, a semiconductor device A in which only the wiring layers obtained in the steps shown in FIGS. 126 to 134 are formed is combined with a semiconductor device B having the semiconductor element obtained in the steps shown in FIGS. 135 and 136.

Subsequently, a photoresist is formed on the silicon oxide film 83. The photoresist is then patterned. The silicon oxide film 83, the field oxide film 82, and the silicon substrate 81 are etched by the dry etching method using the photoresist as a mask to form a contact hole 84. The depth of this contact hole 84 is set such that the bottom portion of the contact hole 84 reaches the first wiring layer 77a of the semiconductor device A, e.g., about 3 μm from the surface of the silicon substrate 81.

A silicon oxide film 85 is formed on the inner surface of the contact hole 84 by thermal oxidation. A conductive film 86, e.g., an aluminum film, is formed on the entire surface of the silicon substrate 81. This conductive film 86 is completely buried in the contact hole 84. The conductive film 86 is etched back to be left in only the contact hole 84.

With this process, the first wiring layer 77a of the semiconductor device A is electrically connected to the conductive film in the contact hole 84 of the semiconductor device B.

In the thirteenth embodiment, a polysilicon doped with a p- or n-type impurity, a silicide film, typically a tungsten silicide film, a polycide film formed by stacking polysilicon and silicide layers on each other, a metal film, or the like may be used for the wiring layers 77a and 77b and the conductive film 86.

According to the above manufacturing method, a multi-layered wiring pattern can be formed in a silicon substrate. Therefore, the degree of freedom increases in terms of patterns, contributing to an increase in the integration density of elements.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

implanting impurities in a semiconductor substrate to form an impurity-implanted layer in said semiconductor substrate;

forming a field insulating film on said semiconductor substrate to surround first and second element regions and simultaneously converting said impurity-implanted layer into a first insulating layer;

forming a first contact hole between the first and second element regions, the first contact hole extending from a surface of said semiconductor substrate and reaching said first insulating layer;

selectively etching said first insulating layer to form a tunnel in said semiconductor substrate;

forming a second insulating layer on inner surfaces of said tunnel and said first contact hole; and burying a first conductive film in said tunnel and said first contact hole.

2. A method according to claim 1, further comprising the step of forming semiconductor elements in the first and second element regions, respectively.

3. A method according to claim 1, wherein two opposing sides of said first contact hole overlap said field insulating film when viewed from above said semiconductor substrate.

4. A method according to claim 1, further comprising the step of forming a well in the first element region at a position above a bottom surface of said tunnel.

5. A method according to claim 1, further comprising the step of forming a first MOS transistor in the first element region, forming a second MOS transistor in the second element region, selectively forming a second conductive film on drains of said first and second MOS transistors and said first conductive film, and electrically connecting the drains of said first and second MOS transistors to said first conductive film.

6. A method according to claim 1, further comprising the step of forming a first MOS transistor in the first element region, forming a second MOS transistor in the second element region, forming a second hole in said second insulating layer on a side wall of said first contact hole, the second hole reaching said first and second MOS transistors, selectively forming a second conductive film on said first conductive film, and electrically connecting drains of said first and second MOS transistors to said first conductive film.

* * * * *

UNITED STATES PATENT AND TRADEMARK OFFICE
CERTIFICATE OF CORRECTION

PATENT NO. : 5,963,838
DATED : October 5, 1999
INVENTOR(S) : Tadashi YAMAMOTO, et al.

It is certified that error appears in the above-identified patent and that said Letters Patent is hereby corrected as shown below:

On the front cover at [56] References Cited:

Add --FOREIGN PATENT DOCUMENTS--

In Foreign Patent Documents:

Insert --61-137778A  6/1986  Japan--.

Signed and Sealed this

Eighth Day of August, 2000

Attest:

Q. TODD DICKINSON

*Attesting Officer*   *Director of Patents and Trademarks*